US010361643B2

(12) United States Patent
Okada et al.

(10) Patent No.: US 10,361,643 B2
(45) Date of Patent: Jul. 23, 2019

(54) POWER GENERATING ELEMENT

(71) Applicant: WACOH CORPORATION, Saitama (JP)

(72) Inventors: Kazuhiro Okada, Saitama (JP); Miho Okada, Saitama (JP)

(73) Assignee: WACOH CORPORATION, Saitama (JP)

( * ) Notice: Subject to any disclaimer, the term of this patent is extended or adjusted under 35 U.S.C. 154(b) by 257 days.

(21) Appl. No.: 15/501,307

(22) PCT Filed: Sep. 6, 2016

(86) PCT No.: PCT/JP2016/076728
§ 371 (c)(1),
(2) Date: Feb. 2, 2017

(87) PCT Pub. No.: WO2018/047320
PCT Pub. Date: Mar. 15, 2018

(65) Prior Publication Data
US 2018/0351481 A1 Dec. 6, 2018

(51) Int. Cl.
H01L 41/113 (2006.01)
H02N 2/18 (2006.01)
(Continued)

(52) U.S. Cl.
CPC ........... H02N 2/186 (2013.01); H01L 41/047 (2013.01); H01L 41/053 (2013.01);
(Continued)

(58) Field of Classification Search
CPC ........ H02N 2/186; H02N 2/18; H01L 41/047; H01L 41/053; H01L 41/081; H01L 41/332
(Continued)

(56) References Cited

U.S. PATENT DOCUMENTS 7,948,153 B1 * 5/2011 Kellogg ............... H01L 41/1136
310/329
2006/0217776 A1 * 9/2006 White ................... A61N 1/3785
607/35
(Continued)

FOREIGN PATENT DOCUMENTS

JP 10-243667 A 9/1998
JP 2011-152010 A 8/2011
(Continued)

OTHER PUBLICATIONS

International Search Report (ISR) dated Oct. 25, 2016 for Application No. PCT/JP2016/076728.
(Continued)

Primary Examiner — Thomas M Dougherty
(74) Attorney, Agent, or Firm — Ladas & Parry LLP

(57) ABSTRACT

A base end of a flexible plate-like structure body (111) having a first attribute is fixed to a pedestal (310) and a leading end thereof is connected to a connector between different attributes (112). Base end of a flexible plate-like structure body (113, 114) having a second attribute is connected to the connector between different attributes (112) and leading end thereof is given as free ends. Weight body (211, 212, 213) is connected to the lower surface of the connector between different attributes (112) and the leading-end lower surface of the plate-like structure body (113, 114) having the second attribute. When vibration energy is applied to the pedestal (310), the weight body (211, 212, 213) undergoes vibration, resulting in deformation of each of the plate-like structure bodies (111, 113, 114). The deformation energy is taken out by a charge generating element (400) such as a piezoelectric element to generate electric power. The plate-like structure body (111) having the first attribute extends in a positive direction of an Y axis, and the plate-like structure body (113, 114) having the second attribute extend in a negative direction of the Y axis. Therefore, (Continued)

a plurality of resonance systems different in resonance frequency exists concurrently along the same axis, thereby widening a frequency band capable of generating electric power.

16 Claims, 29 Drawing Sheets

(51) Int. Cl.
    *H01L 41/047*  (2006.01)
    *H01L 41/053*  (2006.01)
    *H01L 41/08*   (2006.01)
    *H01L 41/332*  (2013.01)

(52) U.S. Cl.
    CPC .......... *H01L 41/081* (2013.01); *H01L 41/332* (2013.01); *H02N 2/18* (2013.01)

(58) Field of Classification Search
    USPC ........................................................ 310/339
    See application file for complete search history.

(56) References Cited

U.S. PATENT DOCUMENTS

| | | | |
|---|---|---|---|
| 2009/0224633 A1* | 9/2009 | Clingman | H02N 2/186 310/331 |
| 2013/0154439 A1 | 6/2013 | Lee et al. | |
| 2015/0135869 A1 | 5/2015 | Jia et al. | |
| 2015/0145375 A1* | 5/2015 | Sakaguchi | H01L 41/1136 310/321 |
| 2018/0342667 A1* | 11/2018 | Kuisma | H01L 41/1136 |

FOREIGN PATENT DOCUMENTS

| | | |
|---|---|---|
| JP | 2015-19434 A | 1/2015 |
| JP | 2015-517791 A | 6/2015 |
| JP | 5954729 B2 | 6/2016 |
| JP | 5996078 B1 | 9/2016 |
| WO | 2012/105368 A1 | 8/2012 |
| WO | 2015/033621 A1 | 3/2015 |

OTHER PUBLICATIONS

English abstract of JP 2015-19434 A.
English abstract of JP 5954729 B2.
English translation of JP 5996078 B1.
English abstract of JP 10-243667 A.
English abstract of JP 2011-152010 A.
International Preliminary Report on Patentability (IPRP) dated Mar. 12, 2019 for Application No. PCT/JP2016/076728.

* cited by examiner

<PRIOR ART>

<PRIOR ART>

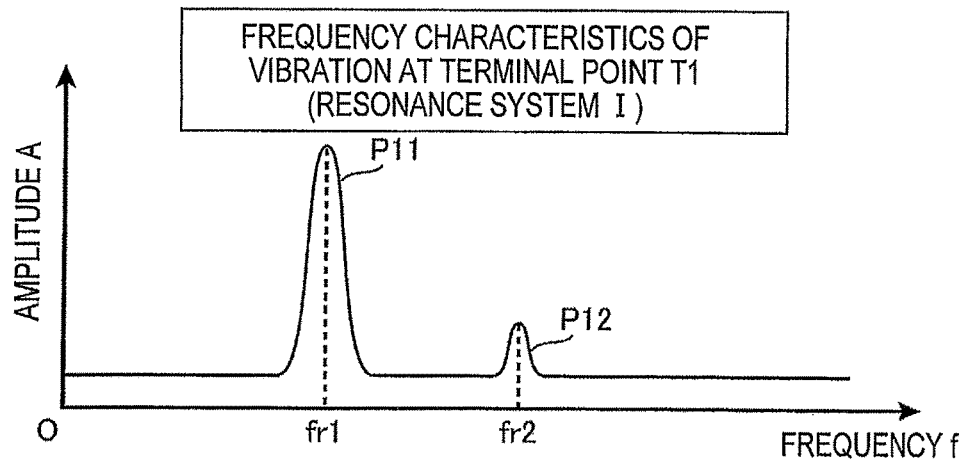
FIG.9
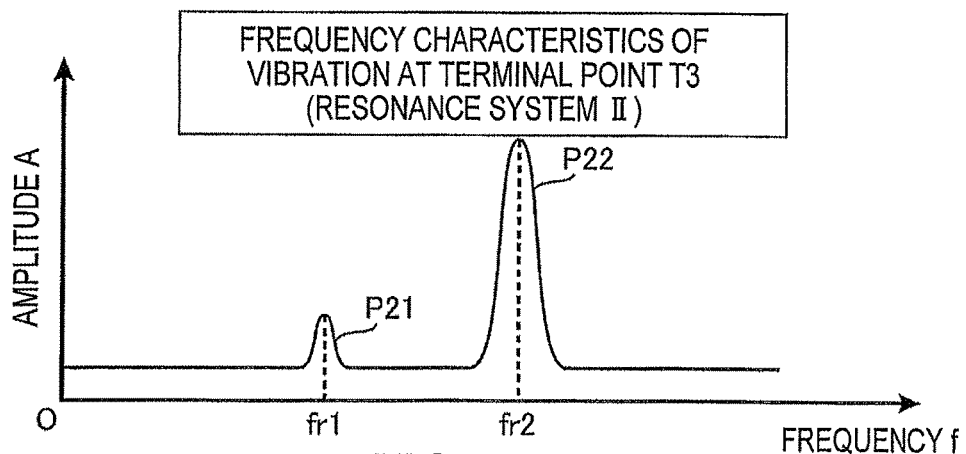
FIG.10A
FIG.10B

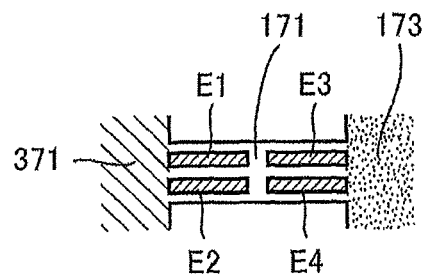
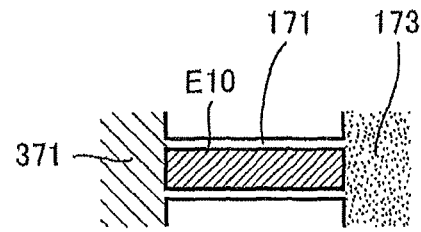
FIG.29A  FIG.29B
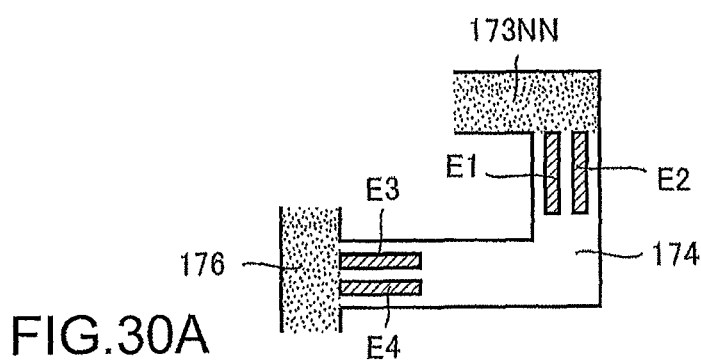
FIG.30A
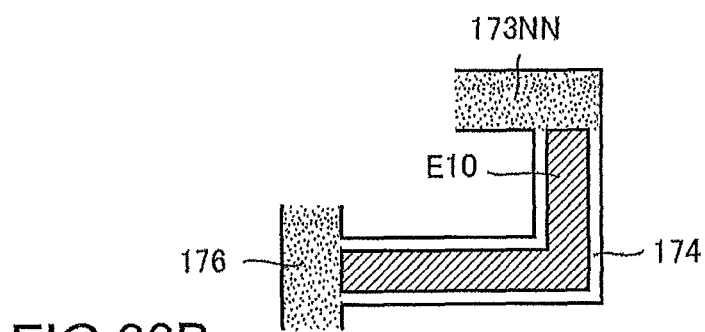
FIG.30B
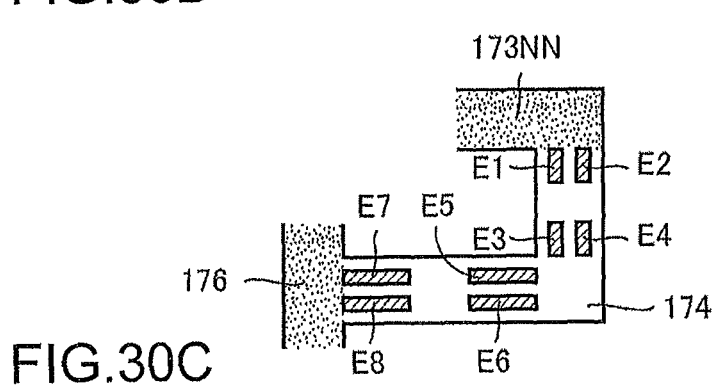
FIG.30C

US 10,361,643 B2

POWER GENERATING ELEMENT

RELATED APPLICATION

This application is an application under 35 U.S.C. 371 of International Application No. PCT/JP2016/076728 filed on Sep. 6, 2016, the entire contents of which are incorporated herein by reference.

FIELD

The present invention relates to a power generating element and in particular to technology for generating electric power by converting vibration energy into electric energy.

BACKGROUND

In order to attain the effective use of limited resources, there have been proposed technologies for taking out electric energy through conversion of various types of energy. One of them is technology for taking out electric energy through conversion of vibration energy. For example, JP H10-243667 discloses a piezoelectric-type power generating element in which a layered piezoelectric element is laminated to form a piezoelectric element for power generation, and an external force is used to cause the piezoelectric element for power generation to vibrate, thereby generating electric power. Further, JP 2011-152010 discloses a power generating element which has a MEMS (Micro Electro Mechanical System) structure using a silicon substrate.

On the other hand, US 2013/0154439 discloses a type of power generating element in which a hammer-head like structure body for supporting a weight body by a cantilever beam, one end of which is fixed, is used to cause the weight body which constitutes a head portion to vibrate, thereby generating electric power by the use of a piezoelectric element for power generation arranged at a handle portion. Further, WO 2015/033621 discloses a piezoelectric element which uses a structure body for supporting a weight body by a plate-like bridge portion which is bent in the L letter shape, together with a power generating element which uses the hammer-head like structure body.

A basic principle of these power generating elements is to impart periodic deflection to a piezoelectric element by vibration of a weight body, thereby taking out to the outside charge generated on the basis of stress applied to the piezoelectric element. These power generating elements are mounted on, for example, automobiles, trains and ships, by which vibration energy which is applied during transportation can be taken out as electric energy. Further, they are attached to vibration sources such as refrigerators and air conditioners, thus making it possible to generate electric power.

SUMMARY OF THE INVENTION

As described in the above examples, where a power generating element in which vibration energy applied from the outside causes a weight body to vibrate, thereby converting mechanical deformation resulting from vibration of the weight body into electric energy, for the purpose of enhancing power generation efficiency, it is important that the weight body is allowed to vibrate as efficiently as possible. However, in general, a mechanical resonance system has a unique resonance frequency which is determined according to a structure thereof, and when frequency of vibration energy applied from the outside is close to the resonance frequency concerned, a weight body is allowed to vibrate efficiently, whereas when the frequency deviates from the resonance frequency, the weight body is not allowed to vibrate sufficiently.

In the power generating element having a MEMS structure described in each of the aforementioned Patent Documents given above, a mechanical structure portion is ordinarily made of silicon or metal. A resonance system formed by using the above-described material is characterized by such a general tendency of frequency that resonance frequency is high in peak value (Q value) but narrow in half value width. This means that in a power generating element used in practical environments, electric power can be generated efficiently where the frequency of vibration applied from the outside is close to a unique resonance frequency of the power generating element but electric power cannot be generated at sufficient efficiency where the frequency deviates from the resonance frequency.

In designing a power generating element, frequency of vibration which is to be applied from the outside in actual use environments is ordinarily assumed and an attempt is made in an inventive manner so that resonance frequency is matched with the assumed frequency. However, in actual use environments, vibrations having various frequencies exist concurrently and vibrations with a single frequency are not always applied. Therefore, even when a power generating element is designed on the assumption of a specific vibration frequency, there is often found such a case that vibration having frequency which has not been assumed is applied in actual use environments. Further, resonance frequency of a structure portion which is made of silicon or metal is varied by external stress or temperature. Thus, electric power is not necessarily generated efficiently even if there is imparted vibration having the frequency assumed at the time of designing the power generating element.

Accordingly, the present invention is to provide a power generating element which is capable of generating electric power efficiently in various use environments by widening a frequency band capable of generating electric power.

According to a first aspect of the present invention, there is provided a power generating element which generates electric power by converting vibration energy into electric energy.

The power generating element, comprising:

a basic structure portion which is provided with a flexible plate-like structure body having a first attribute, a flexible plate-like structure body having a second attribute, a connector between different attributes which connects mutually the plate-like structure body having the first attribute with the plate-like structure body having the second attribute, and a pedestal which supports the plate-like structure body having the first attribute; and a charge generating element which generates charge on the basis of deformation of the basic structure portion; wherein when an XYZ three-dimensional coordinate system is defined, the plate-like structure body having the first attribute and the plate-like structure body having the second attribute are arranged so that a plate surface thereof is given as a surface parallel to an XY plane, the plate-like structure body having the first attribute is such that the base end thereof is directly or indirectly connected to the pedestal and the leading end thereof is directly or indirectly connected to the connector between different attributes, and the plate-like structure body extends in a direction parallel to an Y axis so that a direction from the base end to the leading end is given in a positive direction of the Y axis, and the plate-like structure body having the second attribute are such that the base end thereof is directly or indirectly connected to the connector between different attributes, and the plate-like structure body extends in a direction parallel to the Y axis so that a direction from the base end to the leading end is given in the negative direction of the Y axis.

According to a second aspect of the present invention, in the power generating element due to the aforementioned first aspect, the basic structure portion is further provided with a flexible plate-like structure body having a third attribute and a second connector between different attributes which connects mutually the plate-like structure body having the third attribute with the plate-like structure body having the second attribute, the leading end of the plate-like structure body having the second attribute is directly or indirectly connected to the second connector between different attributes, and the plate-like structure body having the third attribute is arranged so that the plate surface thereof is given as a surface parallel to the XY plane, the base end thereof is directly or indirectly connected to the second connector between different attributes, and the plate-like structure body extends in a direction parallel to the Y axis so that a direction from the base end to the leading end is given in the positive direction of the Y axis.

According to a third aspect of the present invention, in the power generating element due to the aforementioned first aspect, the basic structure portion is further provided with flexible plate-like structure bodies having a third attribute to an $n^{th}$ attribute (however, n is any given natural number which meets n≥4) and an $(i-1)^{th}$ connector between different attributes which connects a plate-like structure body having an $i^{th}$ attribute with a plate-like structure body having an $(i-1)^{th}$ attribute (however, i is an individual natural number which meets 3≤i≤n), the plate-like structure body having the $i^{th}$ attribute is arranged so that the plate surface thereof is given as a surface parallel to the XY plane, the base end thereof is directly or indirectly connected to the $(i-1)^{th}$ connector between different attributes and the leading end thereof is directly or indirectly connected to an $i^{th}$ connector between different attributes or given as a free end, and the plate-like structure body having the $i^{th}$ attribute extends in a direction parallel to the Y axis so that a direction from the base end to the leading end is given in the positive direction of the Y axis where i is an odd number and is given in the negative direction of the Y axis where i is an even number.

According to a fourth aspect of the present invention, in the power generating element due to the aforementioned first to third aspects, the power generating element is provided with the plurality of plate-like structure bodies (113, 114) having the same attribute which are arranged in parallel so as to be parallel to each other.

According to a fifth aspect of the present invention, in the power generating element due to the aforementioned first to fourth aspects, the power generating element is provided with the plurality of plate-like structure bodies (151, 153) having the same attribute which are arranged in series by way of a connector between the same attributes (152).

According to a sixth aspect of the present invention, in the power generating element due to the aforementioned first to fifth aspects, one of the connector between different attributes and a connector between the same attributes or both of them have an orthogonal portion extending in a direction orthogonal to a YZ plane, and the plate-like structure bodies extending in a direction parallel to the Y axis are such that the base end thereof or the leading end thereof is connected to a predetermined site on a side surface of the orthogonal portion.

According to a seventh aspect of the present invention, in the power generating element due to the aforementioned first to sixth aspects, an extreme end connector is connected to the leading end of the extreme end plate-like structure body.

According to a eighth aspect of the present invention, in the power generating element due to the aforementioned seventh aspect, there is installed an extreme end connector which connects mutually the leading ends of the plurality of plate-like structure bodies having the same attribute which are arranged in parallel so as to be parallel to each other.

According to a ninth aspect of the present invention, in the power generating element due to the aforementioned first to eighth aspects, where the basic structure portion is provided with a main substrate having a plate surface parallel to the XY plane, the plate-like structure bodies and the connector between different attributes, together with a connector between the same attributes where the basic structure portion is provided with this, and together with an extreme end connector where the basic structure portion is provided with this, are constituted with a part of the main substrate.

According to a tenth aspect of the present invention, in the power generating element due to the aforementioned first to ninth aspects, the basic structure portion is provided with a weight body which is connected to at least one of a predetermined site of the plate-like structure bodies, a predetermined site of the connector between different attributes, a predetermined site of a connector between the same attributes, and a predetermined site of the extreme end connector.

According to a eleventh aspect of the present invention, in the power generating element due to the aforementioned tenth aspect, the connector between different attributes, the connector between the same attributes and the extreme end connector are at least partially constituted with a U letter shaped plate-like member which is provided with an orthogonal portion extending in a direction orthogonal to the YZ plane as well as a positive side wing-like portion and a negative side wing-like portion extending from the orthogonal portion in a direction parallel to the Y axis and which is formed so as to give a U letter shaped projection image on the XY plane, when the XY plane is taken on a horizontal plane, at a space partitioned by the YZ plane, a space having a positive X coordinate value is defined as a positive-side space and a space having a negative coordinate value is defined as a negative-side space, the orthogonal portion is arranged at a position covering astride the positive-side space and the negative-side space, the positive side wing-like portion is arranged at the positive-side space, the negative side wing-like portion is arranged at the negative-side space, and a weight body is arranged so as to cover astride all below the orthogonal portion, below the positive side wing-like portion and below the negative side wing-like portion.

According to a twelfth aspect of the present invention, in the power generating element due to the aforementioned first to eleventh aspects, a first resonance system which causes vibration resulting from deformation of the plate-like structure body having the first attribute and a second resonance system which causes vibration resulting from deformation of the plate-like structure body having the second attribute are set in such a manner that the first resonance system is different in spring constant from the second resonance system.

According to a thirteenth aspect of the present invention, in the power generating element due to the aforementioned twelfth aspect, when force F is applied to the connector between different attributes in a predetermined application direction in a state that a pedestal is fixed, displacement of the connector between different attributes occurring in the application direction is given as d1 and a value k1 expressed by a formula of k1=F/d1 is defined as a spring constant of the first resonance system, and when force F is applied to a vibration end of the plate-like structure body having the second attribute in the application direction in a state that the connector between different attributes is fixed, displacement of the vibration end occurring in the application direction is given as d2 and a value k2 expressed by a formula of k2=F/d2 is defined as a spring constant of the second resonance system.

According to a fourteenth aspect of the present invention, in the power generating element due to the aforementioned twelfth or thirteenth aspect, of the plurality of plate-like structure bodies included in the basic structure portion, at least two sets of them are made different in one parameter or a plurality of parameters among four parameters of thickness, width, length and material, by which the first resonance system is set so as to be different in spring constant from the second resonance system.

According to a fifteenth aspect of the present invention, in the power generating element due to the aforementioned first aspect, the basic structure portion is provided with a central plate-like structure body having the first attribute, a positive side plate-like structure body and a negative side plate-like structure body each having the second attribute, the connector between different attributes which connects the central plate-like structure body with the positive side plate-like structure body and the negative side plate-like structure body, and a pedestal which supports the central plate-like structure body, when the XY plane is taken on a horizontal plane, at a space partitioned by the YZ plane, a space having a positive X coordinate value is defined as a positive-side space and a space having a negative X coordinate value is defined as a negative-side space, the central plate-like structure body is arranged on the YZ plane, the base end thereof is directly or indirectly connected to the pedestal, the leading end thereof is directly or indirectly connected to the connector between different attributes, and the central plate-like structure body extends in a direction parallel to the Y axis so that a direction from the base end to the leading end is given in the positive direction of the Y axis, the positive side plate-like structure body is arranged at the positive-side space, the base end thereof is directly or indirectly connected to the connector between different attributes, and the positive side plate-like structure body extends in a direction parallel to the Y axis so that a direction from the base end to the leading end is given in the negative direction of the Y axis, and the negative side plate-like structure body is arranged at the negative-side space, the base end thereof is directly or indirectly connected to the connector between different attributes, and the negative side plate-like structure body extends in a direction parallel to the Y axis so that a direction from the base end to the leading end is given in the negative direction of the Y axis.

According to a sixteenth aspect of the present invention, in the power generating element due to the aforementioned fifteenth aspect, the basic structure portion is further provided with at least one of a first weight body connected to the connector between different attributes, a second weight body connected to the leading end of the positive side plate-like structure body and a third weight body connected to the leading end of the negative side plate-like structure body.

According to a seventeenth aspect of the present invention, in the power generating element due to the aforementioned fifteenth aspect, the basic structure portion is further provided with a first weight body which is connected to the connector between different attributes and a second weight body which couples the leading-end lower surface of the positive side plate-like structure body with the leading-end lower surface of the negative side plate-like structure body, and the second weight body is provided with a U letter shaped structure so as to cover astride below the central plate-like structure body or below a supporting member for supporting the base end of the central plate-like structure body to the pedestal, with a predetermined distance kept in relation to the central plate-like structure body or the supporting member.

According to a eighteenth aspect of the present invention, in the power generating element due to the aforementioned first aspect, the basic structure portion is provided with a positive side plate-like structure body and a negative side plate-like structure body each having the first attribute, a central plate-like structure body having the second attribute, the connector between different attributes which connects the positive side plate-like structure body and the negative side plate-like structure body with the central plate-like structure body, and a pedestal which supports the positive side plate-like structure body and the negative side plate-like structure body, when the XY plane is taken on a horizontal plane, at a space partitioned by the YZ plane, a space having a positive X coordinate value is defined as a positive-side space and a space having a negative X coordinate value is defined as a negative-side space, the positive side plate-like structure body is arranged at the positive-side space, the base end thereof is directly or indirectly connected to the pedestal, the leading end thereof is directly or indirectly connected to the connector between different attributes, and the positive side plate-like structure body extends in a direction parallel to the Y axis so that a direction from the base end to the leading end is given in the positive direction of the Y axis, the negative side plate-like structure body is arranged at the negative-side space, the base end thereof is directly or indirectly connected to the pedestal, the leading end thereof is directly or indirectly connected to the connector between different attributes, and the negative side plate-like structure body extends in a direction parallel to the Y axis so that a direction from the base end to the leading end is given in the positive direction of the Y axis, and the central plate-like structure body is arranged on the YZ plane, the base end thereof is directly or indirectly connected to the connector between different attributes, and the central plate-like structure body extends in a direction parallel to the Y axis so that a direction from the base end to the leading end is given in the negative direction of the Y axis.

According to a nineteenth aspect of the present invention, in the power generating element due to the aforementioned eighteenth aspect, the basic structure portion is further provided with at least one of a first weight body connected to the connector between different attributes and a second weight body connected to the leading end of the central plate-like structure body.

According to a twentieth aspect of the present invention, in the power generating element due to the aforementioned first aspect, the basic structure portion is provided with a first positive side plate-like structure body and a first negative side plate-like structure body each having the first attribute, a second positive side plate-like structure body and a second negative side plate-like structure body each having the second attribute, the connector between different attributes which connects the first positive side plate-like structure body and the first negative side plate-like structure body with the second positive side plate-like structure body and the second negative side plate-like structure body, and a pedestal which supports the first positive side plate-like structure body and the second negative side plate-like structure body, when the XY plane is taken on a horizontal plane, at a space partitioned by the YZ plane, a space having a positive X coordinate value is defined as a positive-side space and a space having a negative X coordinate value is defined as a negative-side space, the first positive side plate-like structure body is arranged at the positive-side space, the base end thereof is directly or indirectly connected to the pedestal, the leading end thereof is directly or indirectly connected to the connector between different attributes, and the first positive side plate-like structure body extends in a direction parallel to the Y axis so that a direction from the base end to the leading end is given in the positive direction of the Y axis, the first negative side plate-like structure body is arranged at the negative-side space, the base end thereof is directly or indirectly connected to the pedestal, the leading end thereof is directly or indirectly connected to the connector between different attributes, and the first negative side plate-like structure body extends in a direction parallel to the Y axis so that a direction from the base end to the leading end is given in the positive direction of the Y axis, the second positive side plate-like structure body is arranged at the positive-side space, the base end thereof is directly or indirectly connected to the connector between different attributes, and the second positive side plate-like structure body extends in a direction parallel to the Y axis so that a direction from the base end to the leading end is given in the negative direction of the Y axis, and the second negative side plate-like structure body is arranged at the negative-side space, the base end thereof is directly or indirectly connected to the connector between different attributes, and the second negative side plate-like structure body extends in a direction parallel to the Y axis so that a direction from the base end to the leading end is given in the negative direction of the Y axis.

According to a twenty-first aspect of the present invention, in the power generating element due to the aforementioned twentieth aspect, the basic structure portion is further provided with at least one of a first weight body connected to the connector between different attributes, a second weight body connected to the leading end of the second positive side plate-like structure body and a third weight body connected to the leading end of the second negative side plate-like structure body.

According to a twenty-second aspect of the present invention, in the power generating element due to the aforementioned twentieth aspect, the basic structure portion is further provided with an extreme end connector which is connected to both the leading end of the second positive side plate-like structure body and the leading end of the second negative side plate-like structure body and also provided with at least one of a first weight body connected to the connector between different attributes and a second weight body connected to the extreme end connector.

According to a twenty-third aspect of the present invention, in the power generating element due to the aforementioned first aspect, the basic structure portion is provided with a first positive side plate-like structure body and a first negative side plate-like structure body each having the first attribute, a second positive side plate-like structure body and a second negative side plate-like structure body each having the second attribute, a central plate-like structure body having the third attribute, a first connector between different attributes which connects the first positive side plate-like structure body and the first negative side plate-like structure body with the second positive side plate-like structure body and the second negative side plate-like structure body, a second connector between different attributes which connects the second positive side plate-like structure body and the second negative side plate-like structure body with the central plate-like structure body, and a pedestal which supports the first positive side plate-like structure body and the first negative side plate-like structure body, when the XY plane is taken on a horizontal plane, at a space partitioned by the YZ plane, a space having a positive X coordinate value is defined as a positive-side space and a space having a negative X coordinate value is defined as a negative-side space, the first positive side plate-like structure body is arranged at the positive-side space, the base end thereof is directly or indirectly connected to the pedestal, the leading end thereof is directly or indirectly connected to the first connector between different attributes, and the first positive side plate-like structure body extends in a direction parallel to the Y axis so that a direction from the base end to the leading end is given in the positive direction of the Y axis, the first negative side plate-like structure body is arranged at the negative-side space, the base end thereof is directly or indirectly connected to the pedestal, the leading end thereof is directly or indirectly connected to the first connector between different attributes, and the first negative side plate-like structure body extends in a direction parallel to the Y axis so that a direction from the base end to the leading end is given in the positive direction of the Y axis, the second positive side plate-like structure body is arranged at the positive-side space, the base end thereof is directly or indirectly connected to the first connector between different attributes, the leading end thereof is directly or indirectly connected to the second connector between different attributes, and the second positive side plate-like structure body extends in a direction parallel to the Y axis so that a direction from the base end to the leading end is given in the negative direction of the Y axis, the second negative side plate-like structure body is arranged at the negative-side space, the base end thereof is directly or indirectly connected to the first connector between different attributes, the leading end thereof is directly or indirectly connected to the second connector between different attributes, and the second negative side plate-like structure body extends in a direction parallel to the Y axis so that a direction from the base end to the leading end is given in the negative direction of the Y axis, and the central plate-like structure body is arranged on the YZ plane, the base end thereof is directly or indirectly connected to the second connector between different attributes, and the central plate-like structure body extends in a direction parallel to the Y axis so that a direction from the base end to the leading end is given in the positive direction of the Y axis.

According to a twenty-fourth aspect of the present invention, in the power generating element due to the aforementioned twenty-third aspect, the basic structure portion is further provided with at least one of a first weight body connected to the first connector between different attributes, a second weight body connected to the second connector between different attributes and a third weight body connected to the leading end of the central plate-like structure body.

According to a twenty-fifth aspect of the present invention, in the power generating element due to the aforementioned first aspect, the basic structure portion is provided with a first central plate-like structure body, a positive side plate-like structure body and a negative side plate-like structure body each having the first attribute, a second central plate-like structure body having the second attribute, a connector between the same attributes which connects the first central plate-like structure body with the positive side plate-like structure body and the negative side plate-like structure body, the connector between different attributes which connects the positive side plate-like structure body and the negative side plate-like structure body with the second central plate-like structure body, and a pedestal which supports the first central plate-like structure body, when the XY plane is taken on a horizontal plane, at a space partitioned by the YZ plane, a space having a positive X coordinate value is defined as a positive-side space and a space having a negative X coordinate value is defined as a negative-side space, the first central plate-like structure body is arranged on the YZ plane, the base end thereof is directly or indirectly connected to the pedestal, the leading end thereof is directly or indirectly connected to the connector between the same attributes, and the first central plate-like structure body extends in a direction parallel to the Y axis so that a direction from the base end to the leading end is given in the positive direction of the Y axis, the positive side plate-like structure body is arranged at the positive-side space, the base end thereof is directly or indirectly connected to the connector between the same attributes, the leading end thereof is directly or indirectly connected to the connector between different attributes, and the positive side plate-like structure body extends in a direction parallel to the Y axis so that a direction from the base end to the leading end is given in the positive direction of the Y axis, the negative side plate-like structure body is arranged at the negative-side space, the base end thereof is directly or indirectly connected to the connector between the same attributes, the leading end thereof is directly or indirectly connected to the connector between different attributes, and the negative side plate-like structure body extends in a direction parallel to the Y axis so that a direction from the base end to the leading end is given in the positive direction of the Y axis, and the second central plate-like structure body is arranged on the YZ plane, the base end thereof is directly or indirectly connected to the connector between different attributes, and the second central plate-like structure body extends in a direction parallel to the Y axis so that a direction from the base end to the leading end is given in the negative direction of the Y axis.

According to a twenty-sixth aspect of the present invention, in the power generating element due to the aforementioned twenty-fifth aspect, the basic structure portion is further provided with at least one of a first weight body connected to the connector between the same attributes, a second weight body connected to the connector between different attributes and a third weight body connected to the leading end of the second central plate-like structure body.

According to a twenty-seventh aspect of the present invention, in the power generating element due to the aforementioned twenty-sixth aspect, the power generating element is provided with all of the first weight body, the second weight body and the third weight body and the power generating element is further provided with an extreme end connector connected to the leading end of the second central plate-like structure body, wherein the connector between the same attributes is constituted with a plate-like member which is provided with an orthogonal portion extending in a direction orthogonal to the YZ plane as well as a positive side wing-like portion and a negative side wing-like portion extending from the orthogonal portion in the negative direction of the Y axis and which is formed so as to give a U letter shaped projection image on the XY plane, the extreme end connector is constituted with a plate-like member which is provided with an orthogonal portion extending in a direction orthogonal to the YZ plane as well as a positive side wing-like portion and a negative side wing-like portion extending from the orthogonal portion in the positive direction of the Y axis and which is formed so as to give a U letter shaped projection image on the XY plane, the first weight body is constituted with a structure body which is connected to the lower surfaces of all the orthogonal portion, the positive side wing-like portion and the negative side wing-like portion of the connector between the same attributes and which is formed so as to give a U letter shaped projection image on the XY plane, and the third weight body is constituted with a structure body which is connected to the lower surfaces of all the orthogonal portion, the positive side wing-like portion and the negative side wing-like portion of the extreme end connector and which is formed so as to give a U letter shaped projection image on the XY plane.

According to a twenty-eighth aspect of the present invention, there is provided a power generating element which generates electric power by converting vibration energy into electric energy.

The power generating element, comprising:

a basic structure portion which is provided with a flexible plate-like structure body having a first attribute, a flexible plate-like structure body having a second attribute, a connector between different attributes which connects mutually the plate-like structure body having the first attribute with the plate-like structure body having the second attribute, and a pedestal which supports the plate-like structure body having the first attribute; and a charge generating element which generates charge on the basis of deformation of the basic structure portion; wherein when an XYZ three-dimensional coordinate system is defined, the plate-like structure body having the first attribute and the plate-like structure body having the second attribute are each arranged so that the plate surface thereof is given as a surface parallel to the XY plane, the plate-like structure body having the first attribute is such that the base end thereof is directly or indirectly connected to the pedestal and the leading end thereof is directly or indirectly connected to the connector between different attributes, and the plate-like structure body includes at least at a part thereof a Y axis channel portion having the first attribute which extends in a direction parallel to the Y axis so that a direction from the base end to the leading end is given in a positive direction of the Y axis, and the plate-like structure body having the second attribute is such that the base end thereof is directly or indirectly connected to the connector between different attributes, and the plate-like structure body includes at least at a part thereof a Y axis channel portion having the second attribute which extends in a direction parallel to the Y axis so that a direction from the base end to the leading end is given in a negative direction of the Y axis.

According to a twenty-ninth aspect of the present invention, in the power generating element due to the aforementioned twenty-eighth aspect, which is provided with the plurality of plate-like structure bodies having the same attribute which are arranged in parallel to each other.

According to a thirtieth aspect of the present invention, in the power generating element due to the aforementioned twenty-eighth or twenty-ninth aspect, an extreme end connector is connected to the leading ends of the extreme end plate-like structure body.

According to a thirty-first aspect of the present invention, in the power generating element due to the aforementioned thirtieth aspect, there is installed the extreme end connector which connects mutually the leading ends of the plurality of plate-like structure bodies having the same attribute which are arranged in parallel to each other.

According to a thirty-second aspect of the present invention, in the power generating element due to the aforementioned twenty-eighth to thirty-first aspects, where the basic structure portion is provided with a main substrate having a plate surface parallel to the XY plane, the plate-like structure bodies and the connector between different attributes, together with an extreme end connector where the basic structure portion is provided with this, are constituted with a part of the main substrate.

According to a thirty-third aspect of the present invention, in the power generating element due to the aforementioned twenty-eighth to thirty-second aspects, the basic structure portion is provided with a weight body which is connected to at least one of a predetermined site of the plate-like structure bodies, a predetermined site of the connector between different attributes and a predetermined site of the extreme end connector.

According to a thirty-fourth aspect of the present invention, in the power generating element due to the aforementioned twenty-eighth aspect, one of the plate-like structure body having the first attribute and the plate-like structure body having the second attribute or both of them include an X axis channel portion extending in a direction parallel to the X axis and a Y axis channel portion extending in a direction parallel to the Y axis and are each provided with an L letter shaped portion which is formed so as to give an L letter shaped projection image on the XY plane.

According to a thirty-fifth aspect of the present invention, in the power generating element due to the aforementioned thirty-fourth aspect, the basic structure portion is provided with a first positive side plate-like structure body and a first negative side plate-like structure body each having the first attribute, a second positive side plate-like structure body and a second negative side plate-like structure body each having the second attribute, the connector between different attributes which connects the first positive side plate-like structure body and the first negative side plate-like structure body with the second positive side plate-like structure body and the second negative side plate-like structure body, a pedestal which supports the first positive side plate-like structure body and the first negative side plate-like structure body, and an extreme end connector which connects mutually the leading ends of the second positive side plate-like structure body and the second negative side plate-like structure body, when the XY plane is taken on a horizontal plane, at a space partitioned by the YZ plane, a space having a positive X coordinate value is defined as a positive-side space and a space having a negative X coordinate value is defined as a negative-side space, the first positive side plate-like structure body is arranged at the positive-side space, the base end thereof is directly or indirectly connected to the pedestal, the leading end thereof is directly or indirectly connected to the connector between different attributes, and the first positive side plate-like structure body extends in a direction parallel to the Y axis so that a direction from the base end to the leading end is given in the positive direction of the Y axis, the first negative side plate-like structure body is arranged at the negative-side space, the base end thereof is directly or indirectly connected to the pedestal, the leading end thereof is directly or indirectly connected to the connector between different attributes, and the first negative side plate-like structure body extends in a direction parallel to the Y axis so that a direction from the base end to the leading end is given in the positive direction of the Y axis, the second positive side plate-like structure body is arranged at the positive-side space and provided with a positive side X axis channel portion extending in a direction parallel to the X axis and a positive side Y axis channel portion extending in a direction parallel to the Y axis, the base end of the positive side X axis channel portion is directly or indirectly connected to the connector between different attributes, the leading end of the positive side X axis channel portion is connected to the base end of the positive side Y axis channel portion, the leading end of the positive side Y axis channel portion is directly or indirectly connected to the extreme end connector, and the second positive side plate-like structure body is formed so as to give an L letter shaped projection image on the XY plane, and the second negative side plate-like structure body is arranged at the negative-side space and provided with a negative side X axis channel portion extending in a direction parallel to the X axis and a negative side Y axis channel portion extending in a direction parallel to the Y axis, the base end of the negative side X axis channel portion is directly or indirectly connected to the connector between different attributes, the leading end of the negative side X axis channel portion is connected to the base end of the negative side Y axis channel portion, the leading end of the negative side Y axis channel portion is directly or indirectly connected to the extreme end connector, and the second negative side plate-like structure body is formed so as to give an L letter shaped projection image on the XY plane.

According to a thirty-sixth aspect of the present invention, in the power generating element due to the aforementioned thirty-fourth aspect, the basic structure portion is provided with a first positive side plate-like structure body and a first negative side plate-like structure body each having the first attribute, a second positive side plate-like structure body and a second negative side plate-like structure body each having the second attribute, the connector between different attributes which connects the first positive side plate-like structure body and the first negative side plate-like structure body with the second positive side plate-like structure body and the second negative side plate-like structure body, a pedestal which supports the first positive side plate-like structure body and the first negative side plate-like structure body, and an extreme end connector which connects mutually the leading ends of the second positive side plate-like structure body and the second negative side plate-like structure body, when the XY plane is taken on a horizontal plane, at a space partitioned by the YZ plane, a space having a positive X coordinate value is defined as a positive-side space and a space having a negative X coordinate value is defined as a negative-side space, the first positive side plate-like structure body is arranged at the positive-side space and provided with a first positive side Y axis channel portion extending in a direction parallel to the Y axis and a first positive side X axis channel portion extending in a direction parallel to the X axis, the base end of the first positive side Y axis channel portion is directly or indirectly connected to the pedestal, the leading end of the first positive side Y axis channel portion is connected to the base end of the first positive side X axis channel portion, the leading end of the first positive side X axis channel portion is directly or indirectly connected to the connector between different attributes, and the first positive side plate-like structure body is formed so as to give an L letter shaped projection image on the XY plane, the first negative side plate-like structure body is arranged at the negative-side space and provided with a first negative side Y axis channel portion extending in a direction parallel to the Y axis and a first negative side X axis channel portion extending in a direction parallel to the X axis, the base end of the first negative side Y axis channel portion is directly or indirectly connected to the pedestal, the leading end of the first negative side Y axis channel portion is connected to the base end of the first positive side X axis channel portion, the leading end of the first negative side X axis channel portion is directly or indirectly connected to the connector between different attributes, and the first negative side plate-like structure body is formed so as to give an L letter shaped projection image on the XY plane, the second positive side plate-like structure body is arranged at the positive-side space and provided with a second positive side X axis channel portion extending in a direction parallel to the X axis and a second positive side Y axis channel portion extending in a direction parallel to the Y axis, the base end of the second positive side X axis channel portion is directly or indirectly connected to the connector between different attributes, the leading end of the second positive side X axis channel portion is connected to the base end of the second positive side Y axis channel portion, the leading end of the second positive side Y axis channel portion is directly or indirectly connected to the extreme end connector, and the second positive side plate-like structure body is formed so as to give an L letter shaped projection image on the XY plane, and the second negative side plate-like structure body is arranged at the negative-side space and provided with a second negative side X axis channel portion extending in a direction parallel to the X axis and a second negative side Y axis channel portion extending in a direction parallel to the Y axis, the base end of the second negative side X axis channel portion is directly or indirectly connected to the connector between different attributes, the leading end of the second negative side X axis channel portion is connected to the base end of the second negative side Y axis channel portion, the leading end of the second negative side Y axis channel portion is directly or indirectly connected to the extreme end connector, and the second negative side plate-like structure body is formed so as to give an L letter shaped projection image on the XY plane.

According to a thirty-seventh aspect of the present invention, in the power generating element due to the aforementioned twenty-eighth aspect, one of the plate-like structure body having the first attribute and the plate-like structure body having the second attribute or both of them include an X axis channel portion extending in a direction parallel to the X axis, a Y axis channel portion extending in a direction parallel to the Y axis, and a curved connection portion which connects the X axis channel portion with the Y axis channel portion by a curved channel and are each provided with a J letter shaped portion which is formed so as to give a J letter shaped projection image on the XY plane.

According to a thirty-eighth aspect of the present invention, in the power generating element due to the aforementioned thirty-seventh aspect, the basic structure portion is provided with a first positive side plate-like structure body and a first negative side plate-like structure body each having the first attribute, a second positive side plate-like structure body and a second negative side plate-like structure body each having the second attribute, the connector between different attributes which connects the first positive side plate-like structure body and the first negative side plate-like structure body with the second positive side plate-like structure body and the second negative side plate-like structure body, a pedestal which supports the first positive side plate-like structure body and the first negative side plate-like structure body, and an extreme end connector which connects mutually the leading ends of the second positive side plate-like structure body and the second negative side plate-like structure body, when the XY plane is taken on a horizontal plane, at a space partitioned by the YZ plane, a space having a positive X coordinate value is defined as a positive-side space and a space having a negative X coordinate value is defined as a negative-side space, the first positive side plate-like structure body is arranged at the positive-side space, the base end thereof is directly or indirectly connected to the pedestal, the leading end thereof is directly or indirectly connected to the connector between different attributes, and the first positive side plate-like structure body extends in a direction parallel to the Y axis so that a direction from the base end to the leading end is given in the positive direction of the Y axis, the first negative side plate-like structure body is arranged at the negative-side space, the base end thereof is directly or indirectly connected to the pedestal, the leading end thereof is directly or indirectly connected to the connector between different attributes, and the first negative side plate-like structure body extends in a direction parallel to the Y axis so that a direction from the base end to the leading end is given in the positive direction of the Y axis, the second positive side plate-like structure body is arranged at the positive-side space and includes a positive side X axis channel portion extending in a direction parallel to the X axis, a positive side Y axis channel portion extending in a direction parallel to the Y axis and a positive side curved connection portion which connects the positive side X axis channel portion with the positive side Y axis channel portion by a curved channel, the base end of the positive side X axis channel portion is directly or indirectly connected to the connector between different attributes, the leading end of the positive side X axis channel portion is connected to the base end of the positive side Y axis channel portion by the positive side curved connection portion, the leading end of the positive side Y axis channel portion is directly or indirectly connected to the extreme end connector, and the second positive side plate-like structure body is formed so as to give a J letter shaped projection image on the XY plane, and the second negative side plate-like structure body is arranged at the negative-side space and includes a negative side X axis channel portion extending in a direction parallel to the X axis, a negative side Y axis channel portion extending in a direction parallel to the Y axis and a negative side curved connection portion which connects the negative side X axis channel portion with the negative side Y axis channel portion by a curved channel, the base end of the negative side X axis channel portion is directly or indirectly connected to the connector between different attributes, the leading end of the negative side X axis channel portion is connected to the base end of the negative side Y axis channel portion by the negative side curved connection portion, the leading end of the negative side Y axis channel portion is directly or indirectly connected to the extreme end connector, and the second negative side plate-like structure body is formed so as to give a J letter shaped projection image on the XY plane.

According to a thirty-ninth aspect of the present invention, in the power generating element due to the aforementioned twenty-eighth aspect, the plate-like structure body having the second attribute includes a base-end-side channel portion extending in a direction parallel to the Y axis, a relaying channel portion extending in a direction parallel to the X axis and a leading-end-side channel portion extending in a direction parallel to the Y axis and are each provided with a U letter shaped portion which is formed so as to give a U letter shaped projection image on the XY plane by coupling from the base end to the leading end sequentially the base-end-side channel portion, the relaying channel portion and the leading-end-side channel portion.

According to a fortieth aspect of the present invention, in the power generating element due to the aforementioned thirty-ninth aspect, the basic structure portion is provided with a first positive side plate-like structure body and a first negative side plate-like structure body each having the first attribute, a second positive side plate-like structure body and a second negative side plate-like structure body each having the second attribute, the connector between different attributes which connects the first positive side plate-like structure body and the first negative side plate-like structure body with the second positive side plate-like structure body and the second negative side plate-like structure body, a pedestal which supports the first positive side plate-like structure body and the first negative side plate-like structure body, and an extreme end connector which connects mutually the leading ends of the second positive side plate-like structure body and the second negative side plate-like structure body, when the XY plane is taken on a horizontal plane, at a space partitioned by the YZ plane, a space having a positive X coordinate value is defined as a positive-side space and a space having a negative X coordinate value is defined as a negative-side space, the first positive side plate-like structure body is arranged at the positive-side space, the base end thereof is directly or indirectly connected to the pedestal, the leading end thereof is directly or indirectly connected to the connector between different attributes, and the first positive side plate-like structure body extends in a direction parallel to the Y axis so that a direction from the base end to the leading end is given in the positive direction of the Y axis, the first negative side plate-like structure body is arranged at the negative-side space, the base end thereof is directly or indirectly connected to the pedestal, the leading end thereof is directly or indirectly connected to the connector between different attributes, and the first negative side plate-like structure body extends in a direction parallel to the Y axis so that a direction from the base end to the leading end is given in the positive direction of the Y axis, the second positive side plate-like structure body is arranged at the positive-side space and includes a positive side base-end-side channel portion extending in a direction parallel to the Y axis, a positive side relaying channel portion extending in a direction parallel to the X axis and a positive side leading-end-side channel portion extending in a direction parallel to the Y axis, the base end of the positive side base-end-side channel portion is directly or indirectly connected to the connector between different attributes, the leading end of the positive side base-end-side channel portion is connected to the base end of the positive side relaying channel portion, the leading end of the positive side relaying channel portion is connected to the base end of the positive side leading-end-side channel portion, the leading end of the positive side leading-end-side channel portion is directly or indirectly connected to the extreme end connector, and the second positive side plate-like structure body is formed so as to give a U letter shaped projection image on the XY plane, and the second negative side plate-like structure body is arranged at the negative-side space and includes a negative side base-end-side channel portion extending in a direction parallel to the Y axis, a negative side relaying channel portion extending in a direction parallel to the X axis and a negative side leading-end-side channel portion extending in a direction parallel to the Y axis, the base end of the negative side base-end-side channel portion is directly or indirectly connected to the connector between different attributes, the leading end of the negative side base-end-side channel portion is connected to the base end of the negative side relaying channel portion, the leading end of the negative side relaying channel portion is connected to the base end of the negative side leading-end-side channel portion, the leading end of the negative side leading-end-side channel portion is directly or indirectly connected to the extreme end connector, and the second negative side plate-like structure body is formed so as to give a U letter shaped projection image on the XY plane.

According to a forty-first aspect of the present invention, in the power generating element due to the aforementioned thirty-fifth, thirty-sixth, thirty-eighth and fortieth aspects, the basic structure portion is further provided with at least one of a first weight body connected to the connectors between different attributes and a second weight body connected to the extreme end connectors.

According to a forty-second aspect of the present invention, in the power generating element due to the aforementioned first to forty-first aspects, the basic structure portion is constituted with a structure body which gives plane symmetry in relation to the YZ plane.

According to a forty-third aspect of the present invention, there is provided a basic structure portion which serves as a constituent of the power generating element due to the aforementioned first to forty-second aspects.

According to a forty-fourth aspect of the present invention, in the power generating element due to the aforementioned tenth to fourteenth, sixteenth, seventeenth, nineteenth, twenty-first, twenty-second, twenty-fourth, twenty-sixth, twenty-seventh and thirty-ninth aspects, the basic structure portion is provided with a weight body connected to a vibration end of the plate-like structure body having the first attribute and a weight body connected to a vibration end of the plate-like structure body having the second attribute, and resonance frequency of each of the weight bodies is set adjacent to each other so that spectrum peak waveforms of the two weight bodies in the vicinities of the resonance frequencies are partially overlapped with each other.

According to a forty-fifth aspect of the present invention, in the power generating element due to the aforementioned tenth to fourteenth, sixteenth, seventeenth, nineteenth, twenty-first, twenty-second, twenty-fourth, twenty-sixth, twenty-seventh and thirty-ninth aspects, the basic structure portion is constituted by using an SOI substrate having a three-layered structure which is laminated in the order of a silicon active layer, a silicon oxide layer and a silicon base layer, the plate-like structure body and the connector between different attributes, together with a connector between the same attributes where the basic structure portion is provided with this, and together with an extreme end connector where the basic structure portion is provided with this, is constituted with a single-layered structure body of the silicon active layer or a two-layered structure body composed of the silicon active layer and the silicon oxide layer, the weight body is constituted with a two-layered structure body composed of the silicon oxide layer and the silicon base layer or a single-layered structure body of the silicon base layer, and the pedestal is constituted with a three-layered structure body composed of the silicon active layer, the silicon oxide layer and the silicon base layer.

According to a forty-sixth aspect of the present invention, in the power generating element due to the aforementioned tenth to fourteenth, sixteenth, seventeenth, nineteenth, twenty-first, twenty-second, twenty-fourth, twenty-sixth, twenty-seventh and thirty-ninth aspects, a device case for housing the basic structure portion is further provided, a pedestal is fixed to the device case or incorporated as a part of the device case, a predetermined space is secured between an inner surface of the device case and outer surfaces of the plate-like structure bodies and that of the weight body, where the magnitude of external vibration applied to the device case is equal to or less than a predetermined reference level, in response to the external vibration, the plate-like structure bodies and the weight body undergoes vibration inside the space, and where the magnitude of the external vibration is in excess of the predetermined reference level, in response to the external vibration, the plate-like structure bodies and the weight body comes into contact with the inner surface of the device case, thereby restricting further displacement.

According to a forty-seventh aspect of the present invention, in the power generating element due to the aforementioned first to forty-sixth aspects, the charge generating element is provided with a piezoelectric element which is formed at a part where the plate-like structure body undergoes deformation.

According to a forty-eighth aspect of the present invention, in the power generating element due to the aforementioned forty-seventh aspect, the piezoelectric element is provided with a lower electrode layer formed on the upper surface of the plate-like structure body, a piezoelectric material layer which is formed on the upper surface of the lower electrode layer to generate charge on the basis of stress and an upper electrode layer which is formed on the upper surface of the piezoelectric material layer, thereby supplying charge of predetermined polarity to each of the lower electrode layer and the upper electrode layer.

According to a forty-ninth aspect of the present invention, in the power generating element due to the aforementioned forty-eighth aspect, a common lower electrode layer is formed on the upper surface of the plate-like structure body, a common piezoelectric material layer is formed on the upper surface of the common lower electrode layer, a plurality of discrete upper electrode layers, each of which is electrically independent, are formed at different sites on the upper surface of the common piezoelectric material layer, and at a time point when the plate-like structure body undergoes specific deformation, charge of the same polarity is supplied from the piezoelectric material layer to each of the discrete upper electrode layers.

According to a fiftieth aspect of the present invention, in the power generating element due to the aforementioned forty-ninth aspect, when the center axis extending in a direction parallel to the Y axis is defined at the center of an upper surface of the plate-like structure body, the discrete upper electrode layers are respectively arranged on both sides of the center axis on the base end side and on both sides of the center axis on the leading end side.

According to a fifty-first aspect of the present invention, in the power generating element due to the aforementioned forty-ninth or fiftieth aspect, The power generating element is further provided with a power generating circuit that rectifies electric current produced between the common lower electrode layer and each of the discrete upper electrode layers on the basis of charge generated at a piezoelectric element, thereby taking out electric power.

According to a fifty-second aspect of the present invention, in the power generating element due to the aforementioned fifty-first aspect, the power generating circuit is provided with a capacitative element, rectifying elements for positive charge in which a direction from each of discrete upper electrode layers to the positive electrode side of the capacitative element in order to guide positive charge generated at each of the discrete upper electrode layers to the positive electrode side of the capacitative element is given as a forward direction, and rectifying elements for negative charge in which a direction from the negative electrode side of the capacitative element to each of the discrete upper electrode layers in order to guide negative charge generated at each of the discrete upper electrode layers to the negative electrode side of the capacitative element is given as a forward direction, thereby smoothing electric energy converted from vibration energy by the capacitative element and supplying the electric energy.

According to a fifty-third aspect of the present invention, there is provided a power generating element which generates electric power by converting vibration energy into electric energy.

The power generating element comprising:

a basic structure portion which is provided with a plurality of plate-like structure bodies having flexibility, one or a plurality of intermediate connectors which connect mutually the plate-like structure bodies, and a pedestal which supports the plate-like structure bodies; and a charge generating element which generates charge on the basis of deformation of the basic structure portion; wherein each of the plate-like structure bodies is directly connected to the pedestal or indirectly connected thereto by way of an intermediate connector and other plate-like structure bodies, and a dendriform structure which has the pedestal as a root is formed by an aggregate of the plate-like structure bodies and the intermediate connectors, and when a channel is followed from the pedestal to the end of the dendriform structure, the channel includes a branching portion which branches into a plurality of channels at midpoints or a converging portion at which a plurality of channels converge at midpoints.

According to a fifty-fourth aspect of the present invention, in the power generating element due to the aforementioned fifty-third aspect, the basic structure portion is provided with a first positive side plate-like structure body and a first negative side plate-like structure body, a second positive side plate-like structure body and a second negative side plate-like structure body, an intermediate connector which connects the first positive side plate-like structure body and the first negative side plate-like structure body with the second positive side plate-like structure body and the second negative side plate-like structure body, a pedestal which supports the first positive side plate-like structure body and the first negative side plate-like structure body, and an extreme end connector which connects mutually the leading ends of the second positive side plate-like structure body and the second negative side plate-like structure body, and when the XY plane is taken on a horizontal plane, at a space partitioned by the YZ plane, a space having a positive X coordinate value is defined as a positive-side space and a space having a negative X coordinate value is defined as a negative-side space, the first positive side plate-like structure body and the second positive side plate-like structure body are arranged at the positive-side space, and the first negative side plate-like structure body and the second negative side plate-like structure body are arranged at the negative-side space.

According to a fifty-fifth aspect of the present invention, in the power generating element due to the aforementioned fifty-fourth aspect, the first positive side plate-like structure body and the first negative side plate-like structure body are such that the base end thereof is directly or indirectly connected to the pedestal, the leading end thereof is directly or indirectly connected to the intermediate connector, and they extend in a direction parallel to the Y axis so that a direction from the base end to the leading end is given in a positive direction of the Y axis, and the second positive side plate-like structure body and the second negative side plate-like structure body are such that the base end thereof is directly or indirectly connected to the intermediate connector and the leading end thereof is directly or indirectly connected to the extreme end connector, and they extend in a direction parallel to the Y axis so that a direction from the base end to the leading end is given in the positive direction of the Y axis.

According to a fifty-sixth aspect of the present invention, in the power generating element due to the aforementioned fifty-fourth aspect, the first positive side plate-like structure body is provided with a first positive side Y axis channel portion extending in a direction parallel to the Y axis and a first positive side X axis channel portion extending in a direction parallel to the X axis, the base end of the first positive side Y axis channel portion is directly or indirectly connected to a pedestal, the leading end of the first positive side Y axis channel portion is connected to the base end of the first positive side X axis channel portion, the leading end of the first positive side X axis channel portion is directly or indirectly connected to an intermediate connector, and the first positive side plate-like structure body is formed so as to give an L letter shaped projection image on the XY plane, the first negative side plate-like structure body is provided with a first negative side Y axis channel portion extending in a direction parallel to the Y axis and a first negative side X axis channel portion extending in a direction parallel to the X axis, the base end of the first negative side Y axis channel portion is directly or indirectly connected to the pedestal, the leading end of the first negative side Y axis channel portion is connected to the base end of the first negative side X axis channel portion, the leading end of the first negative side X axis channel portion is directly or indirectly connected to the intermediate connector, and the first negative side plate-like structure body is formed so as to give an L letter shaped projection image on the XY plane, the second positive side plate-like structure body is provided with a second positive side Y axis channel portion extending in a direction parallel to the Y axis and a second positive side X axis channel portion extending in a direction parallel to the X axis, the base end of the second positive side Y axis channel portion is directly or indirectly connected to the intermediate connector, the leading end of the second positive side Y axis channel portion is connected to the base end of the second positive side X axis channel portion, the leading end of the second positive side X axis channel portion is directly or indirectly connected to an extreme end connector, and the second positive side plate-like structure body is formed so as to give an L letter shaped projection image on the XY plane, and the second negative side plate-like structure body is provided with a second negative side Y axis channel portion extending in a direction parallel to the Y axis and a second negative side X axis channel portion extending in a direction parallel to the X axis, the base end of the second negative side Y axis channel portion is directly or indirectly connected to the intermediate connector, the leading end of the second negative side Y axis channel portion is connected to the base end of the second negative side X axis channel portion, the leading end of the second negative side X axis channel portion is directly or indirectly connected to the extreme end connector, and the second negative side plate-like structure body is formed so as to give an L letter shaped projection image on the XY plane.

According to a fifty-seventh aspect of the present invention, in the power generating element due to the aforementioned fifty-third to fifty-sixth aspects, the basic structure portion is further provided with a weight body connected to a predetermined site.

According to a fifty-eighth aspect of the present invention, in the power generating element due to the aforementioned fifty-third to fifty-seventh aspects, a power generating circuit is further provided which rectifies electric current produced on the basis of charge generated at the charge generating element and takes out electric power.

A power generating element of the present invention assumes such a structure that plate-like structure bodies having a first attribute which extend in the positive direction of the Y axis and plate-like structure bodies having a second attribute which extend in the negative direction of the Y axis are connected by way of a connector between different attributes, thus making it possible to realize a structure in which a plurality of resonance systems different in resonance frequency exist concurrently along the same axis. It is, therefore, possible to widen a frequency band capable of generating electric power to a greater extent than conventional examples and also to generate electric power efficiently in various use environments.

Further, as another approach, in the present invention, it is also possible to constitute a power generating element having a dendriform structure, with a pedestal given as a root, which is formed by an aggregate of plate-like structure bodies and intermediate connectors. In this case, when a channel is followed from the pedestal to an end of the dendriform structure, the channel is formed so as to include a branching portion which branches into a plurality of channels at midpoints or a converging portion at which a plurality of channels converge at midpoints. Then, it is also possible to widen a frequency band capable of generating electric power and to generate electric power efficiently in various use environments.

BRIEF DESCRIPTION OF THE DRAWINGS

FIG. 9 is a table which summarizes a concrete method for adjusting resonance frequency fr of the weight body 200 in a resonance system which has the single weight body 200 shown in FIG. 1.

FIGS. 10A and 10B cover graphic charts which show the frequency characteristics of vibration at terminal points T1, T3 of each resonance system obtained as results in which the basic structure portion of the power generating element 1000 shown in FIG. 3 was subjected to computer simulation.

FIGS. 29A and 29B each are a plan view which shows a variation of upper electrode layers formed on an upper surface of a first negative side plate-like structure body 171 in a Seventh Embodiment shown in FIG. 26 (hatching is given for indicating a domain and not for indicating a cross section).

FIG. 30A to 30C each are a plan view which shows a variation of upper electrode layers formed on an upper surface of a second negative side plate-like structure body 174 in a Seventh Embodiment shown in FIG. 26 (hatching is given for indicating a domain and not for indicating a cross section).

DETAILED DESCRIPTION OF THE INVENTION

Hereinafter, a description will be given of the embodiments which illustrate the present invention.

Chapter 1: Power Generating Element which has been Conventionally Proposed

Figure 1:
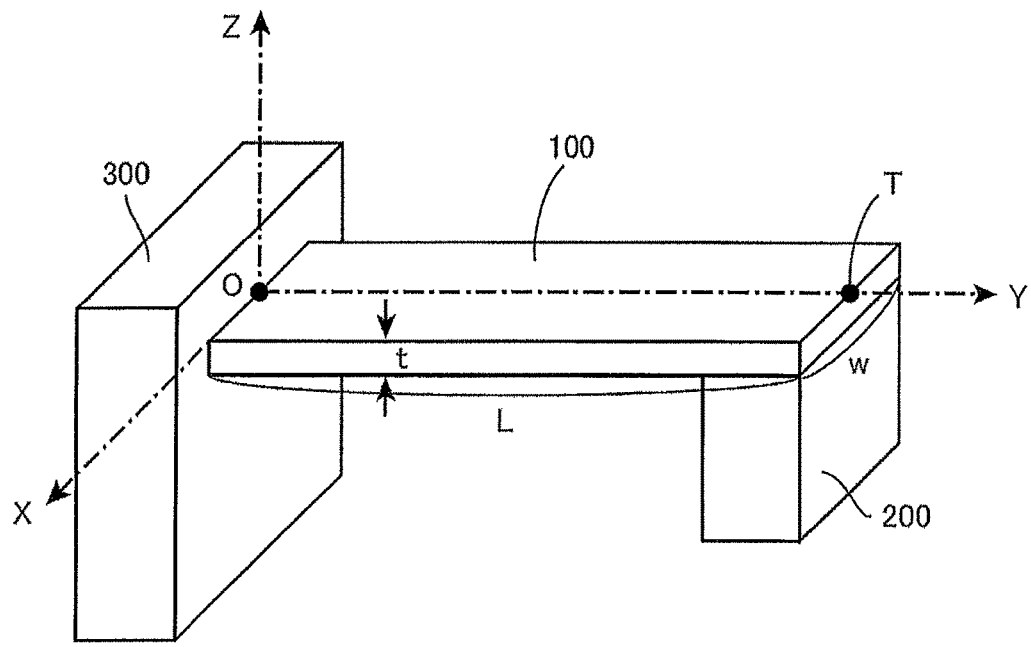
FIG. 1 is a perspective view which shows a basic structure portion of a commonly-used power generating element which has been proposed conventionally.

First, for convenience of description, a brief description will be given of a basic structure of a conventional power generating element which is a type of generating electric power by causing a weight body attached to a plate-like structure body to vibrate. FIG. 1 is a perspective view which shows a basic structure portion of a commonly-used power generating element which has been so far proposed. WO2015/033621 described above also discloses a power generating element which has the basic structure shown in FIG. 1.

As illustrated in the drawing, the basic structure portion is provided with a plate-like structure body 100, a weight body 200 which is attached to a leading end of the plate-like structure body 100 and a pedestal 300 which fixes a base end of the plate-like structure body 100. The pedestal 300 is attached to any vibration source, and vibration energy supplied from the vibration source is converted into electric energy. The plate-like structure body 100 is an elongated plate with the length L, the width w and the thickness t which extends from the base end fixed by the pedestal 300 to the leading end which is a free end. The weight body 200 is supported by a cantilever beam structure composed of this plate. In addition, since the plate-like structure body 100 has flexibility, vibration applied to the pedestal 300 causes the weight body 200 to vibrate. As a result, periodic deflection occurs in the plate-like structure body 100.

Although not illustrated in the drawing, a charge generating element such as a piezoelectric element is allowed to adhere on the surface of the plate-like structure body 100 to generate charge on the basis of deformation of the plate-like structure body 100. Therefore, there is provided a power generating circuit which rectifies and outputs electric current produced on the basis of charge generated at the charge generating element, thus making it possible to take out the generated charge as electric power. Since an arrangement of piezoelectric elements for taking out charge efficiently has been disclosed in WO2015/033621 described above, a description thereof will be omitted here.

In the application concerned, for convenience of describing a constitution of the basic structure portion and a deformation mode, an XYZ three-dimensional orthogonal coordinate system as illustrated in the drawing is defined. On the coordinate system, the plate-like structure body 100 is such an elongated plate that has plate surfaces parallel to the XY plane (an upper surface and a lower surface) and extends from the base end to the leading end thereof along the Y axis. In the example illustrated in the drawing, the Y axis is positioned at a center position on the upper surface of the plate-like structure body 100. Here, the Y axis is referred to as a reference axis, the side of an origin O of the plate-like structure body 100 is referred to as a base end, and the side of a tip point T on the Y axis is referred to as a leading end. Therefore, the plate-like structure body 100 is a plate-like member which has flexibility and extends from the base end to the leading end along the reference axis Y, and the weight body 200 is joined with the leading-end lower surface thereof.

Ordinarily, vibration energy transmitted to the pedestal 300 from an external vibration source includes a component in the direction of the X axis, a component in the direction of the Y axis and a component in the direction of the Z axis. Therefore, the weight body 200 is subjected to force which causes displacement in each direction, that is, in the direction of the X axis, in the direction of the Y axis and in the direction of the Z axis. However, the weight body 200 is supported by the plate-like structure body 100 formed in the shape illustrated in the drawing and, therefore, "ease of displacement" will vary in each of the directions. This is because where force Fx, Fy, Fz in the direction of each coordinate axis is applied to the tip point T (the leading end) in a state that a position of the origin O (the base end) in the drawing is fixed, the plate-like structure body 100 is different in spring constant depending on the direction of each coordinate axis. In general, the direction of the Z axis is a direction at which displacement will occur most easily.

Of course, since the plate-like structure body 100 has flexibility, the weight body 200 is allowed to undergo displacement in the direction of the Y axis by expansion/contraction or warping in the direction of the Y axis, and the weight body 200 is also allowed to undergo displacement in the direction of the X axis by deformation in the direction of the X axis. However, here, consideration is given, as a representative example, to a case where vibration energy in the direction of the Z axis is applied to the pedestal 300 and the weight body 200 undergoes vibration in the direction of the Z axis.

Figure 2:
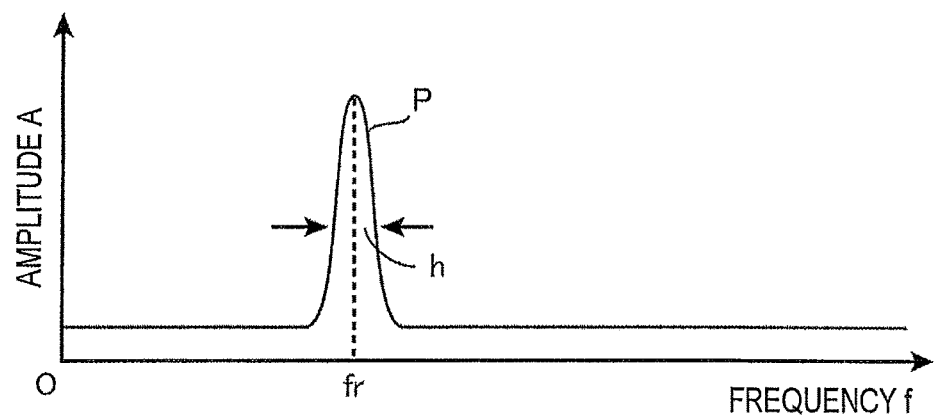
FIG. 2 is a graphic chart which shows amplitude A of a weight body 200 (tip point T) when vibration energy of various frequencies is imparted from the outside to a pedestal 300 of the basic structure portion shown in FIG. 1.

In general, a resonance system has resonance frequency fr which is unique to the system concerned. The closer frequency f of vibration imparted from the outside is to the resonance frequency fr, the larger amplitude A becomes in resonance with the vibration imparted. FIG. 2 is a graphic chart which shows amplitude A of the weight body 200 (tip point T) when vibration energy of various frequencies is imparted from the outside to the pedestal 300 of the basic structure portion shown in FIG. 1. When the frequency f is taken on a horizontal axis and the amplitude A is taken on a vertical axis, as illustrated in the drawing, a peak waveform P appears at a predetermined position of the resonance frequency fr (although for the sake of convenience, a part other than the peak waveform P is indicated by a flat straight line in the drawing, the part is actually not given as a complete straight line).

Of course, the plate-like structure body 100 is different in spring constant depending on the direction of each coordinate axis. Thus, the weight body 200 is also different in value of the resonance frequency fr depending on the direction of each coordinate axis. The graphic chart of FIG. 2 shows a case where the weight body 200 undergoes vibration in the direction of a specific coordinate axis (here, in the direction of the Z axis). The resonance frequency fr shows the resonance frequency of vibration in the direction of the coordinate axis concerned. Further, as will be described below, the plate-like structure body 100 is provided with a plurality of resonance modes according to the number of node points thereof, and resonance frequency varies depending on each of the resonance modes. Thus, here, consideration will be given of a case where the plate-like structure body 100 undergoes vibration in a primary resonance mode.

Resultingly, where the basic structure portion shown in FIG. 1 is understood as one resonance system, in order that the weight body 200 is allowed to vibrate efficiently in the direction of the Z axis in the primary resonance mode, the pedestal 300 may be allowed to vibrate at the resonance frequency fr. In other words, in order to generate electric power efficiently by using the power generating element, it is necessary to impart vibration energy of the resonance frequency fr from the outside. Deviation of frequency of imparted vibration energy from the resonance frequency fr will result in a decrease in power generation efficiency.

On the other hand, silicon or metal is ordinarily used as a material of a power generating element in which MEMS technology suitable for mass production is used. In a resonance system which uses the above-described material, there is found a tendency that, as shown in the graphic chart of FIG. 2, the peak waveform P is high in peak value (Q value) but narrow in half value width h. Therefore, in the case of the conventional power generating element shown in FIG. 1, electric power can be generated efficiently at frequency of vibration imparted from an external environment which is close to the resonance frequency fr. However, the power generation efficiency is abruptly decreased at a frequency which deviates from the resonance frequency fr.

Therefore, in designing a power generating element, such an attempt has been conventionally made that frequency of vibration to be imparted from the outside in actual use environments is assumed and resonance frequency is matched with the thus assumed frequency. However, as the problem has been already pointed out, vibration having various frequencies exists concurrently and vibration having a single frequency is not always applied in actual use environments. Therefore, there is often found such a case that vibration having frequency which has not been assumed is applied. Further, a structure portion made of silicon or metal is varied in resonance frequency depending on external stress or temperature. Thus, even when vibration having frequency as assumed on design is applied, efficient power generation is not necessarily attained.

As described above, the conventional power generating element shown as an example in FIG. 1 is narrow in frequency band capable of generating electric power and not necessarily able to generate electric power at sufficient efficiency depending on actual use environments. And, this poses a problem. The present invention has been made in order to solve the above-described problem and, an object of which is to provide a power generating element which is able to generate electric power efficiently in various use environments by widening a frequency band capable of generating electric power.

Chapter 2. Constitution of First Embodiment

Figure 3:
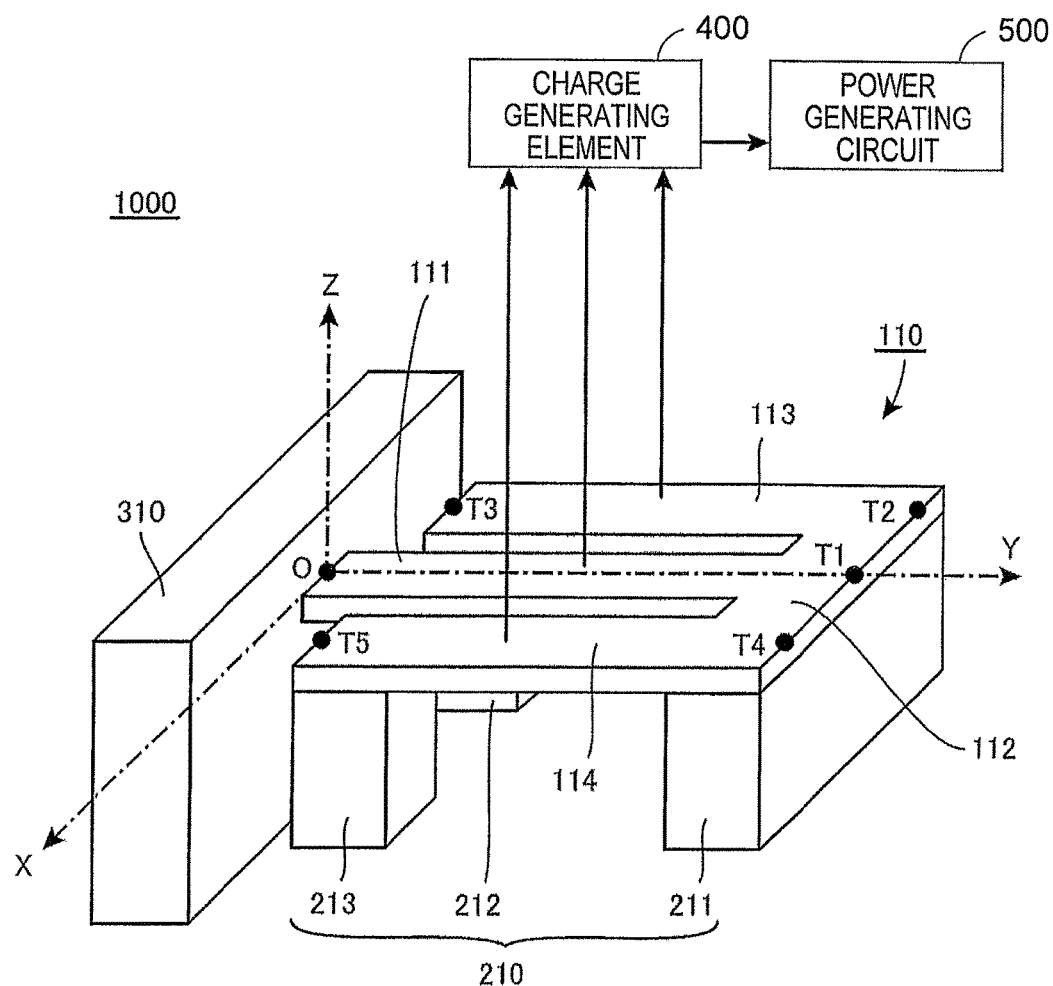
FIG. 3 is a perspective view which shows a power generating element 1000 according to a First Embodiment of the present invention (the figure includes block diagrams).

Here, a description will be given of a constitution of a First Embodiment in the present invention. FIG. 3 is a perspective view which shows a power generating element 1000 according to the First Embodiment (this drawing includes block diagrams). As illustrated in the drawing, the power generating element 1000 is provided with a main substrate 110, a weight body group 210, a pedestal 310, a charge generating element 400 and a power generating circuit 500. Here, a physical constitution portion which is constituted with the main substrate 110, the weight body group 210 and the pedestal 310 is referred to as a basic structure portion. In FIG. 3, the basic structure portion is given as a perspective view. The charge generating element 400 and the power generating circuit 500 are indicated as block diagrams. The power generating element 1000 is characterized in a unique structure of the basic structure portion shown in the perspective view. Hereinafter, a description will be given of the unique structure.

Here, as with Chapter 1, an XYZ three-dimensional orthogonal coordinate system as illustrated in the drawing is defined, and the Y axis is referred to as a reference axis. In the power generating element 1000 as well, as with the conventional power generating element shown in FIG. 1, there is adopted a structure in which the weight body is supported by a cantilever beam of a plate-like structure body and electric power is generated by converting vibration energy into electric energy.

The main substrate 110 is a plate-like structure body, the planar shape of which is formed in the E letter shape. As illustrated in the drawing, it is constituted with four portions, that is, a central plate-like structure body 111, a connector between different attributes 112, a negative side plate-like structure body 113 and a positive side plate-like structure body 114. The connector between different attributes 112 plays a role of connecting plate-like structure bodies having different attributes from each other, as will be described below. The negative side plate-like structure body 113 is a constituent in which an X coordinate value is set at a negative domain, and the positive side plate-like structure body 114 is a constituent in which an X coordinate value is set at a positive domain.

Here, for the sake of convenience, a description will be given by dividing the main substrate 110 into four portions. However, the main substrate 110 is, nevertheless, a completely integrated single substrate formed in the E letter shape, and the four portions are those playing a specific role in the single E-letter shaped substrate. The main substrate 110 may be constituted with any material as long as the material is able to constitute a member which has flexibility. However, in practice, the main substrate 110 is preferably constituted with silicon or metal.

On the other hand, as illustrated in the drawing, the weight body group 210 is constituted with three sets of weight bodies 211, 212, 213, each of which is connected to a predetermined site on the lower surface of the main substrate 110. Specifically, the weight body 211 is connected to the lower surface of the connector between different attributes 112, the weight body 212 is connected to the lower surface of the negative side plate-like structure body 113 at the leading end (the left-side end in the drawing), and the weight body 213 is connected to the lower surface of the positive side plate-like structure body 114 at the leading end (the left-side end in the drawing). These weight bodies 211, 212, 213 may be constituted with any material as long as the material has mass sufficient in causing vibration. However, in securing a sufficient mass, it is preferable to use metal such as SUS (iron), copper, tungsten or silicon, ceramic or glass.

Then, the pedestal 310 is a constituent which supports and fixes the base end of the central plate-like structure body 111 (the left-side end in the drawing). As will be described below, the pedestal 310 is in practice fixed to a device case of the power generating element 1000 and plays a role of transmitting vibration energy from a vibration source to the central plate-like structure body 111. In FIG. 3, there is depicted the pedestal 310 which is formed so as to give a rectangular solid block shape. However, the pedestal 310 may be formed in any shape and may be constituted with any material, as long as it is able to support and fix the central plate-like structure body 111.

The connector between different attributes 112 and the weight body 211 connected to the lower surface thereof are supported so as to give a cantilever beam structure to the pedestal 310 by the central plate-like structure body 111 extending along the Y axis. The central plate-like structure body 111 has flexibility and, therefore, undergoes deflection upon application of an external force, and a terminal point T1 undergoes displacement in relation to the origin O. Therefore, when vibration energy is applied to the pedestal 310, the central plate-like structure body 111 causes periodic deflection, thereby allowing the weight body 211 to vibrate. As will be described below, the vibration leads to vibration of a first resonance system I.

On the other hand, the weight body 212 is supported so as to give a cantilever beam structure to the connector between different attributes 112 by the negative side plate-like structure body 113 extending in a direction parallel to the Y axis. As for the negative side plate-like structure body 113, since at least a part which is not connected to the weight body 212 has flexibility, deflection occurs upon application of an external force, and a terminal point T3 undergoes displacement in relation to a terminal point T2 (in this example, no significant deflection will occur at the part which is connected to the weight body 212). Therefore, when vibration energy is applied to the connector between different attributes 112, the negative side plate-like structure body 113 causes periodic deflection, thereby allowing the weight body 212 to vibrate. As will be described below, the vibration leads to vibration of a second resonance system II.

Similarly, the weight body 213 is supported so as to give a cantilever beam structure to the connector between different attributes 112 by the positive side plate-like structure body 114 extending in a direction parallel to the Y axis. As for the positive side plate-like structure body 114, at least a part which is not connected to the weight body 213 has flexibility and, therefore, causes deflection upon application of an external force. A terminal point T5 undergoes displacement in relation to a terminal point T4 (in this example, no significant deflection will occur at the part which is connected to the weight body 213). Therefore, when vibration energy is applied to the connector between different attributes 112, the positive side plate-like structure body 114 causes periodic deflection, thereby allowing the weight body 213 to vibrate. The vibration also leads to vibration of the second resonance system II.

As described above, the origin O which serves as a base point of the first resonance system I is fixed to the pedestal 310 and, therefore, a vibration end T1 of the first resonance system I is to vibrate on the basis of the origin O. In contrast, the terminal points T2, T4, each of which is a base point of the second resonance system II, are to vibrate in response to vibration at the terminal point T1, and vibration ends T3, T5 of the second resonance system II are to vibrate on the basis of the terminal points T2, T4 during vibration. In other words, the basic structure portion constitutes a complicated combined vibration system which houses the first resonance system I and the second resonance system II in a nested manner. As will be described below, such a complicated combined vibration system is constituted, thus making it possible to attain an object of the present invention which is to widen a frequency band capable of generating electric power.

The charge generating element 400 which is depicted as a block diagram in FIG. 3 is a constituent which generates charge on the basis of deformation of the plate-like structure bodies 111, 113 114 (for example, piezoelectric elements), and the power generating circuit 500 which is depicted as a block diagram is a constituent which rectifies electric current produced on the basis of charge generated at the charge generating element 400 and takes out electric power. The charge generating element 400 and the power generating circuit 500 will be described for their constitutions and motions in Chapter 5.

Figure 4:
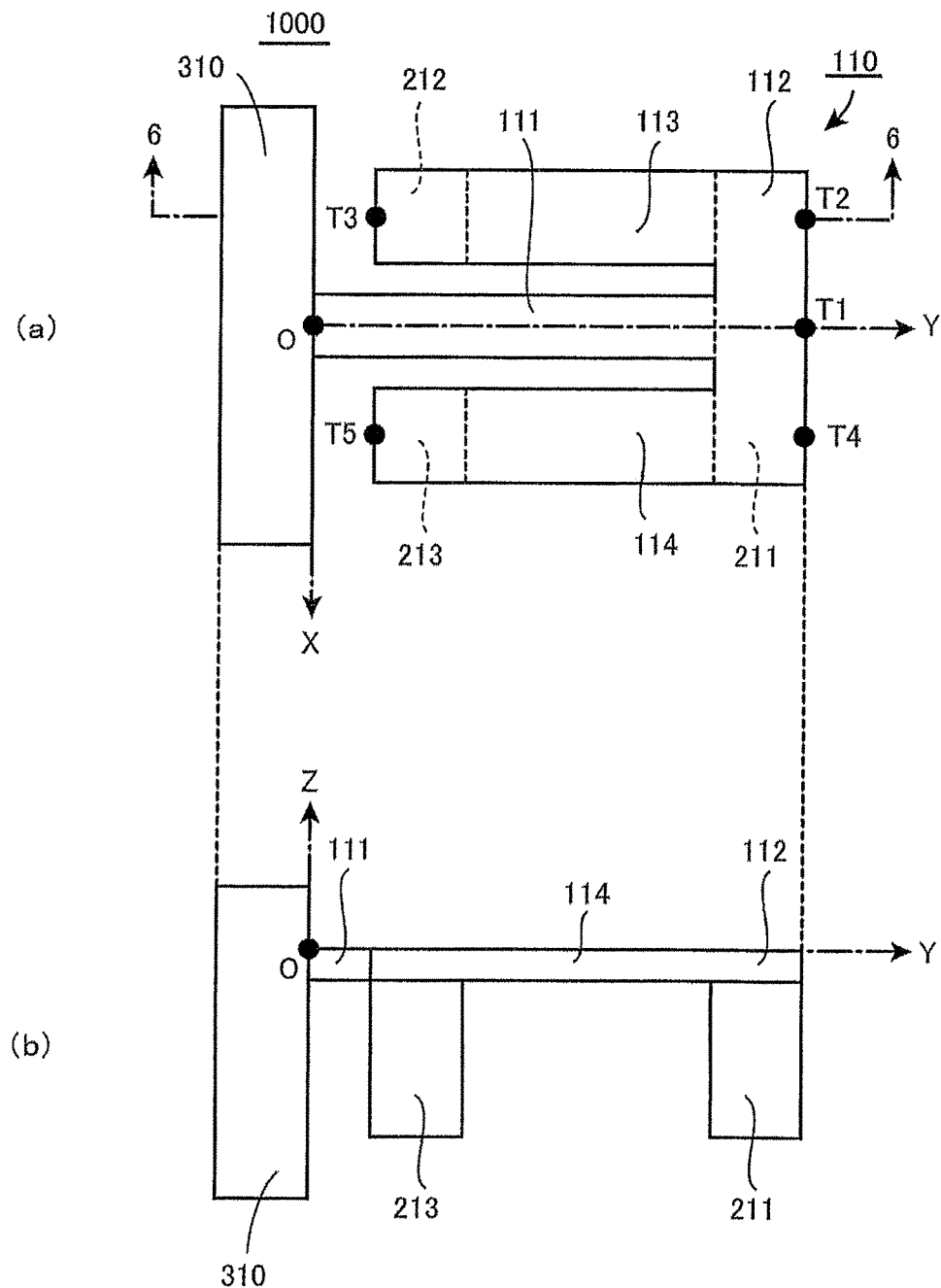
FIG. 4(a) is a top view of a basic structure portion of the power generating element 1000 shown in FIG. 3.
FIG. 4(b) is a side elevational view thereof.

FIG. 4(*a*) is a top view of the basic structure portion of the power generating element 1000 shown in FIG. 3, and FIG. 4(*b*) is a side elevation view thereof. In the application concerned, as illustrated in the drawing, an XYZ three-dimensional orthogonal coordinate system is defined by taking the XY plane on a horizontal plane and at a space partitioned by the YZ plane, a space having a positive X coordinate value is defined as a positive-side space, and a space having a negative X coordinate value is defined as a negative-side space. As described above, the basic structure portion is constituted with the main substrate 110, the weight body group 210 and the pedestal 310. Here, as illustrated in the drawing, the main substrate 110 is an E-letter shaped substrate which has the central plate-like structure body 111 arranged on the Y axis, the negative side plate-like structure body 113 arranged at the negative-side space, the positive side plate-like structure body 114 arranged at the positive-side space and the connector between different attributes 112.

The connector between different attributes 112 is a plate-like constituent extending in the direction of the X axis, performing a function to connect the central plate-like structure body 111 with the negative side plate-like structure body 113 and to connect the central plate-like structure body 111 with the positive side plate-like structure body 114. Any of the three sets of plate-like structure bodies 111, 113, 114 is a plate-like constituent extending in the direction of the Y axis and connected to the connector between different attributes 112. However, only the left end of the central plate-like structure body 111 is connected to the pedestal 310.

In the application concerned, as for both ends of each of the plate-like structure bodies, on a channel connecting to the pedestal 310, an end closer to the pedestal 310 is referred to as a base end, while an end further away from the pedestal 310 is referred to as a leading end. For example, in the case of the central plate-like structure body 111, the left side is closer to the pedestal 310 than the right side in the drawing and, therefore, a left end side is the base end, while a right end side is the leading end. In contrast, in the cases of the negative side plate-like structure body 113 and the positive side plate-like structure body 114, with attention given to a positional relationship of space, the left side is closer to the pedestal 310 than the right side. However, with a channel connecting to the pedestal 310 taken into account, the terminal point T3 is connected to the pedestal 310 by way of a channel of T3 to T2 to T1 to O and the terminal point T5 is connected to the pedestal 310 by a channel of T5 to T4 to T1 to O. Therefore, on the connection channels, the right side of the drawing is closer to the pedestal 310 than the left side, and the right end side is the base end, while the left end side is the leading end.

Then, here, for convenience of description, any one of two attributes is given to each of the plate-like structure bodies. A first attribute is an attribute which is given to a plate-like structure body extending in a direction parallel to the Y axis so that a direction from the base end to the leading end is given in the positive direction of the Y axis. In the case of the example illustrated in the drawing, the central plate-like structure body 111 is to be a plate-like structure body having the first attribute. In contrast, a second attribute is an attribute which is given to a plate-like structure body extending in a direction parallel to the Y axis so that a direction from the base end to the leading end is given in the negative direction of the Y axis. In the case of the example illustrated in the drawing, the negative side plate-like structure body 113 and the positive side plate-like structure body 114 are plate-like structure bodies having the second attribute.

In short, in the case of the example shown in FIG. 4(a), the central plate-like structure body 111 having the first attribute is arranged on the YZ plane, the base end thereof is connected to the pedestal 310 and the leading end thereof is connected to the connector between different attributes 112. And, the central plate-like structure body 111 extends in a direction parallel to the Y axis so that a direction from the base end to the leading end is given in the positive direction of the Y axis. Further, the negative side plate-like structure body 113 having the second attribute is arranged at the negative-side space and the base end thereof is connected to the connector between different attributes 112. And the negative side plate-like structure body 113 extends in a direction parallel to the Y axis so that a direction from the base end to the leading end is given in the negative direction of the Y axis. The positive side plate-like structure body 114 also having the second attribute is arranged at the positive-side space and the base end thereof is connected to the connector between different attributes 112. And, the positive side plate-like structure body 114 extends in a direction parallel to the Y axis so that a direction from the base end to the leading end is given in the negative direction of the Y axis.

The connector between different attributes 112 plays a role of connecting mutually a plate-like structure body having the first attribute with a plate-like structure body having the second attribute and is literally "a constituent which connects plate-like structure bodies different in attributes from each other." A relationship between a plate-like structure body having the first attribute and a plate-like structure body having the second attribute is such that a direction from the base end to the leading end is reversed. Therefore, in the case of the example such as a channel of a cantilever beam structure extending from the pedestal 310 (in the case of FIG. 4(a), the channel passing through O to T1 to T2 to T3 and the channel passing through O to T1 to T4 to T5), the channel returns at the connector between different attributes 112. Thus, the connector between different attributes 112 plays a role of a return point.

Three sets of the weight bodies 211, 212, 213 are connected to the lower surface of the main substrate 110. In FIG. 4(a), a contour of each of the weight bodies is partially depicted by the dashed line. The weight body 211 is a rectangular solid-like structure body which is identical in planar shape with the connector between different attributes 112 and connected to the lower surface of the connector between different attributes 112. On the other hand, the weight body 212 is a rectangular solid-like structure body, the planar shape of which is a square, and connected to the leading-end lower surface of the negative side plate-like structure body 113. The weight body 213 is a rectangular solid-like structure body, the planar shape of which is a square, and connected to the leading-end lower surface of the positive side plate-like structure body 114.

Figure 5:
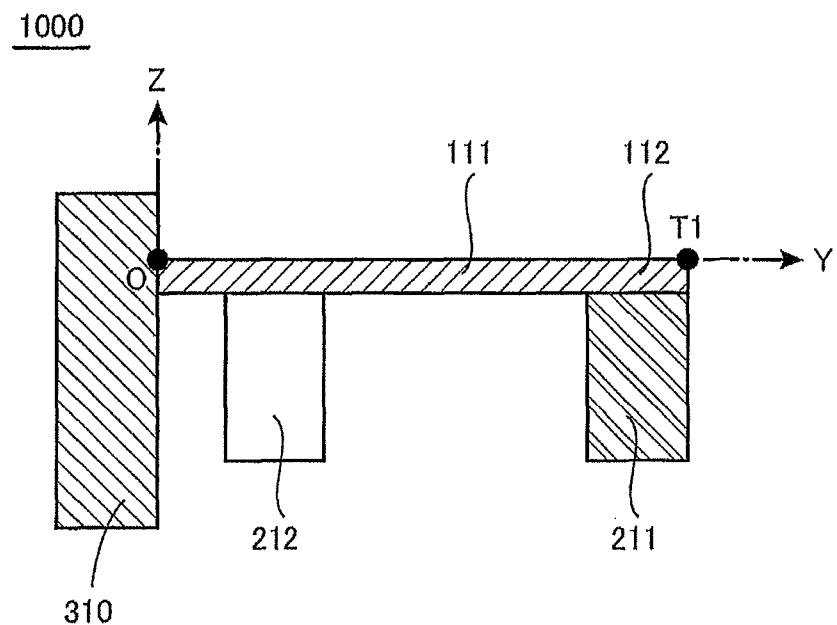
FIG. 5 is a side sectional view in which the basic structure portion of the power generating element 1000 shown in FIG. 3 is cut along the YZ plane.
Figure 6:
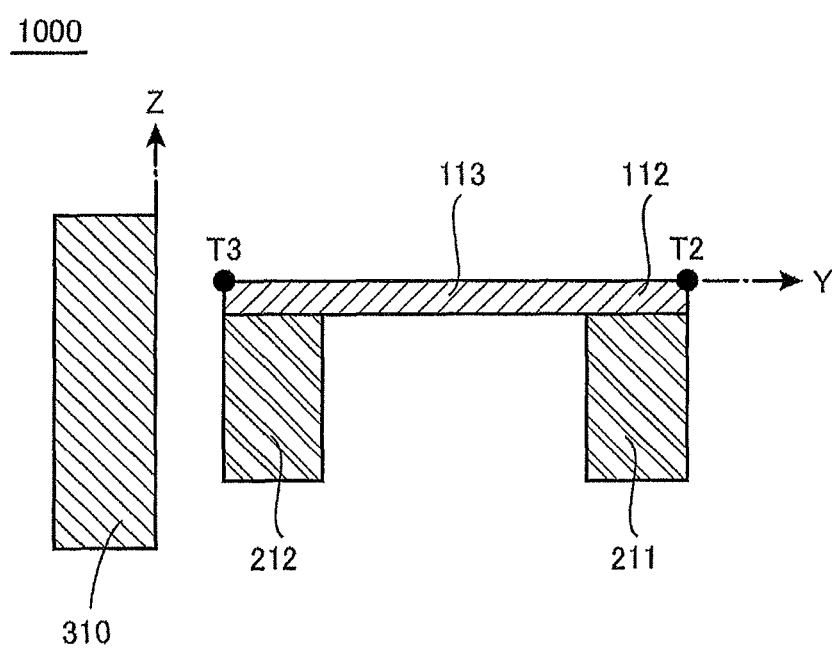
FIG. 6 is a side sectional view in which the basic structure portion of the power generating element 1000 shown in FIG. 4(a) is cut along a cutting line 6-6.

A structure of each of these weight bodies clearly appears in the side elevational view of FIG. 4(b) and the side sectional views of FIG. 5 and FIG. 6. FIG. 4(b) is a side elevational view which shows a state of the basic structure portion shown in FIG. 4(a) observed from below FIG. 4(a). Further, FIG. 5 is a side sectional view in which the basic structure portion shown in FIG. 4(a) is cut along the YZ plane. FIG. 6 is a side sectional view in which the basic structure portion shown in FIG. 4(a) is cut along a cutting line 6-6. As apparent from these drawings, the bottom of each of the weight bodies 211, 212, 213 is set to be positioned slightly above from the bottom of the pedestal 310. This is because consideration is given so that when the bottom of the pedestal 310 is fixed to a device case, a certain space is to be kept between the device case and the bottom of each of the weight bodies 211, 212, 213. Each of the weight bodies 211, 212, 213 undergoes vibration inside the device case by using the space.

Chapter 3. Characteristics of Basic Structure Portion Having a Plurality of Resonance Systems In Chapter 2, a brief description has been given to the fact that the plurality of resonance systems are included in the basic structure portion of the power generating element 1000 to constitute a complicated combined vibration system as a whole. Here, a more detailed description will be given of the characteristics of a concrete vibration mode in the plurality of resonance systems and the resonance frequency thereof.

In the basic structure portion shown in FIG. 4(a), the weight body 211 is supported in relation to the pedestal 310 by a cantilever beam structure composed of the central plate-like structure body 111. A channel from the pedestal 310 to the weight body 211 is equivalent to a channel from the origin O to the terminal point T1. In contrast, the weight body 212 is supported in relation to the pedestal 310 by a cantilever beam structure composed of the central plate-like structure body 111, the connector between different attributes 112 and the negative side plate-like structure body 113. A channel from the pedestal 310 to the weight body 212 is equivalent to the channel of O to T1 to T2 to T3. The weight body 213 is also supported in relation to the pedestal 310 by a cantilever beam structure composed of the central plate-like structure body 111, the connector between different attributes 112 and the positive side plate-like structure body 114. A channel from the pedestal 310 to the weight body 213 is equivalent to the channel of O to T1 to T4 to T5.

Figure 7A:
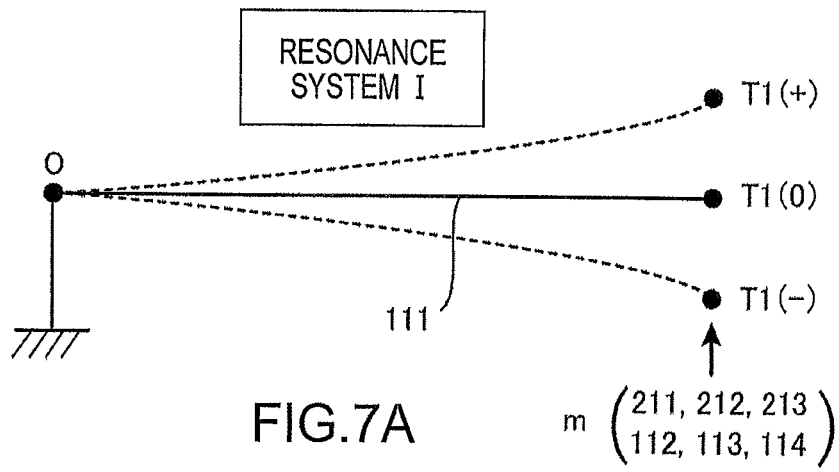
FIG. 7A to 7C cover conceptual diagrams which show two types of resonance systems included in the basic structure portion of the power generating element 1000 shown in FIG. 3.
Figure 7B:
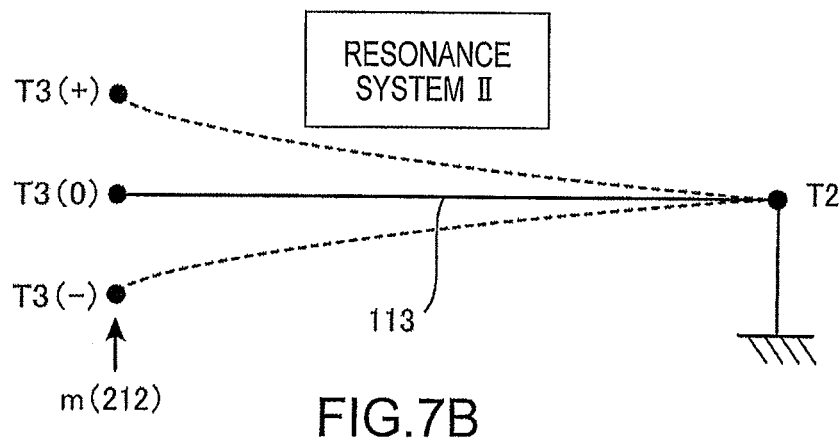
Figure 7C:
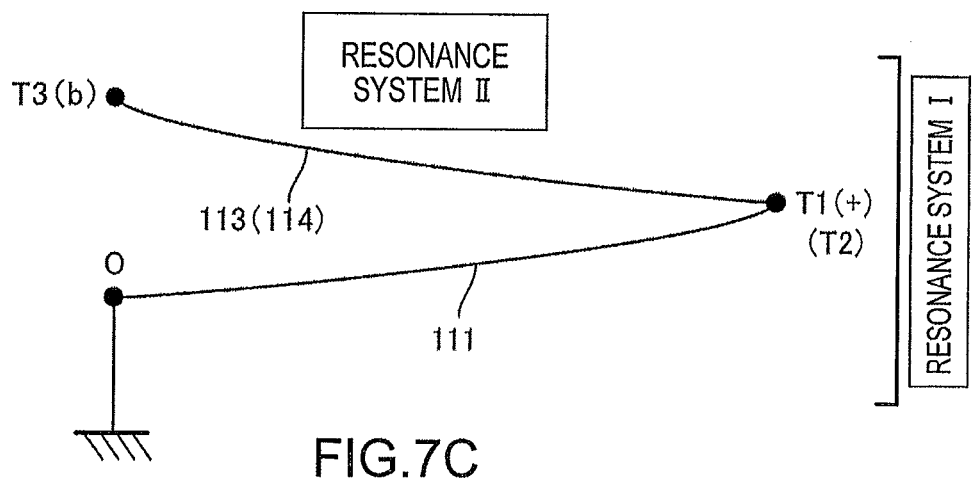

As described above, any of the three sets of weight bodies 211, 212, 213 is supported in relation to the pedestal 310 by a cantilever beam structure. Due to a difference in channel of the cantilever beam structure, however, a different resonance system is constituted in each of them. FIG. 7A to 7C cover the conceptual diagrams which show two types of the resonance systems included in the basic structure portion.

FIG. 7A shows a first resonance system I which causes vibration resulting from deformation of the central plate-like structure body 111 having the first attribute. This diagram shows a condition in which the terminal point T1 at the leading end thereof undergoes displacement in a state that the origin O positioned at the base end of the central plate-like structure body 111 is fixed. Here, this resonance system is considered as a simple model which is constituted with the flexible plate-like structure body 111 composed of a single line and also constituted with a mass point m positioned at the terminal point T1. In the diagram, the solid line indicates the system in a stationary state, while the dashed line indicates the system in a vibration state. In the vibration state, the plate-like structure body 111 undergoes deformation as indicated by the dashed line. The terminal point T1 undergoes displacement from a position in a stationary state T1 (0) to an upward position T1 (+) or undergoes displacement to a downward position T1 (−), and these motions are repeated.

As shown in FIG. 4(a), a total load of the connector between different attributes 112, the negative side plate-like structure body 113, the positive side plate-like structure body 114 and the weight bodies 211, 212, 213 is applied to the terminal point T1, and the central plate-like structure body 111 plays a role of supporting the load. Therefore, the mass point m in the model of FIG. 7A is a point which has an entire mass of the constituents 211, 212, 213, 112, 113, 114.

The basic structure portion of the conventional power generating element shown in FIG. 1 is equivalent to such that the plate-like structure body 111 of the resonance system I shown in FIG. 7A is realized by the plate-like structure body 100 and the mass point m of this resonance system I is realized by the weight body 200. This resonance system has the frequency characteristics shown in the graphic chart of FIG. 2, and amplitude A thereof has a peak waveform P at a predetermined position of resonance frequency fr. In the case of the resonance system I shown in FIG. 7A, a value of resonance frequency fr1 is determined by a spring constant of the plate-like structure body 111 and a mass of the mass point m (an entire mass of the constituents 211, 212, 213, 112, 113, 114). Therefore, the value of resonance frequency fr1 can be adjusted through adjustment of the above-described values.

On the other hand, FIG. 7B shows a second resonance system II which causes vibration resulting from deformation of the negative side plate-like structure body 113 having the second attribute (this is also true for a resonance system which causes vibration resulting from deformation of the positive side plate-like structure body 114). This drawing shows a condition in which the terminal point T3 at the leading end thereof undergoes displacement in a state that the terminal point T2 positioned at the base end of the negative side plate-like structure body 113 is fixed. Here, the resonance system is also considered as a simple model which is constituted with the flexible plate-like structure body 113 composed of a single line and also constituted with a mass point m positioned at the terminal point T3. The solid line also indicates the system in a stationary state and the dashed line indicates the system in a vibration state. In the vibration state, the plate-like structure body 113 undergoes deformation as shown in the dashed line. And, the terminal point T3 undergoes displacement from a position of the stationary state T3 (0) to an upward position T3 (+) and undergoes displacement to a downward position T3 (−), and these motions are repeated.

As shown in FIG. 4(a), load of the weight body 212 is applied to the terminal point T3, and the negative side plate-like structure body 113 plays a role of supporting the load. Therefore, the mass point m at the model of FIG. 7B is a point having a mass of the weight body 212. In the case of the resonance system II shown in FIG. 7B, a value of resonance frequency fr2 is determined by a spring constant of the plate-like structure body 113 and a mass of the mass point m (mass of the weight body 212). Therefore, the value of resonance frequency fr2 can be adjusted through adjustment of the above-described values.

Nevertheless, in the case of the basic structure portion shown in FIG. 4, the terminal point T2 which is indicated as a fixed point in the model of FIG. 7B is connected to the terminal point T1 which is indicated as a displacement point in the model of FIG. 7A. Therefore, in practice, the terminal point T2 is not a fixed point but a point at which vibration occurs together with the terminal point T1. The second resonance system II in its entirety is a system which is allowed to vibrate by the first resonance system I. Therefore, the basic structure portion shown in FIG. 4 constitutes a complicated combined vibration system which houses the first resonance system I and the second resonance system II in a nested manner.

FIG. 7C is a drawing which shows a simple model of the above-described combined vibration system. The model assumes such a mode that the second resonance system II shown in FIG. 7B is grafted at the position of the terminal point T1 of the first resonance system I shown in FIG. 7A. In practice, the second resonance system II is such that two systems, that is, a system of the negative side plate-like structure body 113 and a system of the positive side plate-like structure body 114 are incorporated therein. Therefore, the combined vibration system includes the resonance system I composed of the central plate-like structure body 111, the resonance system II composed of the negative side plate-like structure body 113 and the resonance system II composed of the positive side plate-like structure body 114. Here, two sets of the resonance systems II as a whole perform a function as "a weight of the resonance system I" which is connected to the terminal point T1 and, therefore, the resonance system I is a system which completely includes two sets of the resonance systems II.

FIG. 7C shows a state that the terminal point T1 undergoes displacement at an upward position T1 (+) and the terminal point T3 undergoes displacement at a predetermined position T3 (b). Here, the position T3 (b) is determined depending on the position of the terminal point T3 shown in FIG. 7B. As described above, the resonance frequency fr1 of the resonance system I is determined by a spring constant of the plate-like structure body 111 and a mass of the mass point m (load applied to the terminal point T1). The resonance frequency fr2 of the resonance system II is determined by a spring constant of the plate-like structure body 113 or 114 and a mass of the mass point m (load applied to the terminal point T3 or T5). Therefore, values of the resonance frequencies fr1, fr2 can be adjusted through adjustment of the above-described values. However, since the resonance system II as a whole performs a function as a weight of the resonance system I, adjustment made for the resonance system II will accordingly influence the resonance system I.

A deformation mode of each of the plate-like structure bodies indicated by the solid line or the dashed line in FIG.

7A to 7C show a state in which each of the resonance systems causes resonance in a primary resonance mode. In practice, there is a case that vibration may occur in a higher resonance mode.

Figure 8A:
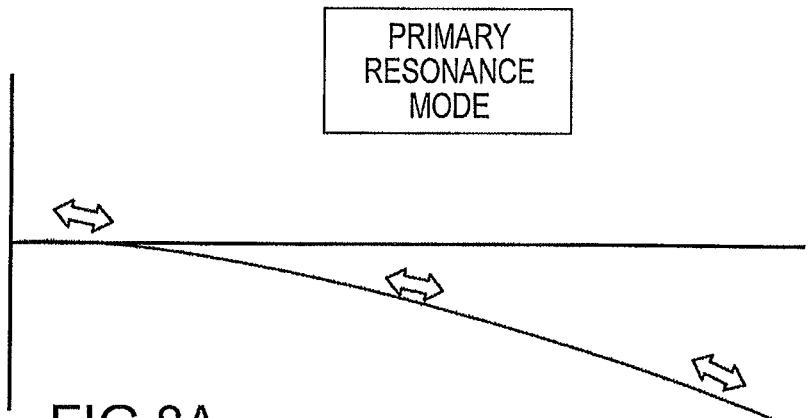
FIG. 8A to 8C cover schematic diagram which show some examples of resonance modes in a commonly-used plate-like structure body, that is, deformation modes of the plate-like structure body when a horizontal line is given as a reference position.
Figure 8B:
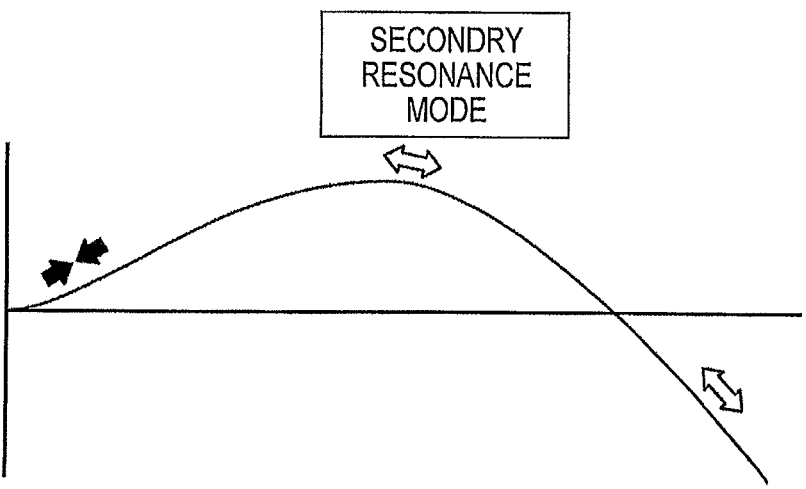
Figure 8C:
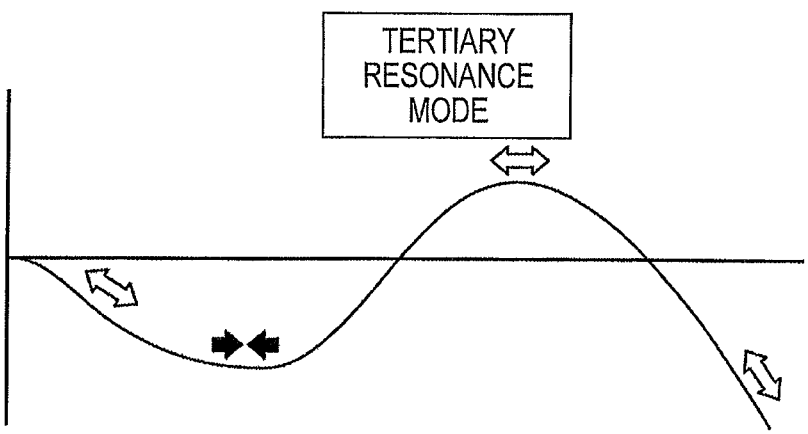

FIG. 8A to 8C cover the schematic diagrams which show some examples of resonance modes in a commonly-used plate-like structure body, indicating a deformation mode of a plate-like structure body when the horizontal line is given as a reference position. The curved line in the drawing indicates the plate-like structure body, with the left end (the base end) fixed and the right end (the leading end) given as a free end. In the drawing, the arrow indicates a direction of stress which is applied to the upper surface of the plate-like structure body in each of deformation states. Specifically, the white arrow indicates that "stress extending in a longitudinal direction" is applied to the upper surface, while the black arrow indicates "stress contracting in the longitudinal direction" is applied to the upper surface.

FIG. 8A shows a deformation mode in a primary resonance mode, depicting a gently curved line which protrudes upward as a whole. In this deformation state, stress extending in the longitudinal direction thereof is applied to the upper surface of the plate-like structure body (refer to the white arrow). In contrast, stress contracting in the longitudinal direction is applied to the lower surface of the plate-like structure body. Here, attention is given only to expansion/contraction on the upper surface.

On the other hand, FIG. 8B shows a deformation mode in a secondary resonance mode which is indicated by a gently curved line protruding downward in the vicinity of the base end and which is indicated subsequently by a gently curved line protruding upward. As a result, stress contracting in the longitudinal direction is applied to the upper surface of the plate-like structure body at the base end (refer to the black arrow), and stress expanding in the longitudinal direction is applied to the upper surface thereof continuing ahead (refer to the white arrow). Similarly, FIG. 8C shows a deformation mode in a tertiary resonance mode which is indicated by a more complicated curved line, and partially contracting stress (refer to the black arrow) or partially expanding stress (refer to the white arrow) is applied. Although not illustrated in the drawing, in a fourth or higher resonance mode, the plate-like structure body is still more complicated in deformation mode.

Each of the resonance modes shown in FIG. 8A to 8C is provided for the plate-like structure body 100 in a simple resonance system illustrated in FIG. 1. A peak of resonance frequency according to the order of resonance mode appears on the graphic chart of the frequency characteristics. In general, a peak position is shifted to a higher frequency, with an increase in the order of resonance mode.

Of course, the resonance mode in this simple resonance system cannot be applied as it is to the combined vibration system shown in FIG. 7C. In any case, a deformation mode of each of the plate-like structure bodies, 111, 113, 114 shown in FIG. 3 is changed in various manners according to frequency of vibration imparted from external environments, thus resulting in change in direction of stress applied to individual portions. In practice, each of the plate-like structure bodies 111, 113, 114 shown in FIG. 3 undergoes vibration in a plurality of resonance modes and a peak of the resonance frequency appears at a plurality of sites. Stress occurring on the surface of each of the plate-like structure bodies is greatest in a deformation mode in a primary resonance mode shown in FIG. 8A, and vibration in the primary resonance mode contributes to electric power generation by vibration to the greatest extent. Thus, hereinafter, a description will be given of working effects of the present invention on the assumption that each of the plate-like structure bodies undergoes vibration in the primary resonance mode.

Chapter 4. Adjustment of Resonance Frequency

An object of the present invention is to provide a power generating element which is capable of generating electric power efficiently in various use environments by widening a frequency band capable of generating electric power. For this reason, in the present invention, as shown in the example of FIG. 3, there is adopted a basic structure portion which serves as a combined vibration system including a plurality of resonance systems. As described above, a unique resonance frequency fr is found in each of resonance systems, and each resonance frequency fr is determined by a spring constant of a plate-like structure body and a mass of a weight. Therefore, each of the plate-like structure bodies and the weight are adjusted respectively for spring constant and mass, thus making it possible to shift the resonance frequency fr of each of the resonance systems in a desired direction on a frequency axis and also to widen a frequency band capable of generating electric power. This is a basic principle of the present invention.

FIG. 9 is a table which has summarized concrete methods for adjusting the resonance frequency fr of the weight body 200 in a simple resonance system having the single weight body 200 as shown in FIG. 1. The concrete adjustment methods shown in the table are roughly classified into a method in which the plate-like structure body 100 is changed in shape or material (a method in which the plate-like structure body 100 is changed in spring constant) and a method in which the weight body 200 is changed in mass.

The former includes a method for change in thickness t (a dimension in the direction of the Z axis), a method for change in width W (a dimension in the direction of the X axis), a method for change in length L (a dimension in the direction of the Y axis) and a method for change in material (Young's modulus E) of the plate-like structure body 100 shown in FIG. 1. First, the resonance frequency fr is decreased with a decrease in thickness t of the plate-like structure body 100, while the resonance frequency fr is increased with an increase in thickness t thereof. Similarly, the resonance frequency fr is decreased with a decrease in width w of the plate-like structure body 100, while the resonance frequency fr is increased with an increase in width w thereof. Then, the resonance frequency fr is decreased with an increase in length L (length of the resonance system) of the plate-like structure body 100, while the resonance frequency fr is increased with a decrease in length L. Lastly, when the plate-like structure body 100 is made of a softer material (Young's modulus E is decreased), the resonance frequency fr is decreased, while when it is made of a harder material (Young's modulus E is increased), the resonance frequency fr is increased.

On the other hand, the latter includes a method for change in mass m of the weight body. Specifically, the latter includes a method for change in dimension and a method for change in material (specific gravity). In both of the methods, when the mass m is increased (made heavier), the resonance frequency fr is decreased, and when the mass m is decreased (made lighter), the resonance frequency fr is increased.

The method for adjustment shown in the table of FIG. 9 assumes a resonance system having the single weight body 200 shown in FIG. 1. A basic principle thereof can be applied to the basic structure portion having the plurality of weight bodies shown in FIG. 3.

In the former method for change in shape or material of the plate-like structure body, targets to be changed are four parameters such as thickness t, width w, length L and material (Young's modulus E). Of course, these four parameters may be changed in combination thereof. A change in the four parameters only means a change in spring constant of the resonance system. Of course, a method for shifting the resonance frequency includes a method for change in mass m of the weight body. Therefore, the former method for change in shape or material of the plate-like structure body and the latter method for change in mass m of the weight body can be used by combining them.

Next, a description will be given of the frequency characteristics of total electric power production by the power generating element 1000 shown in FIG. 3. FIGS. 10A and 10B each are a graphic chart which shows the frequency characteristics of vibration at terminal points T1, T3 each acting as a vibration point of each of the resonance systems obtained as results by subjecting the basic structure portion of the power generating element 1000 shown in FIG. 3 to computer simulation. The horizontal axis of the graphic chart indicates frequency f of vibration applied from the outside to the power generating element 1000 (in this example, vibration in the direction of the Z axis), and the vertical axis of the graphic chart indicates amplitude A of the terminal point T1 or the terminal point T3 excited on the basis of the vibration applied from the outside.

Specifically, FIG. 10A shows the frequency characteristics indicating amplitude A at the terminal point T1 which serves as a vibration point of the first resonance system I, and a great peak waveform P11 appears at a position of the frequency value fr1 and a small peak waveform P12 appears at a position of the frequency value fr2. On the other hand, FIG. 10B shows the frequency characteristics indicating amplitude A at the terminal point T3 acting as a vibration point of the second resonance system II. A great peak waveform P22 appears at a position of the frequency value fr2, and a small peak waveform P21 appears at a position of the frequency value fr1.

Here, the frequency value fr1 is resonance frequency in the primary resonance mode unique to the first resonance system I, and the frequency value fr2 is resonance frequency in the primary resonance mode unique to the second resonance system II. In the basic structure portion of FIG. 3, each of the plate-like structure bodies 111, 113, 114 is similar in thickness t but slightly different in width w and length L. Specifically, as shown in FIG. 4(a), the plate-like structure body 111 which constitutes the first resonance system I is narrower in width w and longer in length L than the plate-like structure bodies 113, 114 which constitute the second resonance system II. Therefore, with reference to the table of FIG. 9, the plate-like structure body 111 which constitutes the first resonance system I is smaller in spring constant k than the plate-like structure bodies 113, 114 which constitute the second resonance system II. As far as comparison with spring constants of the plate-like structure bodies is concerned, the resonance frequency fr1 of the first resonance system I is lower than the resonance frequency fr2 of the second resonance system II.

On the other hand, as shown in FIG. 7A, the mass m of the weight of the first resonance system I is an entire mass of the constituents 211, 212, 213, 112, 113, 114. In contrast, as shown in FIG. 7B, the mass m of the weight of the second resonance system II is a mass of the weight body 212. Therefore, the weight of the first resonance system I is heavier than the weight of the second resonance system II. With reference to the table of FIG. 9, as for the weight thereof, the resonance frequency fr1 of the first resonance system I is lower than the resonance frequency fr2 of the second resonance system II.

Resultingly, in the case of the basic structure portion shown in FIG. 3, the resonance frequency fr1 is lower than the resonance frequency fr2. The graphic charts of FIG. 10A, B show the frequency characteristics which are in agreement with the theoretical analysis results.

Therefore, when vibration is applied from the outside to the pedestal 310 shown in FIG. 3 and the frequency f of the external vibration is gradually raised from lower frequency, there is found the following phenomena. First, when frequency f of external vibration to be applied reaches the resonance frequency fr1, amplitude A at the terminal point T1 shows an abrupt increase as shown in the peak waveform P11 of FIG. 10A. This is because the first resonance system I involved in vibration at the terminal point T1 has reached a unique resonance frequency fr1 thereof. At this time, the second resonance system II has not yet reached a unique resonance frequency fr2 thereof. Thus, the amplitude A at the terminal point T3 is to be quite small.

However, in practice, as shown in FIG. 7C, the first resonance system I and the second resonance system II are housed in a nested manner and physically connected to each other, by which they are mutually influenced by vibration. That is, when frequency f of external vibration reaches the resonance frequency fr1 and the terminal point T1 abruptly increases in amplitude A as shown in the peak waveform P11, the terminal point T3 correspondingly increases in amplitude A. The small peak waveform P21 shown in FIG. 10B is a peak waveform generated upon receipt of the above-described influence. In short, such a phenomenon takes place that when there is given external vibration having frequency corresponding to the resonance frequency fr1 at the terminal point T1, not only does the terminal point T1 abruptly increase in amplitude but also the terminal point T3 increases in amplitude due to the influence.

Then, consideration is given to a case where frequency f of external vibration reaches the resonance frequency fr2. In this case, as shown in the peak waveform P22 of FIG. 10B, the amplitude A at the terminal point T3 abruptly increases. This is because the second resonance system II involved in vibration at the terminal point T3 has reached a unique resonance frequency fr2 thereof. At this time, the amplitude A at the terminal point waveform P12 shown in FIG. 10A is a peak waveform generated by the influence. In short, such a phenomenon takes place that when there is given external vibration having frequency corresponding to the resonance frequency fr2 at the terminal point T3, not only does the terminal point T3 abruptly increase in amplitude but also the terminal point T1 increases in amplitude due to the influence.

FIG. 10B shows the frequency characteristics of vibration at the terminal point T3 (a tip point of the negative side plate-like structure body 113). The frequency characteristics of vibration at the terminal point T5 (a tip point of the positive side plate-like structure body 114) are also identical therewith.

Resultingly, when external vibration having the resonance frequency fr1 is applied to the pedestal 310 of the power generating element 1000 shown in FIG. 3, the weight body 211 undergoes vibration having the amplitude A shown in the peak waveform P11 of FIG. 10A, and the weight bodies 212, 213 undergo vibration having the amplitude A shown in the peak waveform P21 of FIG. 10B. Further, when external vibration having the resonance frequency fr2 is applied thereto, the weight body 211 undergoes vibration having amplitude A shown in the peak waveform P12 of FIG. 10A, and the weight bodies 212, 213 undergo vibration having amplitude A shown in the peak waveform P22 of FIG. 10B.

Figure 11:
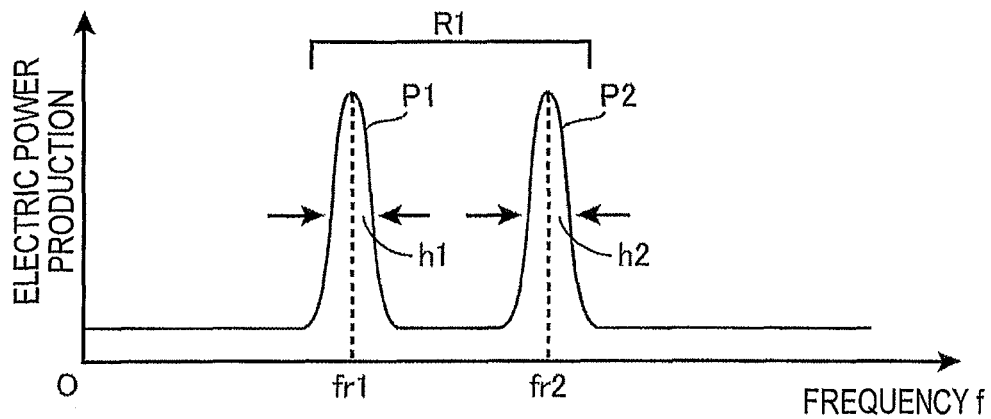
FIG. 11 is a graphic chart which shows the frequency characteristics of a total electric power production by the power generating element 1000 shown in FIG. 3.

Then, if charge generated by the charge generating element 400 on the basis of deformation of the central plate-like structure body 111, the negative side plate-like structure body 113 and the positive side plate-like structure body 114 is rectified and taken out by the power generating circuit 500, the frequency characteristics of electric power production by the power generating element 1000 as a whole are those shown in the graphic chart of FIG. 11. That is, there are obtained a first peak waveform P1 (half value width h1) of the electric power production at a position of the resonance frequency fr1 of the first resonance system I and a second peak waveform P2 (half value width h2) of the electric power production at a position of the resonance frequency fr2 of the second resonance system II. In FIG. 11, for the sake of convenience, the height and width of each of the two peak waveforms P1, P2 are depicted in the same dimensions. However, in practice, these peak waveforms P1, P2 are determined for the height and width depending on conditions such as dimensions and materials of individual portions of the basic structure portions shown in FIG. 3.

Electric power production indicated by the vertical axis of FIG. 11 is from first to last a total electric power production by the power generating element 1000 as a whole. Therefore, the first peak waveform P1 shown in FIG. 11 includes not only the electric power production on the basis of deformation of the central plate-like structure body 111 which constitutes the first resonance system I but also includes the electric power production on the basis of deformation of the negative side plate-like structure body 113 and the positive side plate-like structure body 114 which constitute the second resonance system II. The second peak waveform P2 also shows a total electric power production on the basis of deformation of the individual plate-like structure bodies 111, 113, 114.

In the case of the conventional power generating element shown in FIG. 1, electric power can be generated efficiently only when external vibration having frequency in the vicinity of the resonance frequency fr shown in the graphic chart of FIG. 2 is imparted, thereby inevitably resulting in a narrow frequency band capable of generating electric power to such an extent of about a half value width h thereof. In contrast, in the case of the power generating element 1000 according to the present invention in FIG. 3, the peak waveforms P1 and P2 are obtained respectively at the resonance frequencies fr1, fr2, as shown in the graphic chart of FIG. 11. Thus, electric power can be generated efficiently upon application of external vibration having frequencies in the vicinity of the resonance frequencies fr1, fr2. Then, it is possible to widen a frequency band capable of generating electric power approximately up to a frequency band R1 illustrated in the drawing.

Of course, the frequency band R1 illustrated in the drawing is not a continuous band which covers an entire range of the frequencies fr1 to fr2 but a band which is what-is-called "in a state of being discontinued at random." Therefore, efficient electric power generation cannot be necessarily attained by all the external vibrations having frequencies in a range of fr1 to fr2. However, as compared with power generation characteristics of the conventional power generating element shown in the graphic chart of FIG. 2, it is possible to obtain the effects of widening a frequency band capable of generating electric power.

As described above, in the basic structure portion of the power generating element 1000 shown in FIG. 3, the plate-like structure body 111 having the first attribute is connected to the plate-like structure bodies 113, 114 having the second attribute by the connector between different attributes 112. And, a relationship between the plate-like structure body having the first attribute and the plate-like structure bodies having the second attribute is such that they are reverse in the direction from the base end to the leading end. Therefore, all the plate-like structure bodies extend in the same direction along the reference axis Y but they are structured so as to return at the connector between different attributes 112, thus making it possible to house the basic structure portion in its entirety into a relatively compact space and also downsize the power generating element as a whole.

Further, due to the above-described structure, it is possible to form a combined vibration system which houses a plurality of plate-like structure bodies extending along the same direction of the reference axis Y in a nested manner. Therefore, as shown in the frequency characteristics of FIG. 11, the peaks P1, P2 with a relatively large electric power production can be provided at a plurality of sites, thereby obtaining the effect of widening a frequency band capable of generating electric power. This is an important working effect of the present invention.

In addition, when the power generating element is designed according to the present invention, a plurality of resonance systems are changed in spring constant and mass of a weight, thus making it possible to shift positions of the peaks P1, P2 of electric power production.

As described above, the graphic chart of the conventional element shown in FIG. 2 is compared with the graphic chart of the element according to the present invention shown in FIG. 11 to reveal that in the latter, the peak waveforms are increased to two sets, thereby widening a frequency band capable of generating electric power approximately to the frequency band R1 as illustrated in the drawing. Therefore, where vibration to be imparted from the outside to the power generating element 1000 in actual use environments is assumed to be vibration which includes a frequency component within the frequency band R1 illustrated in the drawing, it can be said that the frequency characteristics shown in FIG. 11 are quite preferable. In particular, where major frequency components of external vibration in actual use environments are fr1, fr2, the frequency characteristics shown in FIG. 11 are exactly ideal characteristics.

Figure 12A:
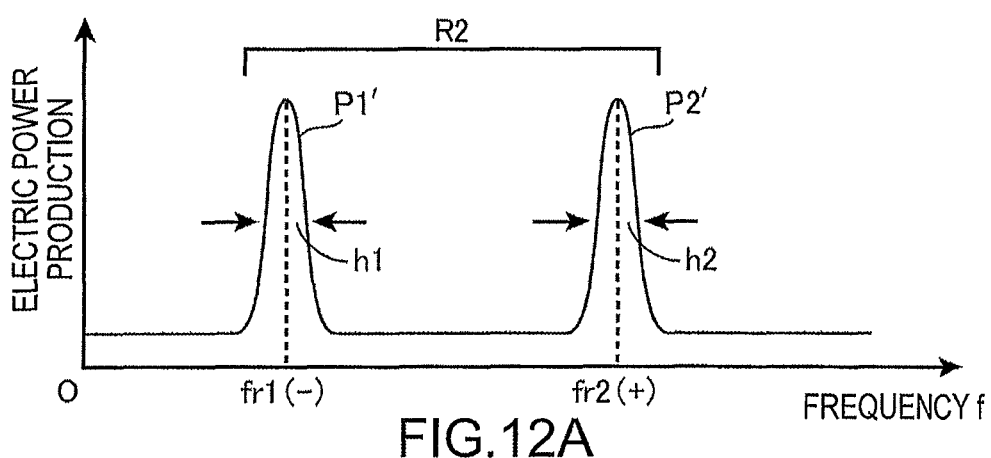
FIGS. 12A and 12B each cover a graphic chart which shows frequency characteristics in a state that adjustment is made for resonance frequencies fr1, fr2.

However, where the frequency components of assumed external vibration are distributed in a wider region, it is preferable to make such adjustment that the resonance frequency fr1 of the peak waveform P1 (resonance frequency of the first resonance system I) is shifted to the left side so as to be lower and the resonance frequency fr2 of the peak waveform P2 (resonance frequency of the second resonance system II) is shifted to the right side so as to be higher. FIG. 12A is a graphic chart which shows results of the above adjustment. The resonance frequency fr1 of the peak waveform P1 is adjusted to fr1 (−) and the peak waveform P1 is shifted to the left side, thereby giving a peak waveform P1'. Further, the resonance frequency fr2 of the peak waveform P2 is adjusted to fr2 (+) and the peak waveform P2 is shifted to the right side, thereby giving a peak waveform P2'.

As a result, in the case of the graphic chart of FIG. 12A, an entire frequency band is extended to R2. Of course, this frequency band is such that R2 is not a continuous band which covers an entire range of the frequency fr1 (−) to fr2 (+) but a band "in a state of being discontinued at random."

However, the frequency band shows favorable frequency characteristics where there is imparted external vibration including frequency components in a range of the frequency fr1 (−) to fr2 (+). In particular, where main frequency components are fr1 (−) and fr2 (+), the frequency characteristics shown in FIG. 12A are given as ideal characteristics.

Figure 12B:
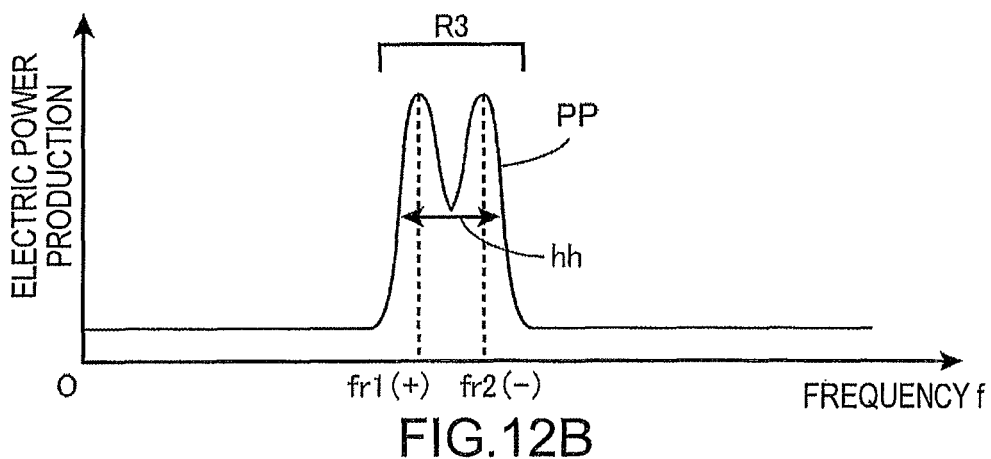

In contrast, where the frequency components of assumed external vibration are distributed in a narrower range, it is preferable to make such adjustment that in the frequency characteristics shown in FIG. 11, the resonance frequency fr1 of the peak waveform P1 is shifted to the right side so as to be higher and the resonance frequency fr2 of the peak waveform P2 is shifted to the left side so as to be lower. FIG. 12B is a graphic chart which shows results of the above adjustment. The resonance frequency fr1 of the peak waveform P1 is adjusted to fr1 (+) to shift the peak waveform P1 to the right side. Further, the resonance frequency fr2 of the peak waveform P2 is adjusted to fr2 (−) to shift the peak waveform P2 to the left side. As a result, the two peak waveforms are merged and formed into a merged peak waveform PP having a half value width hh which is wider than the half value widths h1, h2.

In the case of the graphic chart of FIG. 12B, an entire frequency band is given as R3 and narrower than the frequency band R1 shown in the graphic chart of FIG. 11. However, due to formation of the merged peak waveform PP, the frequency band R3 is a continuous band which covers an entire range of the frequencies fr1 (+) to fr2 (−). Therefore, where there is imparted external vibration which includes frequency components in the vicinity of the frequencies fr1 (+) to fr2 (−), the frequency characteristics shown in FIG. 12B are given as ideal characteristics.

In the case of the power generating element having the frequency characteristics shown in the graphic chart of FIG. 12B, the basic structure portion thereof is provided with the weight body 211 connected to a vibration end of the plate-like structure body 111 having the first attribute and the weight bodies 212, 213 connected to vibration ends of the plate-like structure bodies 113, 114 having the second attribute. And, resonance frequency of each of the weight bodies is set adjacent to each other so that spectrum peak waveforms in the vicinity of resonance frequencies of the two types of weight bodies are partially overlapped with each other. As described above, the plurality of spectrum peak waveforms are designed so as to be adjacent to each other, thus making it possible to form the merged peak waveform PP greater in width and also to generate electric power efficiently at a wide and continuous frequency band.

In practice, it is preferable to design a power generating element which has appropriate frequency characteristics, with consideration given to the frequency components of external vibration occurring in actual use environments. For this reason, the resonance frequencies, fr1, fr2 of the first resonance system I and the second resonance system II are required to be adjusted so that they are individually shifted in a desired direction. Of course, where the frequency components of assumed external vibration are high as a whole or low as a whole, such adjustment is also needed that a frequency band in itself is allowed to move laterally along a frequency axis f.

In order to adjust the resonance frequency fr of each of the resonance systems, there are available a method for adjusting a plate-like structure body (a method for adjusting a spring constant) and a method for adjusting a mass of a weight body, as shown in FIG. 9. Where the method for adjusting a spring constant is adopted, the first resonance system I which causes vibration resulting from deformation of the plate-like structure body having the first attribute and the second resonance system II which causes vibration resulting from deformation of the plate-like structure bodies having the second attribute may be set so that a spring constant K1 of the first resonance system I is made different from a spring constant k2 of the second resonance system II. They are set as described above, by which at least two sets of resonance frequencies, fr1, fr2 can be set as a mutually different value to obtain such an effect that a frequency band capable of generating electric power is widened, as compared with a resonance system having a single resonance frequency.

Here, the spring constant k1 of the first resonance system I can be defined as a value k1 expressed in a formula of k1=F/d1 in which, as shown in FIG. 7A, when force F is applied to the terminal point T1 (the connector between different attributes 112) in a predetermined application direction (for example, in the direction of the Z axis in the drawing) in a state that the point O (the pedestal) is fixed, displacement occurring at the terminal point T1 in the above application direction is given as d1.

Similarly, the spring constant k2 of the second resonance system II can be defined as a value k2 expressed in a formula of k2=F/d2 in which, as shown in FIG. 7B, when force F is applied to the terminal point T3 or T5 (the vibration end of the plate-like structure body 113 or 114 having the second attribute) in the application direction in a state that the terminal point T2 (the connector between different attributes 112) is fixed, displacement occurring at the terminal point T3 or T5 in the application direction is given as d2.

Since the spring constant is in practice different depending on the direction of displacement, an individually different spring constant is defined in each direction. In the examples shown in FIGS. 7A and 7B, the spring constant calculated on the basis of the displacement d1 or d2 occurring upon application of force F in the direction of the Z axis is to be a spring constant in the direction of the Z axis. Therefore, the power generating element may be practically designed, with consideration given to a spring constant in a representative vibration direction of external vibration which is assumed to occur in actual use environments.

As shown in the table of FIG. 9, parameters which will influence the spring constant are four parameters such as the thickness, width, length and material of the plate-like structure body. Therefore, in order to obtain the effect of widening a frequency band capable of generating electric power by setting two sets of resonance frequencies fr1, fr2 so as to be different in value, of the plurality of plate-like structure bodies included in the basic structure portion, at least two sets of them are made different in one parameter or a plurality of parameters among the four parameters of thickness, width, length and material. Thereby, the spring constant of the first resonance system may be set so as to be different from the spring constant of the second resonance system.

Of course, the weight body is changed in mass, thus making it possible to adjust the resonance frequency. Further, the weight body is changed in position (this is equivalent to a change in length of the plate-like structure body), by which it is also possible to adjust the resonance frequency.

Figure 13:
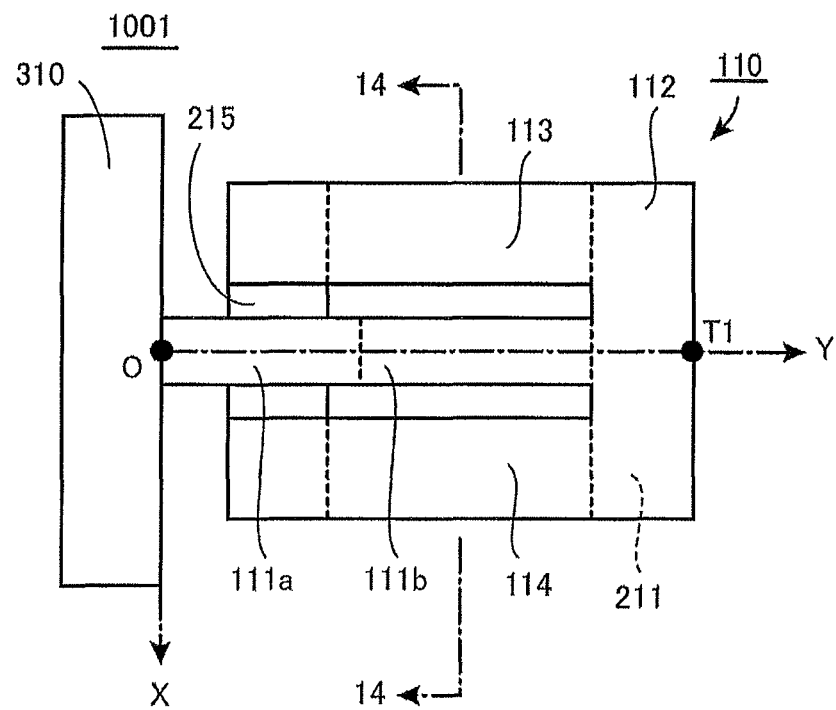
FIG. 13 is a top view which shows a basic structure portion of a power generating element 1001 according to a modification example of the power generating element 1000 shown in FIG. 3 (neither a charge generating element 400 nor a power generating circuit 500 is illustrated in the drawing).
Figure 14:
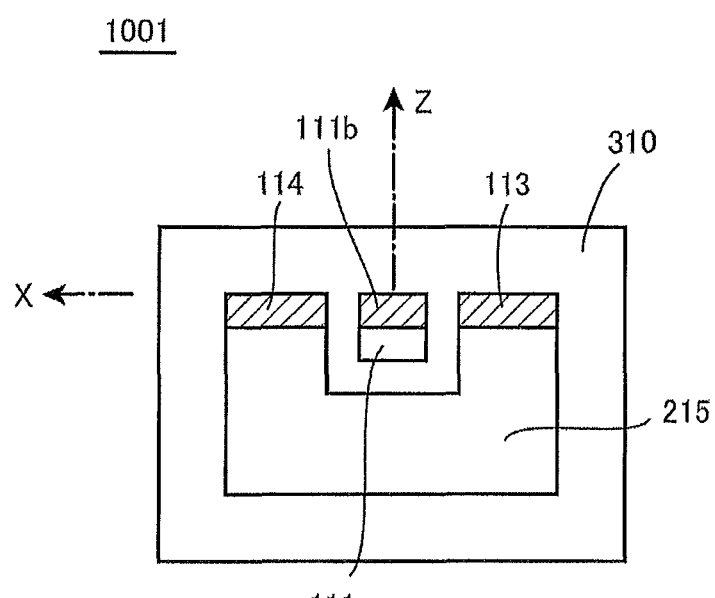
FIG. 14 is a front sectional view in which the basic structure portion of the power generating element 1001 shown in FIG. 13 is cut along a cutting line 14-14.

FIG. 13 is a top view which shows a basic structure portion of a power generating element 1001 according to a modification example of the power generating element 1000 shown in FIG. 3. FIG. 14 is a front sectional view in which the basic structure portion of the power generating element 1001 shown in FIG. 13 is cut along a cutting line 14-14. The power generating element 1000 shown in FIG. 3 is different from the power generating element 1001 shown in FIG. 13 in that the pair of weight bodies 212, 213 in the former are replaced by a single weight body 215 in the latter and that the central plate-like structure body 111 in the former is constituted with a base-end-side structure body 111a and a leading-end-side structure body 111b in the latter.

That is, the basic structure portion of the power generating element 1001 is provided with a first weight body 211 which is connected to a lower surface of a connector between different attributes 112 and a second weight body 215 which couples a leading-end lower surface of a negative side plate-like structure body 113 with a leading-end lower surface of a positive side plate-like structure body 114. The first weight body 211 shown in FIG. 13 is identical to the first weight body 211 shown in FIG. 3. On the other hand, as shown in the sectional view of FIG. 14, the second weight body 215 is provided with a U-letter shaped structure so as to cover astride below the base-end-side structure body 111a, with a predetermined distance maintained in relation to the base-end-side structure body 111a.

The second weight body 215 is able to undergo displacement freely within a predetermined tolerance without being in contact with the base-end-side structure body 111a and, therefore, able to play a role as a weight of the second resonance system II. Since the weight body 215 has a structure portion which covers astride below the base-end-side structure body 111a, a mass thereof is greater than a total mass of the weight bodies 212, 213 of the power generating element 1000 shown in FIG. 3. Thus, more efficient power generation is expected. Of course, the weight body 215 may be structured so as to couple the leading-end upper surface of the negative side plate-like structure body 113 with the leading-end upper surface of the positive side plate-like structure body 114, thereby covering astride above the base-end-side structure body 111a.

In the power generating element 1001, there is used a structure body in which the base-end-side structure body 111a is connected to the leading end-side structure body 111b, in place of the central plate-like structure body 111 of the power generating element 1000. This is because the base-end-side structure body 111a is allowed to serve as a stopper. As shown in the front sectional view of FIG. 14, the leading-end-side structure body 111b is a flexible plate-like structure body which is equal in thickness to the plate-like structure bodies 113 and 114, and this is a constituent which performs a function similar to that of the central plate-like structure body 111 of the power generating element 1000. On the other hand, the base-end-side structure body 111a is greater in thickness than the leading-end-side structure body 111b and given as a structure body higher in rigidity. The base-end-side structure body 111a performs a function as a supporting member for supporting the base end of the leading-end-side structure body 111b (the central plate-like structure body) to the pedestal 310.

In the power generating element 1001, even where the leading-end-side structure body 111b and the plate-like structure bodies 113, 114 undergo deflection resulting from vibration imparted from the outside to result in displacement of the weight body 215, the base-end-side structure body 111a (the supporting member) is kept substantially in a stationary state, while being fixed to the pedestal 310. Therefore, even upon application of excessive acceleration, the weight body 215 comes into contact with the base-end-side structure body 111a, thereby restricting excessive displacement of the weight body 215 and preventing breakage of the structure bodies 111b, 113, 114 thin in thickness. Of course, where no function of the stopper is needed, the central plate-like structure body 111 shown in FIG. 3 may be used as it is, in place of the structure body in which the base-end-side structure body 111a is connected to the leading-end-side structure body 111b.

As described above, in the present invention, any given parameters shown in the table of FIG. 9 can be changed to design a power generating element which has desired frequency characteristics. However, as shown in FIG. 7C, in terms of a positional relationship, two sets of the resonance systems I, II included in the basic structure portion are housed in a nested manner. Thus, the change in any parameter of one of the resonance systems may influence a parameter of the other resonance systems. For example, in the basic structure portion shown in FIG. 3, the negative side plate-like structure body 113 and the positive side plate-like structure body 114 which constitute the second resonance system II are changed in thickness, width or length, by which they may also be changed in mass thereof. As a result, the first resonance system I is changed in mass of the weight.

In other words, when a power generating element is designed so that the negative side plate-like structure body 113 and the positive side plate-like structure body 114 are changed in thickness, width or length in an attempt to adjust the resonance frequency fr2 of the second resonance system II, the first resonance system I will be changed in resonance frequency fr1. Therefore, in order to design the power generating element which has desired frequency characteristics, it is preferable to conduct repeatedly such work that computer simulation is used to determine the frequency characteristics after change of design and the design is further changed on the basis of the results thereof.

Chapter 5. Charge Generating Element and Power Generating Circuit

In the power generating element 1000 shown in FIG. 3, the charge generating element 400 and the power generating circuit 500 are shown in the block diagrams. Concrete examples of them will be described here. First, the charge generating element 400 will be described. When external vibration is applied to the pedestal 310, as described above, each of the plate-like structure bodies 111, 113, 114 undergoes deflection to cause deformation, thereby allowing the individual weight bodies 211, 212, 213 to vibrate. The charge generating element 400 is a constituent which generates charge on the basis of deformation of each of the plate-like structure bodies 111, 113, 114.

As for the charge generating element 400, for example, an electret can be used. With regard to the basic structure portion shown in FIG. 3, it is preferable that a layered piezoelectric element is formed on each of the plate-like structure bodies 111, 113, 114. The following example is such that a piezoelectric element is used as the charge generating element 400 and the piezoelectric element is constituted with a three-layered structure, that is, a lower electrode layer, a piezoelectric material layer and an upper electrode layer.

Figure 15:
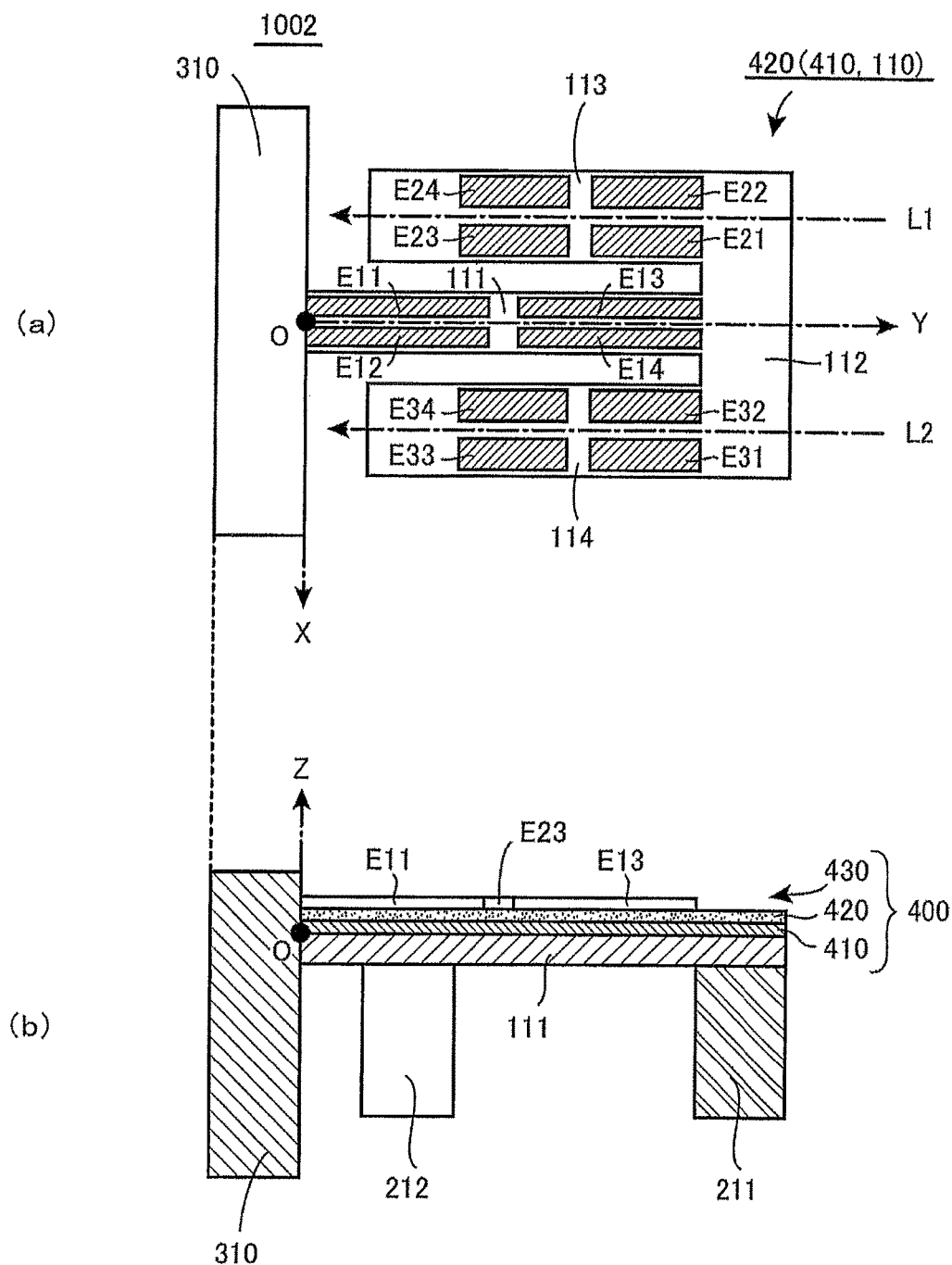
FIG. 15(a) is a top view which shows a power generating element 1002 according to another modification example of the power generating element 1000 shown in FIG. 3.
FIG. 15(b) is a side sectional view in which the power generating element 1002 is cut along the YZ plane (a power generating circuit 500 is not illustrated in the drawing, and it is noted that hatching in the top view is given for indicating clearly a configuration pattern of each of upper electrode layers E11 to E34 which constitute a charge generating element 400 and not for indicating a cross section).

FIG. 15(a) is a top view which shows a power generating element 1002 which is obtained by forming a piezoelectric element as the charge generating element 400 at the basic structure portion shown in FIG. 3, and FIG. 15(b) is a side sectional view in which the power generating element is cut along the YZ plane (the power generating circuit 500 is not illustrated in the drawing). In other words, a state that the piezoelectric element 400 is added to the basic structure portion shown in FIG. 4(*a*) and FIG. 4(*b*) is shown in FIG. 15(*a*) and FIG. 15(*b*). The three-layered structure of the piezoelectric element 400 is clearly shown as a layer formed on the upper surface of the central plate-like structure body 111 in the side sectional view of FIG. 15(*b*).

As shown in FIG. 15(*b*), the piezoelectric element 400 is provided with a lower electrode layer 410 formed on an upper surface of each of the plate-like structure bodies 111, 113, 114, a piezoelectric material layer 420 formed on the upper surface of the lower electrode layer 410 to generate charge on the basis of stress and an upper electrode layer 430 formed on the upper surface of the piezoelectric material layer 420. The piezoelectric element 400 performs a function to supply charge of predetermined polarity to each of the lower electrode layer 410 and the upper electrode layer 430.

The piezoelectric element 400 generates electric power in practice at a part at which each of the plate-like structure bodies 111, 113, 114 undergoes deformation (a part to which the weight body is not joined) and, theoretically, it is sufficient that the piezoelectric element 400 is formed only at the part at which deformation will occur. However, in the case of the example shown here, in order to simplify a production process, the lower electrode layer 410 and the piezoelectric material layer 420 are formed in an entire domain of the upper surface of the E-letter shaped main substrate 110 (the central plate-like structure body. 111, the connector between different attributes 112, the negative side plate-like structure body 113 and the positive side plate-like structure body 114), and only the upper electrode layer 430 is formed so as to be arranged at predetermined sites in a localized manner.

Rectangular patterns E11 to E34 indicated by giving hatching in the top view of FIG. 15(*a*) show discrete upper electrode layers which are individually arranged in a localized manner (hatching of the top view is to clearly indicate a configuration pattern of each of the discrete upper electrode layers E11 to E34 and not for indicating a cross section).

When the basic structure portion is viewed from above, as shown in FIG. 15(*a*), such a state is observed that 12 discrete upper electrode layers E11 to E34 are arranged on the upper surface of the E letter shaped piezoelectric material layer 420. The lower electrode layer 410 which is also formed in an E letter shape is arranged under the E letter shaped piezoelectric material layer 420, and the main substrate 110 which is also formed in an E letter shape is arranged further thereunder. Since FIG. 15(*b*) is a side sectional view in which the basic structure portion is cut along the YZ plane, the discrete upper electrode layers E11, E13 formed on the central plate-like structure body 111 come to the surface, and the discrete upper electrode layer E23 formed on the negative-side plate-like structure body 113 comes to the surface partially behind them.

Resultingly, in the case of the example shown in FIG. 15, a common lower electrode layer 410 is formed in an entire domain on the upper surface of the E letter shaped main substrate 110 including each of the plate-like structure bodies 111, 113, 114, and a common piezoelectric material layer 420 is formed on the upper surface of the common lower electrode layer 410. Then, the plurality of discrete upper electrode layers E11 to E34, each of which is electrically independent, are formed at different sites on the upper surface of the common piezoelectric material layer 420.

Figure 16A:
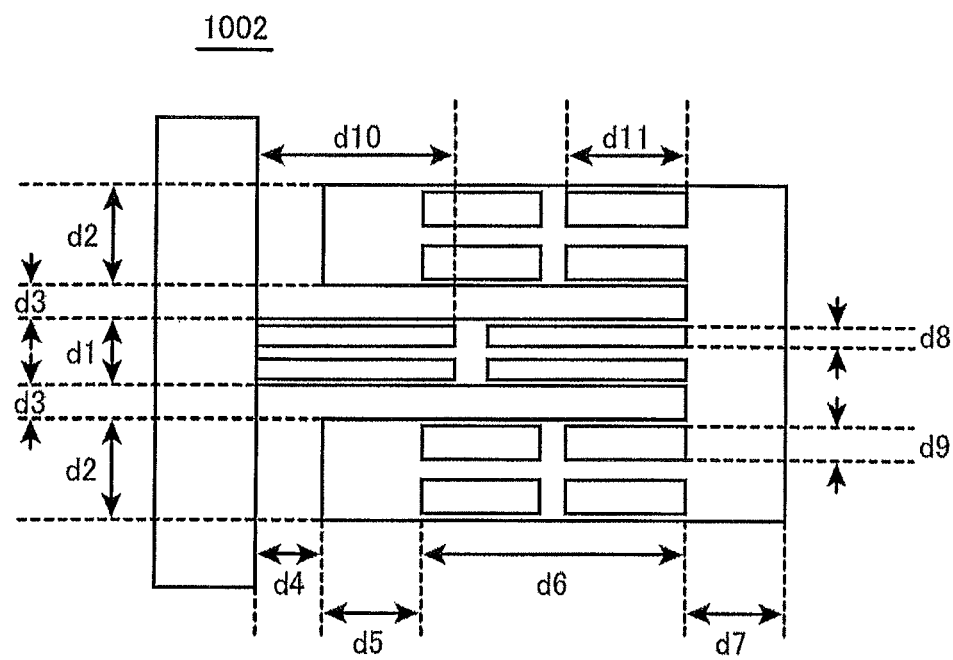
FIGS. 16A and 16B each cover a drawing which shows dimensions of individual portions of the power generating element 1002 shown in FIG. 15.
Figure 16B:
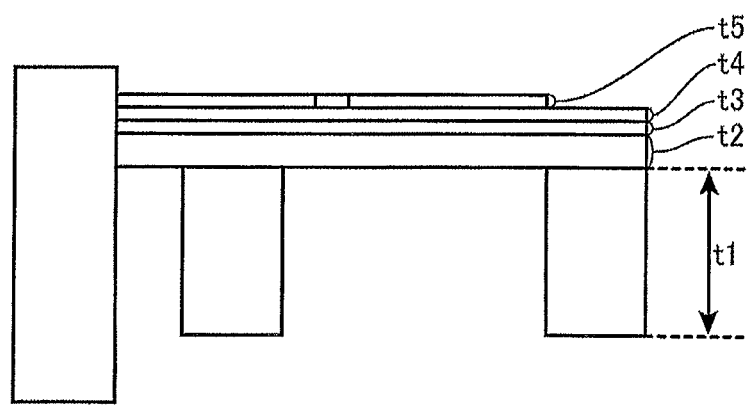

FIGS. 16A and 16B are reference drawings for indicating dimensions of individual portions of the power generating element 1002 shown in FIG. 15. FIG. 16A is a top view and FIG. 16B is a side elevational view. The dimensions of individual portions shown in FIG. 16A are as follows: d1=0.5 mm, d2=0.8 mm, d3=0.2 mm, d4=0.3 mm, d5=0.5 mm, d6=1.0 mm, d7=0.3 mm, d8=0.2 mm, d9=0.3 mm, d10=1.0 mm and d11=0.4 mm. On the other hand, the dimensions of individual portions shown in FIG. 16B are as follows: t1=525 μm, t2=15 μm, t3=0.05 μm, t4=2 μm and t5=0.05 μm. Of course, these dimensional values are shown as an example on the basis of actual dimensions of the power generating element 1002 according to an example of the present invention. Therefore, the present invention shall not be in any way limited by these dimensional values.

The piezoelectric material layer 420 is likely to polarize in the thickness direction by application of stress which expands and contracts in the layer direction. Specifically, the piezoelectric material layer 420 can be constituted with a piezoelectric thin film, for example, PZT (lead zirconate titanate) and KNN (potassium sodium niobate). Alternatively, a bulk-type piezoelectric element may be used. Each of the electrode layers 410, 430 may be constituted with any material, as long as it is an electrically conductive material. However, the electrode layers may be practically constituted with a metal layer such as gold, platinum, aluminum or copper.

Where the above-described piezoelectric element is used as the charge generating element 400, a silicon substrate is optimally used as the main substrate 110. This is because in general, a case that an existing production process is employed to form a piezoelectric element on an upper surface of a metal substrate is compared with a case that it is employed to form a piezoelectric element on an upper surface of a silicon substrate, thereby revealing that a piezoelectric constant of the latter is about three times greater than that of the former and the latter is much higher in power generation efficiency. This may be due to the fact that formation of a piezoelectric element on the upper surface of a silicon substrate results in uniform orientation of crystallization of the piezoelectric element.

When external vibration is applied to the pedestal 310, stress is imparted to each portion of the piezoelectric material layer 420 by deflection of the main substrate 110. As a result, the piezoelectric material layer 420 will polarize in the thickness direction, thereby generating charge on the upper electrode layer 430 and the lower electrode layer 410. In other words, the piezoelectric element 400 performs a function to supply charge of predetermined polarity to each of the lower electrode layer 410 and the upper electrode layer 430 on the basis of external vibration. Although not illustrated in the drawing, wiring is provided between each electrode layer and the power generating circuit 500, and charge generated by the piezoelectric element 400 is taken out by the power generating circuit 500 as electric power.

Figure 17:
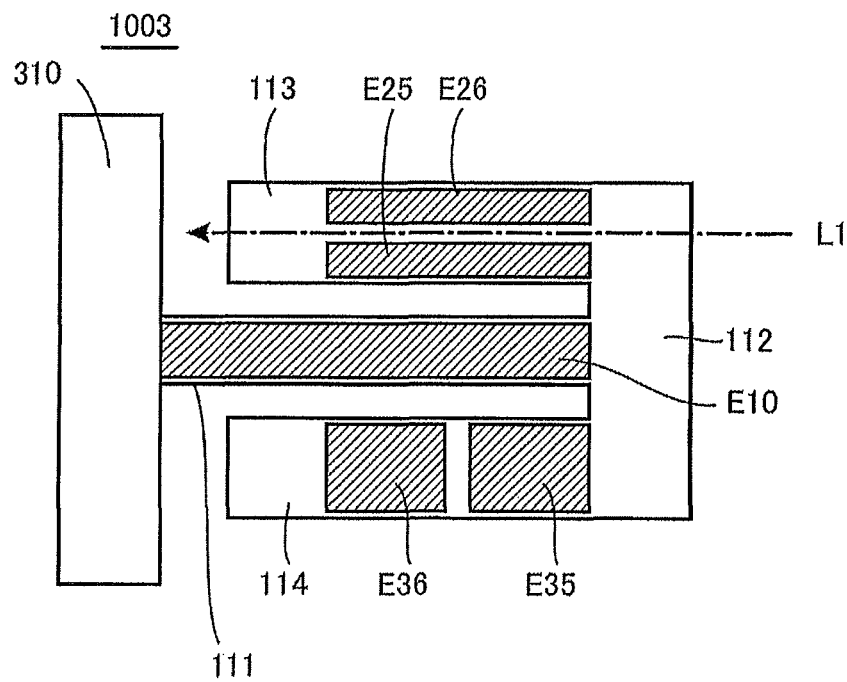
FIG. 17 is a top view which shows a power generating element 1003 according to still another modification example of the power generating element 1000 shown in FIG. 3 (a power generating circuit 500 is not illustrated in the drawing, and hatching is given for clearly indicating a configuration pattern of each of discrete upper electrode layers E10, E25 to E36 which constitute the charge generating element 400 and not for indicating a cross section).

Of course, a shape and an arrangement of the discrete upper electrode layers formed on the plate-like structure bodies 111, 113, 114 are not necessarily limited to those of the example shown in the top view of FIG. 15(*a*). For example, FIG. 17 is a top view of a power generating element 1003 according to still another modification example of the power generating element 1000 shown in FIG. 3 (the power generating circuit 500 is not illustrated in the drawing). In this top view as well, hatching is given for clearly indicating a configuration pattern of each of the discrete upper electrode layers which constitute the charge generating element 400 and not for indicating a cross section.

In the case of the example shown in FIG. 17, a single discrete upper electrode layer E10 is formed substantially in an entire domain on the upper surface of the central plate-like structure body 111. On the upper surface of the negative side plate-like structure body 113, discrete upper electrode layers E25, E26 are formed respectively on both sides of a longitudinal direction axis L1 passing through the center thereof. On the upper surface of the positive side plate-like structure body 114, a discrete upper electrode layer E35 and a discrete upper electrode layer E36 are formed respectively at the base end thereof and at the leading end thereof.

Of course, electric power can be generated by the power generating element 1003 which adopts, as an arrangement of discrete upper electrode layers, the arrangement of electrodes shown in FIG. 17. However, the power generating element 1002 which adopts the arrangement of electrodes shown in FIG. 15(*a*) is higher in power generation efficiency. This is because consideration is given so that in the arrangement of discrete upper electrode layers E11 to E34 shown in FIG. 15(*a*), charge of the same polarity is supplied from the piezoelectric material layers 420 to each of the discrete upper electrode layers E11 to E34 at the time point when each of the plate-like structure bodies 111, 113, 114 undergoes specific deformation.

Figure 18:
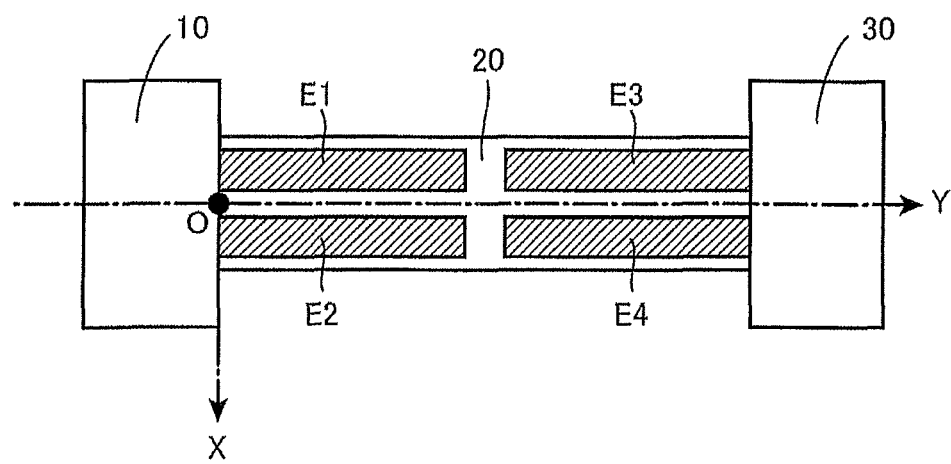
FIG. 18 is a top view which shows a preferred arrangement of discrete upper electrode layers E1 to E4 which constitute a charge generating element which is formed on an upper surface of a commonly-used plate-like structure body 20 (hatching is given for clearly indicating a configuration pattern of each of the discrete upper electrode layers E1 to E4 and not for indicating a cross section).

FIG. 18 is a top view which shows a preferable arrangement of discrete upper electrode layers in a commonly-used plate-like structure body 20, the left end of which is fixed to a pedestal 10. As illustrated in the drawing, a weight body 30 is connected to the right end of the plate-like structure body 20. Thus, the weight body 30 is supported in relation to the pedestal 10' by a cantilever beam structure using the plate-like structure body 20. Although not illustrated in the drawing, a lower electrode layer is in practice formed in an entire domain on the upper surface of the plate-like structure body 20, and a piezoelectric material layer is formed in an entire domain on the upper surface of the lower electrode layer. Four discrete upper electrode layers E1 to E4 which are illustrated in the drawing are formed on the upper surface of the piezoelectric material layer. Hatching in the drawing is given for clearly indicating a configuration pattern of each of the discrete upper electrode layers E1 to E4 and not for indicating a cross section.

The example of arrangement shown in FIG. 18 is characterized in that when the center axis extending in a direction parallel to the Y axis is defined at the center of the upper surface of the plate-like structure body 20, the discrete upper electrode layers E1 to E4 are arranged respectively on both sides of a base-end-side center axis and on both sides of a leading-end-side center axis. Specifically, in the example illustrated in the drawing, when the Y axis is taken as the center axis, the discrete upper electrode layers E1, E2 are arranged on both sides of the center axis on the base end side (on the left side in the drawing), and the discrete upper electrode layers E3, E4 are arranged on both sides of the center axis on the leading-end side (on the right side in the drawing).

In general, where the four discrete upper electrode layers E1 to E4 are arranged in the single plate-like structure body 20, charge of the same polarity is supplied from each piezoelectric material layer to each of the discrete upper electrode layers E1 to E4 at the time point when the plate-like structure body 20 undergoes specific deformation.

When, for example, in a state that the pedestal 10 is fixed, the weight body 30 is assumed to undergo vibration in the direction of the Z axis (in a direction perpendicular to the sheet surface in FIG. 18) in a primary resonance mode (refer to FIG. 8A), either stress in a contracting direction or stress in an expanding direction is applied at a certain moment to a domain on the base-end-side upper surface thereof at which the electrodes E1, E2 are arranged, while stress which is reverse thereto is applied to a domain on the leading-end-side upper surface thereof at which the electrodes E3, E4 are arranged. On the other hand, when the weight body 30 is assumed to undergo vibration in the direction of the Y axis in a primary resonance mode, either stress in the contracting direction or stress in the expanding direction is applied at a certain moment to an entire domain on the upper surface of the plate-like structure body 20. Further, when the weight body 30 is assumed to undergo vibration in the direction of the X axis in a primary resonance mode, either stress in the contracting direction or stress in the expanding direction is applied at a certain moment to a domain on the upper surface thereof at which the electrodes E1, E4 are arranged, while stress which is reverse thereto is applied to a domain on the upper surface thereof at which the electrodes E2, E3 are arranged.

Therefore, where vibration is assumed to occur at least in a primary resonance mode, irrespective of any direction at which the weight body 30 vibrates, charge of the same polarity is supplied to each of the discrete upper electrode layers E1 to E4 at a certain time point. For example, the polarity of charge supplied at a certain time point to the discrete upper electrode layer E1 is only one of positive polarity and negative polarity. There is found no such case that positive charge is supplied to a part of the discrete upper electrode layer E1 and negative charge is supplied to the other part thereof at the same time point. This is also true for the discrete upper electrode layers E2 to E4.

As described above, it is important in enhancing power generation efficiency that charge of the same polarity is reliably supplied to a single discrete upper electrode layer at a certain time point. For example, in the case of the example shown in FIG. 17, only the single upper electrode layer E10 is formed on the upper surface of the central plate-like structure body 111. In this constitution, where vibration is caused in the direction of the X axis or in the direction of the Z axis, charge of positive polarity and that of negative polarity are supplied simultaneously to the same upper electrode layer E10 at the same time point. That is, charge of certain polarity and charge of reverse polarity will be generated on the same conductive material, which cancel each other and disappear, thus resulting in loss of power generation. This is also true for constitutions of the upper electrode layers E25, E26 and those of the upper electrode layers E35, E36 shown in FIG. 17.

Due to the above-described reason, it is in practice preferable that, as shown in the example of FIG. 18, four sets of the discrete upper electrode layers E1 to E4, each of which is electrically independent, are formed on the single plate-like structure body 20. The arrangement of discrete upper electrode layers shown in FIG. 15(*a*) is such that the arrangement of four sets of the electrodes shown in FIG. 18 is adopted for all the plate-like structure bodies 111, 113, 114. That is, on the upper surface of the central plate-like structure body 111, with the Y axis given as the center axis, the electrode layers E11, E12 are arranged on both sides of the center axis on the base end side, and the electrode layers E13, E14 are arranged on both sides of the center axis on the leading end side. Further, on the upper surface of the negative side plate-like structure body 113, with the longitudinal direction axis L1 parallel to the Y axis given as the center axis, the electrode layers E21, E22 are arranged on both sides of the center axis on the base end side, and the electrode layers E23, E24 are arranged on both sides of the center axis on the leading end side. Similarly, on the upper surface of the positive side plate-like structure body 114, with a longitudinal direction axis L2 parallel to the Y axis given as the center axis, the electrode layers E31, E32 are arranged on both sides of the center axis on the base end side, and the electrode layers E33, 34 are arranged on both sides of the center axis on the leading end side.

In the example shown in FIG. 18, stress occurring on the plate-like structure body 20 tends to concentrate most heavily at a part immediately before a site connecting with a pedestal 10 or a weight body 30. Therefore, it is preferable that the left end of each of the upper electrode layers E1, E2 is extended up to a border position with the pedestal 10 and it is also preferable that the right end of each of the upper electrode layers E3, E4 is extended up to a border position with the weight body 30. Each of the discrete upper electrode layers shown in FIG. 15(*a*) also adopts such a constitution that the end thereof is extended up to a border position.

Charge of the same polarity is to be supplied without fail at a certain time point to each of four sets of the upper electrode layers E1 to E4 shown in FIG. 18. However, charge taken out from each of the upper electrode layers is constantly changed in polarity from moment to moment. This is because upon vibration of the plate-like structure body 20, stress applied to each part of the piezoelectric material layer is changed in direction (stress in the contracting direction or stress in the expanding direction) and charge generated is changed in polarity accordingly. Therefore, in the power generating element 1002 shown in FIG. 15(*a*), in order to take out charge generated on each of 12 sets of the discrete upper electrode layers E11 to E34 and use it as electric power, it is necessary to rectify electric current produced on the basis of the thus generated charge by using the power generating circuit 500.

Figure 19:
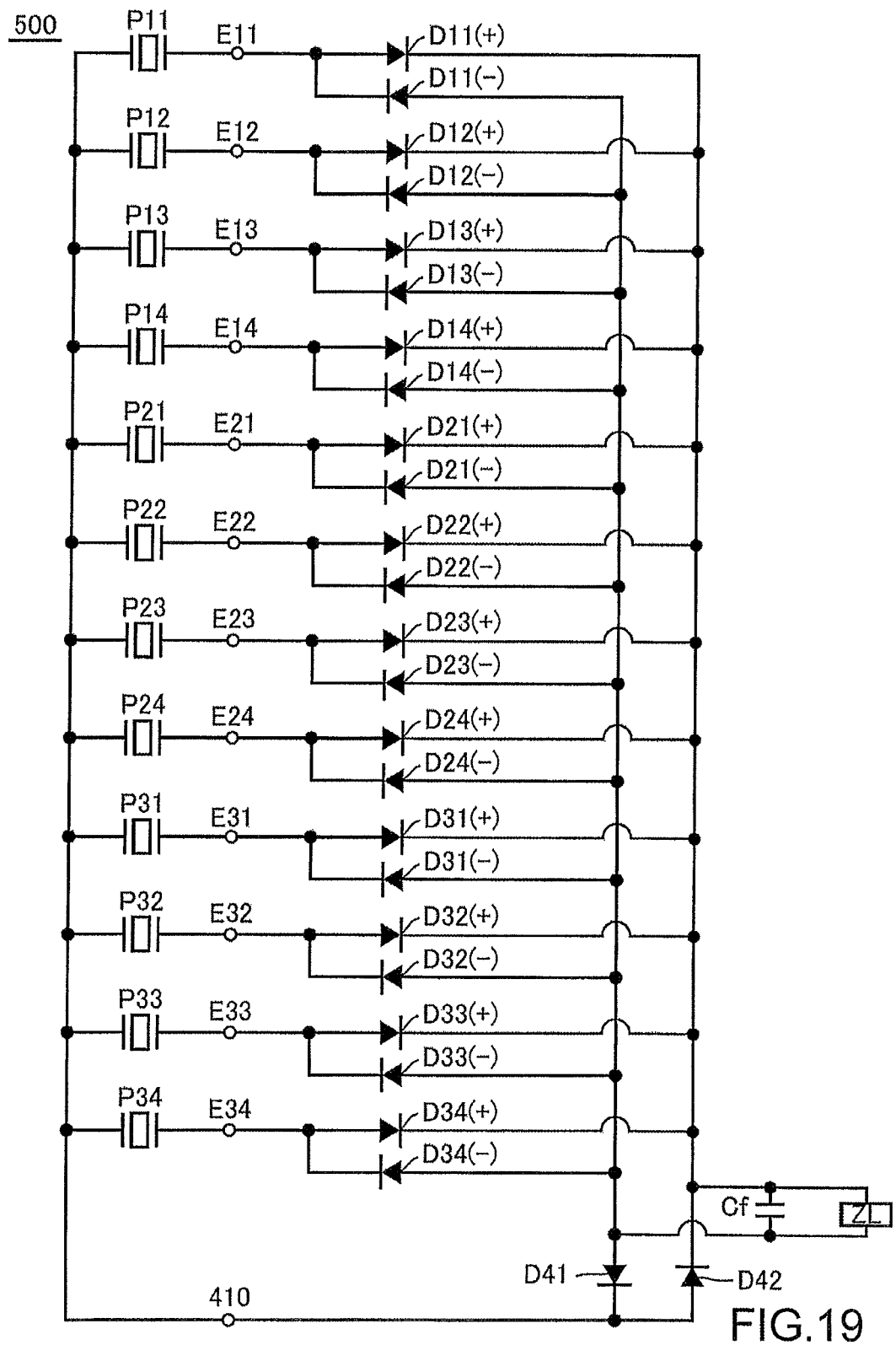
FIG. 19 is a circuit diagram which shows a concrete constitution of a power generating circuit 500 used in the power generating element 1002 shown in FIG. 15.

FIG. 19 is a circuit diagram which shows a concrete constitution of the power generating circuit 500 which performs a function to rectify electric current. In FIG. 19, P11 to P34 shown on the left side are some of the piezoelectric material layer 420 positioned below the respective discrete upper electrode layers E11 to E34 shown in FIG. 15(*a*). Then, the lines given on the left side of P11 to P34 correspond to the common lower electrode layer 410, and the lines given on the right side of the P11 to P34 correspond respectively to the discrete upper electrode layers E11 to E34.

In the circuit diagram, D11 (+) to D34 (+) are rectifying elements (diodes), each of which plays a role of taking out positive charge generated on the discrete upper electrode layers E11 to E34. Further, D11 (−) to D34 (−) are also rectifying elements (diodes), each of which plays a role of taking out negative charge generated on the discrete upper electrode layers E11 to E34.

On the other hand, Cf denotes a smoothing capacitative element (condenser) in which taken-out positive charge is supplied to a positive electrode terminal thereof (an upper terminal in the drawing) and taken-out negative charge is supplied to a negative electrode terminal thereof (a lower terminal in the drawing). The capacitative element Cf plays a role of smoothing a pulsating current on the basis of generated charge. At a stationary time when the weight body is stable in vibration, impedance of the capacitative element Cf can be substantially disregarded. ZL which is connected in parallel to the capacitative element Cf denotes load of equipment to which electric power generated by the power generating element 1002 is supplied. Further, D41, D42 which face in a reverse direction to each other as rectifying elements (diodes) are connected between both electrode terminals of the capacitative element Cf and the lower electrode layer 410.

Resultingly, the power generating circuit 500 is provided with the capacitative element Cf, the rectifying elements for positive charge D11 (+) to D34 (+) in which a direction from each of the discrete upper electrode layers E11 to E34 to a positive electrode side of the capacitative element Cf is given as a forward direction in order to guide positive charge generated at each of the discrete upper electrode layers E11 to E34 to the positive electrode side of the capacitative element Cf, and the rectifying elements for negative charge D11 (−) to D34 (−) in which a direction from a negative electrode side of the capacitative element Cf to each of the discrete upper electrode layers E11 to E34 is given as a forward direction in order to guide negative charge generated at each of the discrete upper electrode layers E11 to E34 to the negative electrode side of the capacitative element Cf, thereby performing a function to smooth electric energy converted from vibration energy by the capacitative element Cf and supply the energy to the load ZL.

In the circuit diagram, positive charge taken out by the rectifying elements for positive charge D11 (+) to D34 (+) and negative charge taken out by the rectifying elements for negative charge D11 (−) to D34 (−) are supplied to the load ZL, therefore, in principle, a total amount of positive charge generated at the discrete upper electrode layers E11 to E34 could be made equal to that of negative charge thereof at individual moments, thus making it possible to generate electric power at the highest efficiency.

Therefore, it is in practice preferable that, as shown in FIG. 4(*a*), the basic structure portion of the power generating element 1002 is symmetrically structured to give plane symmetry in relation to the YZ plane. Further, it is preferable that the electrode layers E11 to E14 formed on the upper surface of the central plate-like structure body 111 are symmetrically structured to give plane symmetry in relation to the YZ plane. It is preferable that the electrode layers E21 to E24 formed on the upper surface of the negative side plate-like structure body 113 are symmetrically structured to give plane symmetry in relation to a plane which includes the longitudinal direction axis L1 and is parallel to the Z axis. It is also preferable that the electrode layers E31 to E34 formed on the upper surface of the positive side plate-like structure body 114 are symmetrically structured to give plane symmetry in relation to a plane which includes the longitudinal direction axis L2 and is parallel to the Z axis.

Chapter 6. Example Which Houses Basic Structure Portion in Device Case

Figure 20:
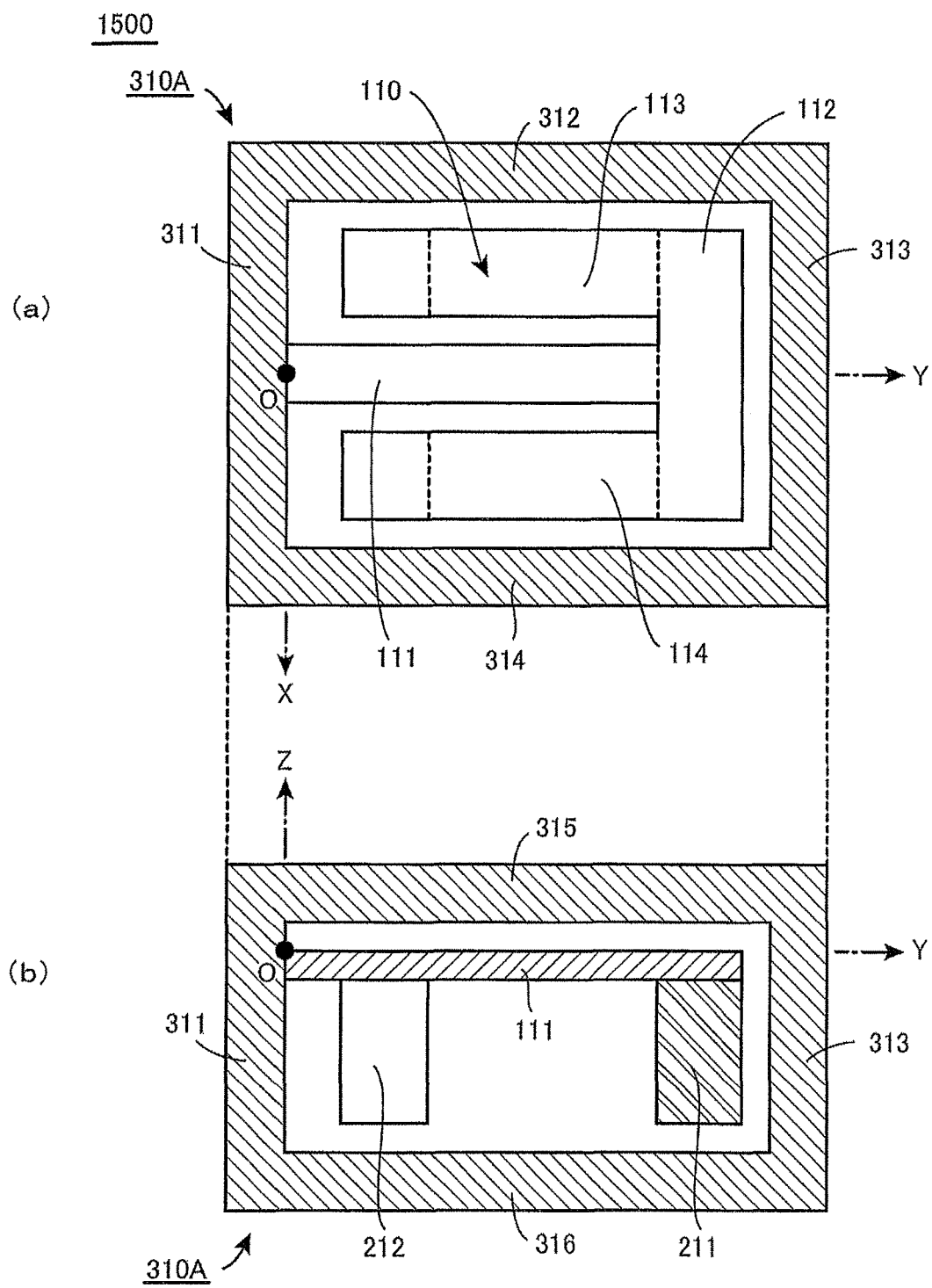
FIG. 20(a) is a plane sectional view which shows a device case-equipped power generating element 1500 which is formed so as to house the power generating element 1000 shown in FIG. 3 into a device case 310A (a sectional view in which the power generating element is cut along a plane parallel to the XY plane and positioned slightly above the XY plane).
FIG. 20(b) is a side sectional view in which it is cut along the YZ plane (neither a charge generating element 400 nor a power generating circuit 500 is illustrated in the drawing).

Here, a description will be given of an example which houses a power generating element in a device case. FIG. 20(*a*) is a plane sectional view of a device case-equipped power generating element 1500 having a mode in which the power generating element 1000 shown in FIG. 3 is housed in a device case 310A. FIG. 20(*b*) is a side sectional view thereof.

The device case 310A illustrated in the drawing is a structure body in the shape of a rectangular solid suitable for housing the basic structure portion of the power generating element 1000 shown in FIG. 3. The device case is provided with side plates 311 to 314 shown in the plane sectional view of FIG. 20(*a*), a top plate 315 and a bottom plate 316 shown in the side sectional view of FIG. 20(*b*). FIG. 20(*a*) is a sectional view in which the power generating element 1500 is cut along a plane which is parallel to the XY plane and positioned slightly above the XY plane. FIG. 20(*b*) is a sectional view in which the power generating element 1500 is cut along the YZ plane. In practice, a charge generating element 400 such as a piezoelectric element is installed on an upper surface of a main substrate 110, and a power generating circuit 500 for taking out charge generated as electric power is also installed at a certain place. However, in FIG. 20, the charge generating element 400 or the power generating circuit 500 is not illustrated in the drawing.

In the case of this example, the pedestal 310 shown in FIG. 3 is incorporated as a part of the device case 310A, and the side plate 311 illustrated in the drawing performs a function as the pedestal 310 shown in FIG. 3. Of course, it is also acceptable that the pedestal 310 is kept separate from the device case 310A, the basic structure portion shown in FIG. 3 is completely housed inside the device case 310A and the pedestal 310 is fixed into the device case 310A (for example, the bottom of the pedestal 310 may be joined with the upper surface of the bottom plate 316).

As illustrated in the drawing, a predetermined space is secured between the inner surface of the device case 310A and the outer surface of each of plate-like structure bodies 111, 113, 114 and the outer surface of each of weight bodies 211, 212, 213. Where magnitude of external vibration applied to the device case 310A is lower than a predetermined reference level, in response to the thus applied external vibration, each of the plate-like structure bodies 111, 113, 114 and each of the weight bodies 211, 212, 213 undergo vibration inside the secured space, thereby generating electric power. However, where magnitude of external vibration applied to the device case 310A is in excess of the reference level, in response to the thus applied external vibration, a certain site of each of the plate-like structure bodies 111, 113, 114 and that of each of the weight bodies 211, 212, 213 (depending on the case, the charge generating element 400 formed on the upper surface of the main substrate 110) comes into contact with the inner surface of the device case 310A, thereby restricting further displacement.

Of course, in view of enhancing power generation efficiency, each of the plate-like structure bodies 111, 113, 114 and each of the weight bodies 211, 212, 213 should not be controlled for displacement. In general, great displacement will result in great deflection of the plate-like structure bodies, and the charge generating element 400 such as a piezoelectric element is able to generate greater charge. However, where the plate-like structure bodies are subjected to excessive displacement over an elastic limit, they may be broken, resulting in a failure of functioning as the power generating element. Thus, in practice, it is preferable that a clearance dimension between the inner surface of the device case 310A and the outer surface of each of the plate-like structure bodies and that of each of the weight bodies is set to a predetermined reference value so as not to cause excessive displacement which may break the plate-like structure bodies and, upon application of external vibration in excess of the reference level, the plate-like structure bodies and the weight bodies come into contact with the inner surface of the device case 310A, thereby preventing further displacement.

Chapter 7. Second Embodiment to Eighth Embodiment 7.1 Difference from First Embodiment Next, an individual description will be given of a Second Embodiment to Eighth Embodiment as modification examples of the First Embodiment described above. These embodiments are modified in mode of the basic structure portion of the power generating element 1000 according to the First Embodiment, in particular, modified in the number of plate-like structure bodies and a mutual connection relationship. Each of the embodiments will be shown as an example in which the plate-like structure bodies are housed in a device case as described in Chapter 6.

Basic motions of the power generating element according to each of the Second Embodiment to Eighth Embodiment are substantially similar to motions of the power generating element according to the First Embodiment described above. Therefore, a detailed description of motions of individual embodiments will be omitted.

FIG. 21 to FIG. 28 and FIG. 31 which will be referred to in the following description are plane sectional views in which the power generating element according to each of the Second Embodiment to Eighth Embodiment is cut along a plane which is parallel to the XY plane and positioned slightly above the XY plane, and a power generating circuit 500 is not illustrated in each of the drawings. Further, there is shown an example of each of the plate-like structure bodies in which a piezoelectric element which adopts an arrangement of four sets of electrodes shown in FIG. 18 is used as a charge generating element 400 (with some exceptions found). In the above-described drawings, diagonal-lined rough hatching given to parts of the device case (including a part functioning as the pedestal) is for indicating that the parts concerned are a cross section part. On the other hand, diagonal-lined fine hatching given to parts of the main substrate (the plate-like structure bodies and individual connectors thereof) is for indicating a domain formed by each of discrete upper electrode layers. Dot hatching is given for indicating a domain at which each of the weight bodies is joined with the lower surface of the main substrate and not for indicating a cross section.

Further, in the following description as well, when the XY plane is taken on a horizontal plane and at a space partitioned by the YZ plane, the space having a positive X coordinate value is defined as a positive-side space, and the space having a negative X coordinate value is defined as a negative-side space. The plate-like structure body which is arranged on the YZ plane is referred to as a central plate-like structure body, the plate-like structure body arranged on the positive-side space is referred to as a positive side plate-like structure body, and the plate-like structure body arranged on the negative-side space is referred to as a negative side plate-like structure body.

7.2. Second Embodiment

Figure 21:
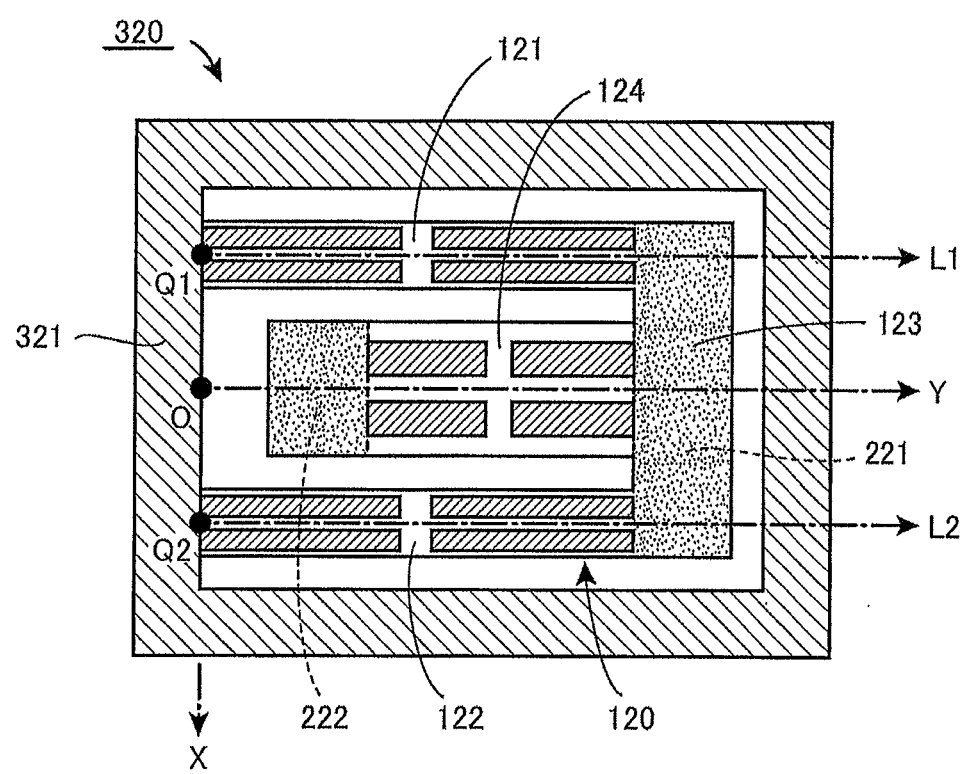
FIG. 21 is a plane sectional view which shows a device case-equipped power generating element 2000 according to a Second Embodiment of the present invention (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).

FIG. 21 is a plane sectional view of a device case-equipped power generating element 2000 according to the Second Embodiment of the present invention. In the case of this example, a main substrate 120, the planar shape of which is formed in an E letter shape, is constituted with a negative side plate-like structure body 121 and a positive side plate-like structure body 122 each having a first attribute, a connector between different attributes 123, and a central plate-like structure body 124 having a second attribute. The connector between different attributes 123 plays a role of connecting the negative side plate-like structure body 121 and the positive side plate-like structure body 122 each having the first attribute with the central plate-like structure body 124 having the second attribute. A basic structure portion is constituted with the main substrate 120, a pedestal 321 which is incorporated as a part of a side plate into a device case 320 and two sets of weight bodies 221, 222. Then, the pedestal 321 plays a role of supporting the negative side plate-like structure body 121 and the positive side plate-like structure body 122 at base end points Q1 and Q2.

Here, the negative side plate-like structure body 121 is arranged at the negative-side space, the base end thereof is connected to the base end point Q1 of the pedestal 321 and the leading end thereof is connected to the connector between different attributes 123. The negative side plate-like structure body 121 is a plate-like structure body having the first attribute which extends in a direction parallel to the Y axis (in a direction of longitudinal direction axis L1) so that a direction from the base end to the leading end is given in the positive direction of the Y axis. Further, the positive side plate-like structure body 122 is arranged at the positive-side space, the base end thereof is connected to the base end point Q2 of the pedestal and the leading end thereof is connected to the connector between different attributes 123. The positive side plate-like structure body 122 is a plate-like structure body having the first attribute which extends in a direction parallel to the Y axis (in a direction of longitudinal direction axis L2) so that a direction from the base end to the leading end is given in the positive direction of the Y axis.

On the other hand, the central plate-like structure body 124 is arranged on the YZ plane and the base end thereof is connected to the connector between different attributes 123. The central plate-like structure body 124 is a plate-like structure body having the second attribute which extends in a direction parallel to the Y axis so that a direction from the base end to the leading end is given in the negative direction of the Y axis. Then, the first weight body 221 is a weight body which is connected to the lower surface of the connector between different attributes 123 (a domain indicated by dot hatching given in the drawing), and the second weight body 222 is a weight body which is connected to a domain on the leading-end lower surface of the central plate-like structure body 124 (a domain indicated by dot hatching given in the drawing).

In the First Embodiment shown in FIG. 3, only one set of the central plate-like structure body 111 is installed as a plate-like structure body having the first attribute, and two sets of the negative side plate-like structure body 113 and the positive side plate-like structure body 114 are installed as plate-like structure bodies having the second attribute. In the Second Embodiment shown in FIG. 21, in contrast, two sets of the negative side plate-like structure body 121 and the positive side plate-like structure body 122 are installed as plate-like structure bodies having the first attribute, and only one set of the central plate-like structure body 124 is installed as a plate-like structure body having the second attribute.

Both of the above-described embodiments are similar in that a total of three plate-like structure bodies are provided and a total of 12 discrete upper electrode layers are used to take out electric power. In the case of the Second Embodiment shown in FIG. 21, the main substrate 120 is connected with the pedestal 321 at two sites of the base end points Q1, Q2. Therefore, wiring between the power generating circuit 500 (not illustrated in the drawing) installed on the device case 320 and each of the discrete upper electrode layers can be given in the vicinity of the base end point Q1 and also in the vicinity of the base end point Q2, by which such an advantage is obtained that wiring can be given easily.

7-3. Third Embodiment

Figure 22:
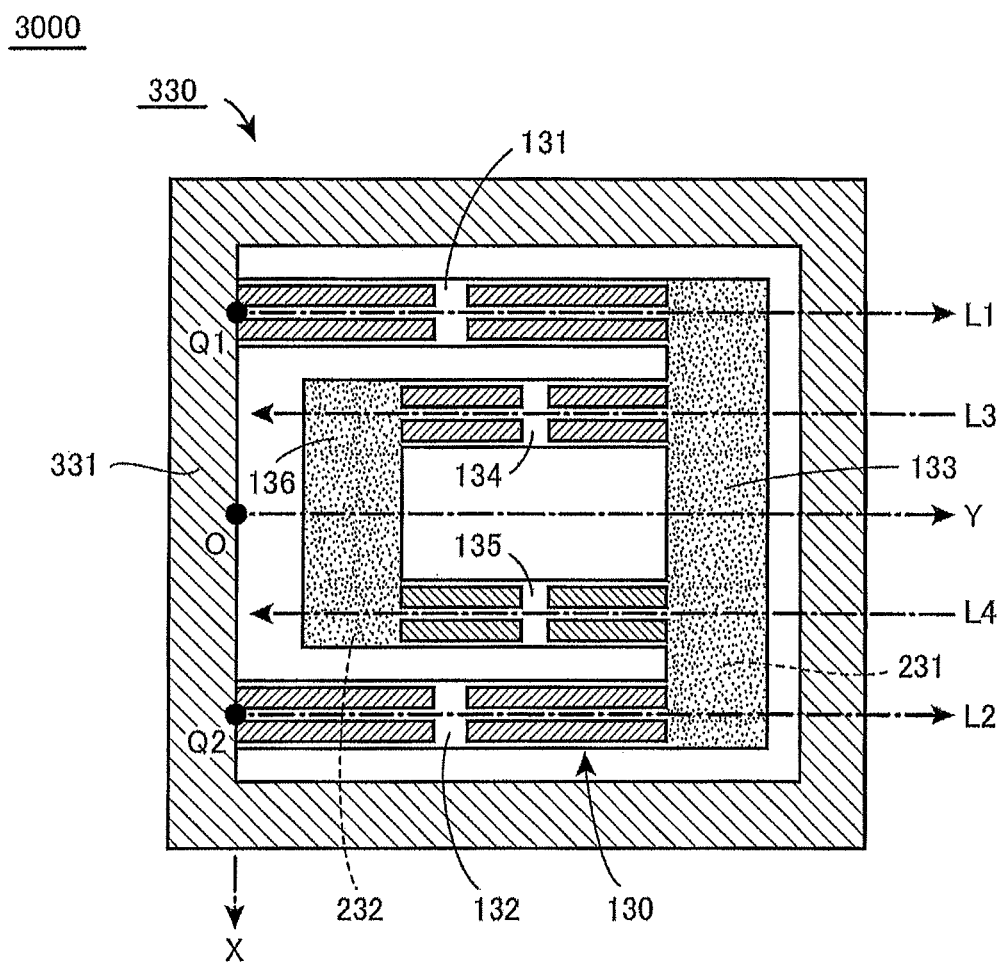
FIG. 22 is a plane sectional view which shows a device case-equipped power generating element 3000 according to a Third Embodiment of the present invention (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).

FIG. 22 is a plane sectional view of a device case-equipped power generating element 3000 according to a Third Embodiment of the present invention. In the case of this example, a main substrate 130 is constituted with a first negative side plate-like structure body 131 and a first positive side plate-like structure body 132 each having a first attribute, a connector between different attributes 133, a second negative side plate-like structure body 134 and a second positive side plate-like structure body 135 each having a second attribute, and an extreme end connector 136. The connector between different attributes 133 plays a role of connecting the first negative side plate-like structure body 131 and the first positive side plate-like structure body 132 each having the first attribute with the second negative side plate-like structure body 134 and the second positive side plate-like structure body 135 each having the second attribute. Further, the extreme end connector 136 is a member which is connected to both the leading end of the second negative side plate-like structure body 134 and the leading end of the second positive side plate-like structure body 135.

A basic structure portion is constituted with the main substrate 130, a pedestal 331 which is incorporated as a part of a side plate into a device case 330 and two sets of weight bodies 231, 232. Then, the pedestal 331 plays a role of supporting the first negative side plate-like structure body 131 and the first positive side plate-like structure body 132 at base end points Q1 and Q2.

Here, the first negative side plate-like structure body 131 is arranged at the negative-side space, the base end thereof is connected to the base end point. Q1 of the pedestal 331 and the leading end thereof is connected to the connector between different attributes 133. The first negative side plate-like structure body 131 is a plate-like structure body having the first attribute which extends in a direction parallel to the Y axis (a direction of longitudinal direction axis L1) so that a direction from the base end to the leading end is given in the positive direction of the Y axis. Further, the first positive side plate-like structure body 132 is arranged at the positive-side space, the base end thereof is connected to the base end point Q2 of the pedestal and the leading end thereof is connected to the connector between different attributes 133. The first positive side plate-like structure body 132 is a plate-like structure body having the first attribute which extends in a direction parallel to the Y axis (a direction of longitudinal direction axis L2) so that a direction from the base end to the leading end is given in the positive direction of the Y axis.

On the other hand, the second negative side plate-like structure body 134 is arranged at the negative-side space, the base end is connected to the connector between different attributes 133 and the leading end thereof is connected to the extreme end connector 136. The second negative side plate-like structure body 134 is a plate-like structure body having the second attribute which extends in a direction parallel to the Y axis (a direction of longitudinal direction axis L3) so that a direction from the base end to the leading end is given in the negative direction of the Y axis. Further, the second positive side plate-like structure body 135 is arranged at the positive-side space, the base end thereof is connected to the connector between different attributes 133 and the leading end thereof is connected to the extreme end connector 136. The second positive side plate-like structure body 135 is a plate-like structure body having the second attribute which extends in a direction parallel to the Y axis (a direction of longitudinal direction axis L4) so that a direction from the base end to the leading end is given in the negative direction of the Y axis.

Then, the first weight body 231 is a weight body which is connected to the lower surface of the connector between different attributes 133 (a domain indicated by dot hatching given in the drawing), and the second weight body 232 is a weight body which is connected to the lower surface of the extreme end connector 136 (a domain indicated by dot hatching given in the drawing).

In the Second Embodiment shown in FIG. 21, only one set of the central plate-like structure body 124 is installed as a plate-like structure body having the second attribute. In the Third Embodiment shown in FIG. 22, two sets of the second negative side plate-like structure body 134 and the second positive side plate-like structure body 135 are installed as a plate-like structure body having the second attribute. Therefore, the number of the plate-like structure bodies is increased up to four sets, and a total of 16 discrete upper electrode layers are used to take out electric power. Although the width in the direction of the X axis is accordingly increased to some extent, it is possible to generate electric power in a greater amount. Of course, in the case of the Third Embodiment as well, the main substrate 130 is connected to the pedestal 331 at two sites of the base end points Q1, Q2, by which such an advantage is obtained that wiring can be given easily to a power generating circuit 500 which is not illustrated in the drawing.

It is also possible to provide such a constitution that is free of the extreme end connector 136. In this case, the second weight body is connected to the leading-end lower surface of the second negative side plate-like structure body 134, a third weight body is connected to the leading-end lower surface of the second positive side plate-like structure body 135. And, a total of three sets of the weight bodies may be installed separately, together with the first weight body 231 connected to the lower surface of the connector between different attributes 133.

7-4. Fourth Embodiment

Figure 23:
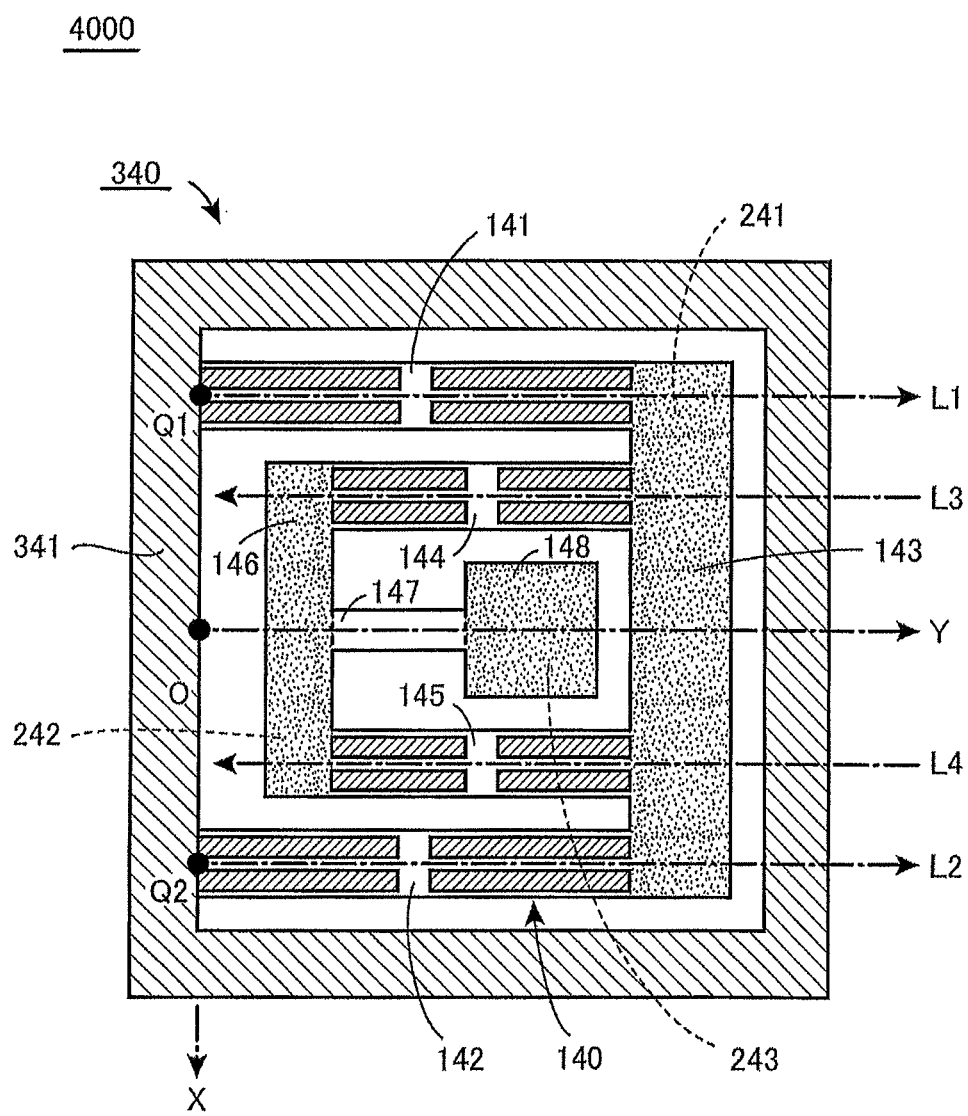
FIG. 23 is a plane sectional view which shows a device case-equipped power generating element 4000 according to a Fourth Embodiment of the present invention (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).

FIG. 23 is a plane sectional view of a device case-equipped power generating element 4000 according to a Fourth Embodiment of the present invention. The power generating element 3000 shown in FIG. 22 is fundamentally different from the power generating element 4000 shown in FIG. 23 in that a central plate-like structure body 147 and an extreme end connector 148 are added to the latter. The central plate-like structure body 147 is a plate-like structure body having a third attribute which is not found in the individual embodiments described above. The Fourth Embodiment is characterized in that the plate-like structure body having the third attribute is added to a plate-like structure body having a first attribute and a plate-like structure body having a second attribute, and this is important.

In the case of this example, a main substrate 140 is constituted with a first negative side plate-like structure body 141 and a first positive side plate-like structure body 142 each having the first attribute, a first connector between different attributes 143, a second negative side plate-like structure body 144 and a second positive side plate-like structure body 145 each having the second attribute, a second connector between different attributes 146, the central plate-like structure body 147 having the third attribute, and the extreme end connector 148. The extreme end connector 148 is a member which is connected to the leading end of the central plate-like structure body 147. Here, the first connector between different attributes 143 plays a role of connecting the first negative side plate-like structure body 141 and the first positive side plate-like structure body 142 each having the first attribute with the second negative side plate-like structure body 144 and the second positive side plate-like structure body 145 each having the second attribute. Further, the second connector between different attributes 146 plays a role of connecting the second negative side plate-like structure body 144 and the second positive side plate-like structure body 145 each having the second attribute with the central plate-like structure body 147 having the third attribute.

In other words, the first connector between different attributes 143 connects mutually the plate-like structure bodies having the first attribute with the plate-like structure bodies having the second attribute, thereby playing a role of a first return point of the plate-like structure bodies. Similarly, the second connector between different attributes 146 connects mutually the plate-like structure bodies having the second attribute with the plate-like structure body having the third attribute, thereby playing a role of a second return point of the plate-like structure bodies. As described above, in the Fourth Embodiment, the plate-like structure bodies are returned at the first return point and also returned at the second return point.

The basic structure portion is constituted with the main substrate 140, a pedestal 341 which is incorporated as a part of a side plate into a device case 340 and three sets of weight bodies 241, 242, 243. Then, the pedestal 341 plays a role of supporting the first negative side plate-like structure body 141 and the first positive side plate-like structure body 142 at base end points Q1, Q2.

Here, the first negative side plate-like structure body 141 is arranged at the negative-side space, the base end thereof is connected to the base end point Q1 of the pedestal 341 and the leading end thereof is connected to the first connector between different attributes 143. The first negative side plate-like structure body 141 is a plate-like structure body having the first attribute which extends in a direction parallel to the Y axis (a direction of longitudinal direction axis L1) so that a direction from the base end to the leading end is given in the positive direction of the Y axis. Further, the first positive side plate-like structure body 142 is arranged at the positive-side space, the base end thereof is connected to the base end point Q2 of the pedestal, and leading end thereof is connected to the first connector between different attributes 143. The first positive side plate-like structure body 142 is a plate-like structure body having the first attribute which extends in a direction parallel to the Y axis (a direction of longitudinal direction axis L2) so that a direction from the base end to the leading end is given in the positive direction of the Y axis.

On the other hand, the second negative side plate-like structure body 144 is arranged at the negative-side space, the base end thereof is connected to the first connector between different attributes 143, and the leading end thereof is connected to the second connector between different attributes 146. The second negative side plate-like structure body 144 is a plate-like structure body having the second attribute which extends in a direction parallel to the Y axis (a direction of longitudinal direction axis L3) so that a direction from the base end to the leading end is given in the negative direction of the Y axis. Further, the second positive side plate-like structure body 145 is arranged at the positive-side space, the base end thereof is connected to the first connector between different attributes 143 and the leading end thereof is connected to the second connector between different attributes 146. The second positive side plate-like structure body 145 is a plate-like structure body having the second attribute which extends in a direction parallel to the Y axis (a direction of longitudinal direction axis L4) so that a direction from the base end to the leading end is given in the negative direction of the Y axis.

Then, the central plate-like structure body 147 is arranged on the YZ plane, the base end thereof is connected to the second connector between different attributes 146. The central plate-like structure body 147 is a plate-like structure body having the third attribute which extends in a direction parallel to the Y axis so that a direction from the base end to the leading end is given in the positive direction of the Y axis. The extreme end connector 148 is a member which is connected to the leading end of the central plate-like structure body 147.

Further, the first weight body 241 is a weight body connected to the lower surface of the first connector between different attributes 143 (a domain indicated by dot hatching given in the drawing). The second weight body 242 is a weight body connected to the lower surface of the second connector between different attributes 146 (a domain indicated by dot hatching given in the drawing). The third weight body 243 is a weight body which is connected to the lower surface of the extreme end connector 148 (a domain indicated by dot hatching given in the drawing).

In the Fourth Embodiment, as with the above-described Third Embodiment, a total of 16 sets of discrete upper electrode layers are used to take out electric power. Further, the main substrate 140 is connected with the pedestal 341 at two sites of base end points Q1, Q2, by which such an advantage is obtained that wiring can be given easily to a power generating circuit 500 which is not illustrated in the drawing. Further, in the basic structure portion of the Fourth Embodiment, a more complicated combined vibration system is constituted which includes a first resonance system on the basis of vibration of the plate-like structure bodies having the first attribute, a second resonance system on the basis of vibration of the plate-like structure bodies having the second attribute and a third resonance system on the basis of vibration of the plate-like structure body having the third attribute.

It is also possible to provide such a constitution that is free of the extreme end connector 148. In this case, the third weight body may be connected to the leading-end-side lower surface of the central plate-like structure body 147. However, as illustrated in the drawing, there is provided the extreme end connector 148 which is greater in width than the central plate-like structure body 147 and the third weight body 243 is connected to the lower surface thereof, by which a weight body greater in mass can be formed as the third weight body 243 to cause greater vibration. Further, in the example illustrated in the drawing, no discrete upper electrode layer (piezoelectric element) is installed on the upper surface of the central plate-like structure body 147. In order to further enhance power generation efficiency, the discrete upper electrode layers (piezoelectric elements) may be installed also on the upper surface of the central plate-like structure body 147 to take out electric power.

7-5. Fifth Embodiment

Figure 24:
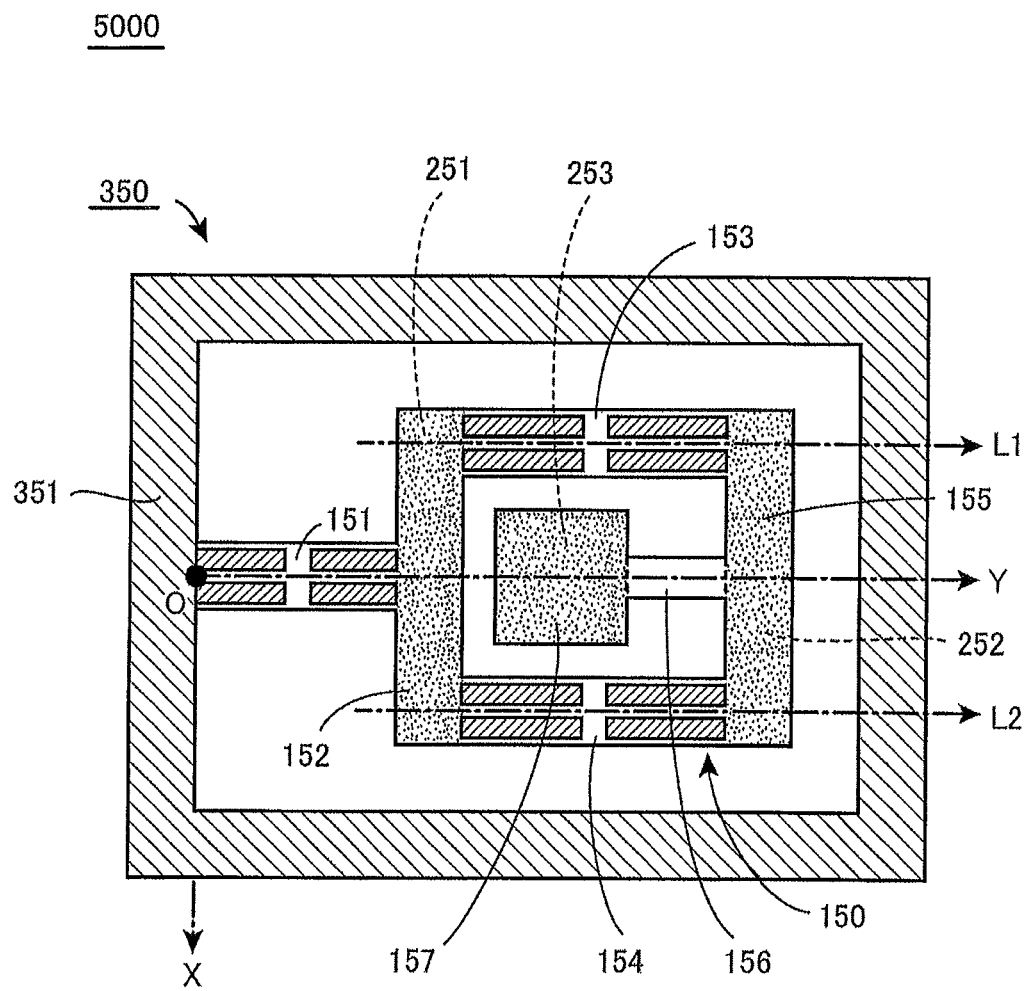
FIG. 24 is a plane sectional view which shows a device case-equipped power generating element 5000 according to a Fifth Embodiment of the present invention (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).

FIG. 24 is a plane sectional view of a device case-equipped power generating element 5000 according to the Fifth Embodiment of the present invention. The Fifth Embodiment is characterized in that plate-like structure bodies having the same attribute are arranged in series, which is important. In any of the embodiments described above, the plate-like structure bodies having the sane attribute are arranged in parallel and they are not arranged in series. Here, this point will be confirmed first.

First, in the case of the power generating element 1000 according to the First Embodiment shown in FIG. 3, the negative side plate-like structure body 113 and the positive side plate-like structure body 114 are installed as plate-like structure bodies having the second attribute. The base ends thereof are both connected to the connector between different attributes 112 and they are arranged in parallel. Further, in the case of the power generating element 2000 according to the Second Embodiment shown in FIG. 21, the negative side plate-like structure body 121 and the positive side plate-like structure body 122 are installed as a plate-like structure body having the first attribute. The base ends thereof are both connected to the pedestal 321 and they are arranged in parallel.

On the other hand, in the case of the power generating element 3000 according to the Third Embodiment shown in FIG. 22, the negative side plate-like structure body 131 and the positive side plate-like structure body 132 are installed as a plate-like structure body having the first attribute. The base ends thereof are both connected to the pedestal 331 and they are arranged in parallel. Further, the negative side plate-like structure body 134 and the positive side plate-like structure body 135 are installed as a plate-like structure body having the second attribute. The base ends thereof are both connected to the connector between different attributes 133 and they are arranged in parallel. This is also true for the power generating element 4000 according to the Fourth Embodiment shown in FIG. 23.

However, in the case of the power generating element 5000 according to the Fifth Embodiment shown in FIG. 24, a total of four sets of plate-like structure bodies are installed. More specifically, three sets of plate-like structure bodies 151, 153, 154 are each a plate-like structure body having a first attribute in which a direction from the base end to the leading end is given in the positive direction of the Y axis, and only a plate-like structure body 156 is a plate-like structure body having a second attribute in which a direction from the base end to the leading end is given in the negative direction of the Y axis. Here, as for the relationship between the plate-like structure bodies 153, 154, they are arranged in parallel, whereas, as for the relationship between the plate-like structure bodies 151, 153, they are arranged in series and, as for the relationship between the plate-like structure bodies 151, 154, they are also arranged in series. As a result, a member 152 plays a role of connecting the plate-like structure bodies having the same first attribute. Thus, here, this member 152 is referred to as a connector between the same attributes.

Therefore, in the case of this example, a main substrate 150 is constituted with the first central plate-like structure body 151 having the first attribute, the connector between the same attributes 152, the negative side plate-like structure body 153 and the positive side plate-like structure body 154 also each having the first attribute, a connector between different attributes 155, a second central plate-like structure body 156 having the second attribute and an extreme end connector 157. The extreme end connector 157 is a member which is connected to the leading end of the second central plate-like structure body 156.

Here, the connector between the same attributes 152 plays a role of connecting the first central plate-like structure body 151 having the first attribute with the negative side plate-like structure body 153 and the positive side plate-like structure body 154 also each having the first attribute. In contrast, the connector between different attributes 155 plays a role of connecting the negative side plate-like structure body 153 and the positive side plate-like structure body 154 each having the first attribute with the second central plate-like structure body 156 having the second attribute. As described above, the connector between different attributes 155 performs a function as a return point of the plate-like structure bodies by connecting mutually the plate-like structure bodies having the first attribute with the plate-like structure body having the second attribute, whereas the connector between the same attributes 152 performs a function as a relaying point for connecting in series the plate-like structure bodies having the first attribute.

A basic structure portion is constituted with the main substrate 150, a pedestal 351 which is incorporated as a part of a side plate into a device case 350 and three sets of weight bodies 251, 252, 253. The pedestal 351 plays a role of supporting the first central plate-like structure body 151 at the origin O.

Here, the first central plate-like structure body 151 is arranged on the YZ plane, the base end thereof is connected to the pedestal 351 and the leading end thereof is connected to the connector between the same attributes 152. The first central plate-like structure body 151 is a plate-like structure body having the first attribute which extends in a direction parallel to the Y axis so that a direction from the base end to the leading end is given in the positive direction of the Y axis. Further, the negative side plate-like structure body 153 is arranged at the negative-side space, the base end thereof is connected to the connector between the same attributes 152 and the leading end thereof is connected to the connector between different attributes 155. The negative side plate-like structure body 153 is a plate-like structure body having the first attribute which extends in a direction parallel to the Y axis (a direction of longitudinal direction axis L1) so that a direction from the base end to the leading end is given in the positive direction of the Y axis. Similarly, the positive side plate-like structure body 154 is arranged at the negative-side space, the base end thereof is connected to the connector between the same attributes 152 and the leading end thereof is connected to the connector between different attributes 155. The positive side plate-like structure body 154 is a plate-like structure body having the first attribute which extends in a direction parallel to the Y axis (a direction of longitudinal direction axis L2) so that a direction from the base end to the leading end is given in the positive direction of the Y axis.

On the other hand, the second central plate-like structure body 156 is arranged on the YZ plane, the base end thereof is connected to the connector between different attributes 155. The second central plate-like structure body 156 is a plate-like structure body having the second attribute which extends in a direction parallel to the Y axis so that a direction from the base end to the leading end is given in the negative direction of the Y axis. The extreme end connector 157 is a member which is connected to the leading end of the second central plate-like structure body 156.

Further, the first weight body 251 is a weight body which is connected to the lower surface of the connector between the same attributes 152 (a domain indicated by dot hatching given in the drawing), the second weight body 252 is a weight body which is connected to the lower surface of the connector between different attributes 155 (a domain indicated by dot hatching given in the drawing), and the third weight body 253 is a weight body which is connected to the lower surface of the extreme end connector 157 (a domain indicated by dot hatching given in the drawing).

The Fifth Embodiment includes the following three resonance systems. A first resonance system is such that vibration is caused on the basis of deflection of the first central plate-like structure body 151. In the drawing, the connector between the same attributes 152 and all the constituents connected on the right side perform a function as a weight of the first resonance system. A second resonance system is such that vibration is caused on the basis of deflection of the negative side plate-like structure body 153 and the positive side plate-like structure body 154. In the drawing, the connector between different attributes 155 and all the constituents connected to the central part thereof on the left side perform a function as a weight of the second resonance system. Then, a third resonance system is such that vibration is caused on the basis of deflection of the second central plate-like structure body 156, and a constituent connected to the leading end thereof performs a function as a weight of the third resonance system.

It is also possible to provide such a constitution that is free of the extreme end connector 157. In this case, the third weight body may be connected to the leading-end lower surface of the second central plate-like structure body 156. However, as illustrated in the drawing, there is provided the extreme end connector 157 greater in width than the second central plate-like structure body 156 and the third weight body 253 is connected to the lower surface thereof, thus making it possible to form a weight body greater in mass as the third weight body 253 and also cause greater vibration.

In the example illustrated in the drawing, no discrete upper electrode layer (piezoelectric element) is installed on the upper surface of the second central plate-like structure body 156. Therefore, in the Fifth Embodiment, a total of 12 sets of the discrete upper electrode layers are used to take out electric power. Of course, for further enhancement of power generation efficiency, the discrete upper electrode layers (piezoelectric elements) may be installed also on the upper surface of the second central plate-like structure body 156 to take out electric power.

7-6. Sixth Embodiment

Figure 25:
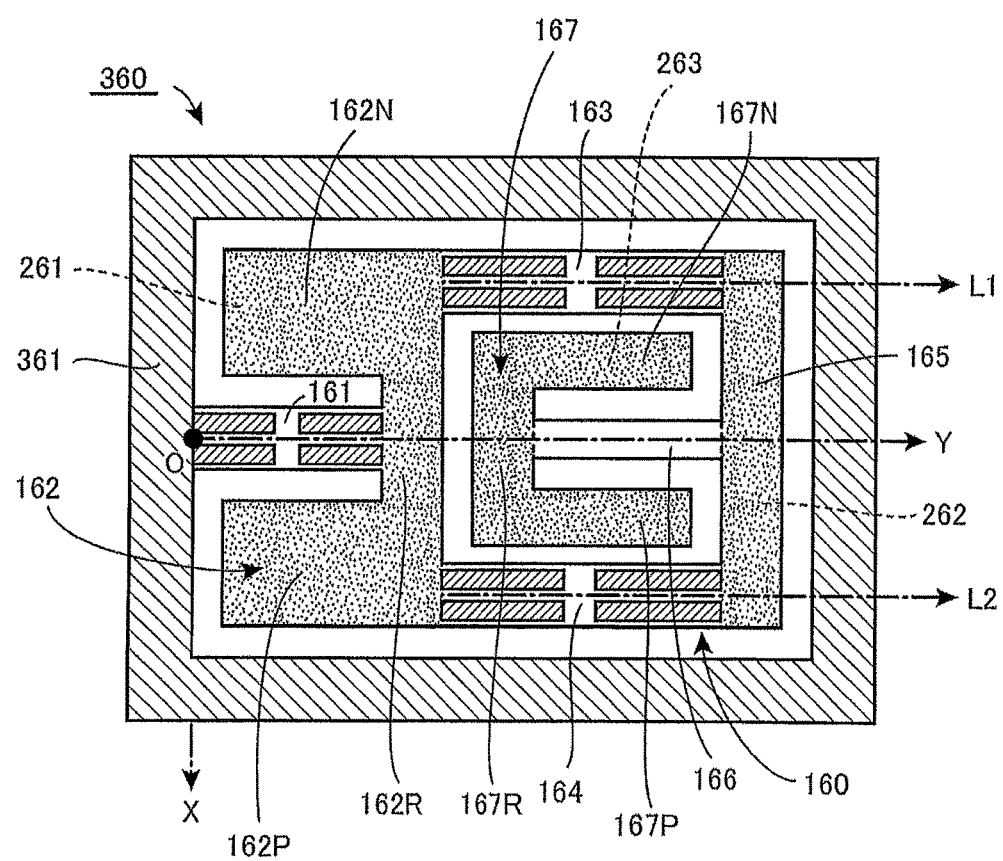
FIG. 25 is a plane sectional view which shows a device case-equipped power generating element 6000 according to a Sixth Embodiment of the present invention (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).

FIG. 25 is a plane sectional view of a device case-equipped power generating element 6000 according to the Sixth Embodiment of the present invention. The Sixth Embodiment is a modification example in which the above-described weight body in the Fifth Embodiment is slightly changed in shape and plate-like structure bodies are identical in connection relationship with those of the Fifth Embodiment. However, a first weight body and a third weight body are changed so as to be greater in mass, by which a connector between the same attributes and an extreme end connector are changed in planar shape to a U letter shape.

Specifically, in the case of this example, a main substrate 160 is constituted with a first central plate-like structure body 161 having a first attribute, a connector between the same attributes 162, a negative side plate-like structure body 163 and a positive side plate-like structure body 164 also each having the first attribute, a connector between different attributes 165, a second central plate-like structure body 166 having a second attribute and an extreme end connector 167. The extreme end connector 167 is a member which is connected to the leading end of the second central plate-like structure body 166.

Here, the connector between the same attributes 162 plays a role of connecting the first central plate-like structure body 161 having the first attribute with the negative side plate-like structure body 163 and the positive side plate-like structure body 164 also each having the first attribute. In contrast, the connector between different attributes 165 plays a role of connecting the negative side plate-like structure body 163 and the positive side plate-like structure body 164 each having the first attribute with the second central plate-like structure body 166 having the second attribute.

A basic structure portion is constituted with the main substrate 160, a pedestal 361 which is incorporated as a part of a side plate into a device case 360 and three sets of weight bodies 261, 262, 263. The pedestal 361 plays a role of supporting the first central plate-like structure body 161 at the origin O.

Here, the first central plate-like structure body 161 is arranged on the YZ plane, the base end thereof is connected to the pedestal 361 and the leading end thereof is connected to the connector between the same attributes 162. The first central plate-like structure body 161 is a plate-like structure body having the first attribute which extends in a direction parallel to the Y axis so that a direction from the base end to the leading end is given in the positive direction of the Y axis. Further, the negative side plate-like structure body 163 is arranged at the negative-side space, the base end thereof is connected to the connector between the same attributes 162 and the leading end thereof is connected to the connector between different attributes 165. The negative side plate-like structure body 163 is a plate-like structure body having the first attribute which extends in a direction parallel to the Y axis (a direction of longitudinal direction axis L1) so that a direction from the base end to the leading end is given in the positive direction of the Y axis. Similarly, the positive side plate-like structure body 164 is arranged at the negative-side space, the base end thereof is connected to the connector between the same attributes 162 and the leading end thereof is connected to the connector between different attributes 165. The positive side plate-like structure body 164 is a plate-like structure body having the first attribute which extends in a direction parallel to the Y axis (a direction of longitudinal direction axis L2) so that a direction from the base end to the leading end is given in the positive direction of the Y axis.

On the other hand, the second central plate-like structure body 166 is arranged on the YZ plane, the base end thereof is connected to the connector between different attributes 165. The second central plate-like structure body 166 is a plate-like structure body having the second attribute which extends in a direction parallel to the Y axis so that a direction from the base end to the leading end is given in the negative direction of the Y axis. The extreme end connector 167 is a member which is connected to the leading end of the second central plate-like structure body 166.

The Sixth Embodiment is characterized in that the connector between the same attributes 162 and the extreme end connector 167 are each formed so as to give a U letter planar shape, and the first weight body 261 and the third weight body 263 which are connected to the respective lower surfaces thereof are also each formed so as to give a U letter planar shape.

Specifically, as illustrated in the drawing, the connector between the same attributes 162 is constituted with a plate-like member which is provided with an orthogonal portion 162R extending in a direction orthogonal to the YZ plane (a direction parallel to the X axis) as well as a negative side wing-like portion 162N and a positive side wing-like portion 162P, each extending from the orthogonal portion 162R in the negative direction of the Y axis, and which is formed so as to give a U letter shaped projection image on the XY plane. Then, the first weight body 261 is constituted with a structure body which is connected to the lower surfaces of all the orthogonal portion 162R, the negative side wing-like portion 162N and the positive side wing-like portion 162P of the connector between the same attributes 162 and which is formed so as to give a U letter shaped projection image on the XY plane. In the case of the example illustrated in the drawing, the connector between the same attributes 162 is identical in planar shape with the first weight body 261, and the first weight body 261 is a structure body which occupies a domain indicated by dot hatching given in the drawing.

On the other hand, as illustrated in the drawing, the extreme end connector 167 is constituted with a plate-like member which is provided with an orthogonal portion 167R extending in a direction orthogonal to the YZ plane (a direction parallel to the X axis) as well as a negative side wing-like portion 167N and a positive side wing-like portion 167P, each extending from the orthogonal portion 167R in the positive direction of the Y axis, and which is formed so as to give a U letter shaped projection image on the XY plane. Then, the third weight body 263 is constituted with a structure body which is connected to the lower surfaces of all the orthogonal portion 167R, the negative side wing-like portion 167N and the positive side wing-like portion 167P of the extreme end connector 167 and which is formed so as to give a U letter shaped projection image on the XY plane. In the case of the example illustrated in the drawing, the extreme end connector 167 is identical in planar shape with the third weight body 263. The third weight body 263 is a structure body which occupies a domain indicated by dot hatching given in the drawing. The second weight body 262 is a weight body, the planar shape of which is formed in the rectangular shape, and which is connected to the lower surface of the connector between different attributes 165 (a domain indicated by dot hatching given in the drawing).

Individual members of the Sixth Embodiment are identical in connection relationship with those of the Fifth Embodiment which have been described above, and they are also identical in principle of motions. However, the first weight body 261 and the third weight body 263 are each formed so as to give a U letter planar shape, thereby providing such an advantage that the weight bodies can be increased in mass, as compared with the Fifth Embodiment, to further enhance power generation efficiency. Of course, the discrete upper electrode layers (piezoelectric elements) may be installed also on the upper surface of the second central plate-like structure body 166 to take out electric power.

Here, the first weight body 261 and the third weight body 263 are each formed so as to give the U letter planar shape and the second weight body 262 is formed so as to give the rectangular planar shape. This is because a space inside the device case 360 is used effectively as much as possible to downsize the element as a whole. That is, as for the first weight body 261, spaces made on both sides of the first central plate-like structure body 161 are used to arrange the negative side wing-like portion 162N and the positive side wing-like portion 162P, thus making it possible to increase the mass, with the spaces used effectively. Similarly, as to the third weight body 263, spaces made on both sides of the second central plate-like structure body 166 are used to arrange the negative side wing-like portion 167N and the positive side wing-like portion 167P, making it possible to increase the mass, with the spaces used effectively.

As described above, in the power generating element 6000 according to the Sixth Embodiment, the first weight body 261 and the third weight body 263 can be sufficiently increased in mass, thus making it possible to exhibit capability particularly suitable for three-axis power generation. In general, in vibration sources that have motors such as refrigerators and air conditioners, a main vibration component is that in the direction of a specific coordinate axis. Therefore, such a power generating element is also useful that has a structure suitable for single-axis power generation (a structure which is likely to vibrate only in the direction of a specific coordinate axis). However, in vehicles such as automobiles, trains and ships, there is applied vibration energy which includes vibration components in various directions. It is, therefore, preferable to use a power generating element which has a structure suitable for three-axis power generation (a structure which is likely to vibrate in the direction of each of the X, Y, Z coordinate axes).

In the power generating element 6000 shown in FIG. 25, the first weight body 261 and the third weight body 263 are great in mass. Therefore, even where vibration energy including any component of the X axis, the Y axis or the Z axis is applied from the outside, each of the weight bodies is allowed to vibrate at a sufficient amplitude, thereby exhibiting capability suitable for three-axis power generation.

7-7. Seventh Embodiment

Figure 26:
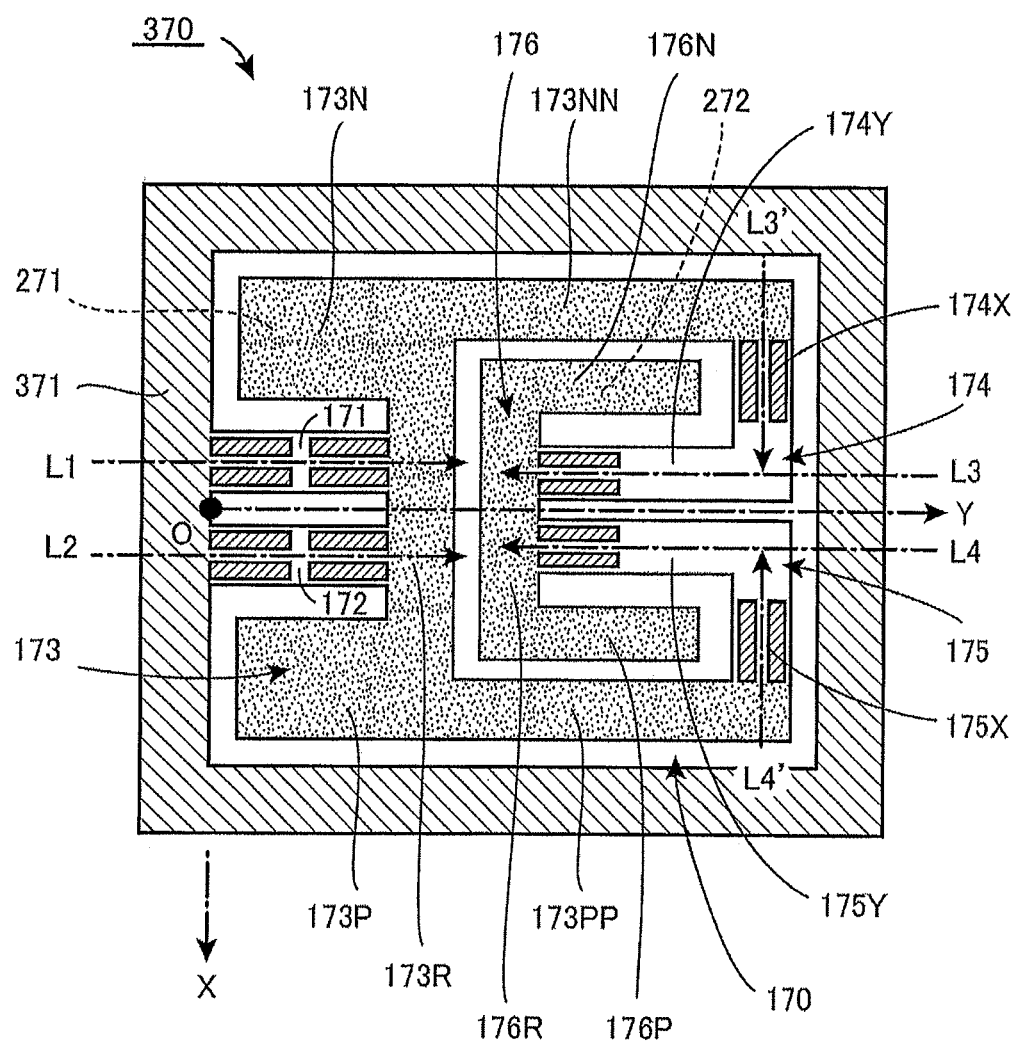
FIG. 26 is a plane sectional view which shows a device case-equipped power generating element 7000 according to a Seventh Embodiment of the present invention (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).

FIG. 26 is a plane sectional view of a device case-equipped power generating element 7000 according to a Seventh Embodiment of the present invention. At a glance, the Seventh Embodiment is similar in outer shape to the Sixth Embodiment described above. That is, this power generating element is formed so that the first central plate-like structure body 161 having the first attribute shown in FIG. 25 is replaced by a pair of plate-like structure bodies 171, 172 and the second central plate-like structure body 166 having the second attribute shown in FIG. 25 is replaced by a pair of plate-like structure bodies 174, 175. However, in terms of structural characteristics, the power generating element 7000 shown in FIG. 26 is similar to the power generating element 3000 shown in FIG. 22.

Specifically, in the case of this example, a main substrate 170 is constituted with the first negative side plate-like structure body 171 and the first positive side plate-like structure body 172 each having a first attribute, a connector between different attributes 173, the second negative side plate-like structure body 174 and the second positive side plate-like structure body 175 each having a second attribute and an extreme end connector 176. The extreme end connector 176 is a member which is connected to the leading ends of the second negative side plate-like structure body 174 and the second positive side plate-like structure body 175.

A basic structure portion is constituted with the main substrate 170, a pedestal 371 which is incorporated as a part of a side plate into a device case 370 and two sets of weight bodies 271, 272. The pedestal 371 plays a role of supporting the first negative side plate-like structure body 171 and the first positive side plate-like structure body 172 in the vicinity of the origin O.

The first negative side plate-like structure body 171 is a plate-like structure body arranged at the negative-side space, the base end thereof is connected to the pedestal 371 and the leading end thereof is connected to the connector between different attributes 173. The first negative side plate-like structure body 171 is a plate-like structure body having the first attribute which extends in a direction parallel to the Y axis (a direction of longitudinal direction axis L1) so that a direction from the base end to the leading end is given in the positive direction of the Y axis. Similarly, the first positive side plate-like structure body 172 is a plate-like structure body arranged at the positive-side space, the base end thereof is connected to the pedestal 371 and the leading end thereof is connected to the connector between different attributes 173. The first positive side plate-like structure body 172 is a plate-like structure body having the first attribute which extends in a direction parallel to the Y axis (a direction of longitudinal direction axis L2) so that a direction from the base end to the leading end is given in the positive direction of the Y axis.

On the other hand, the connector between different attributes 173 is slightly different in shape from the examples described above. That is, in the case of this example shown in FIG. 26, the connector between different attributes 173 has a planar shape which occupies a continuous domain to which dot hatching is given. The connector between different attributes 173 is constituted with a plate-like member which is provided with an orthogonal portion 173R extending in a direction orthogonal to the YZ plane (a direction parallel to the X axis) as well as a negative side wing-like portion 173N and a positive side wing-like portion 173P each extending from the orthogonal portion 173R in the negative direction of the Y axis, a negative side arm-like portion 173NN and a positive side arm-like portion 173PP each extending from the orthogonal portion 173R in the positive direction of the Y axis and which is formed so as to give an H letter shaped projection image on the XY plane. Then, the first weight body 271 is constituted with a structure body which is connected to the lower surfaces of all the orthogonal portion 173R, the negative side wing-like portion 173N, the positive side wing-like portion 173P, the negative side arm-like portion 173NN and the positive side arm-like portion 173PP of the connector between different attributes 173 and which is formed so as to give an H letter shaped projection image on the XY plane. In the case of the example illustrated in the drawing, the connector between different attributes 173 is identical in planar shape with the first weight body 271, and the first weight body 271 is a structure body which occupies a domain indicated by dot hatching given in the drawing.

As described above, in the case of the power generating element 7000 according to the Seventh Embodiment shown in FIG. 26, neither the negative side arm-like portion 173NN nor the positive side arm-like portion 173PP has flexibility. Thus, they do not perform a function as a plate-like structure body but perform a function as a part of the connector between different attributes 173. Then, the base end of the second negative side plate-like structure body 174 having the second attribute is connected to the leading end of the negative side arm-like portion 173NN, and the base end of the second positive side plate-like structure body 175 having the second attribute is connected to the leading end of the positive side arm-like portion 173PP. Therefore, the connector between different attributes 173 plays a role of connecting the first negative side plate-like structure body 171 and the first positive side plate-like structure body 172 with the second negative side plate-like structure body 174 and the second positive side plate-like structure body 175.

On the other hand, the extreme end connector 176 plays a role of connecting mutually the leading end of the second negative side plate-like structure body 174 with the leading end of the second positive side plate-like structure body 175. As illustrated in the drawing, the extreme end connector 176 is constituted with a plate-like member which is provided with an orthogonal portion 176R extending in a direction orthogonal to the YZ plane (a direction parallel to the X axis) as well as a negative side wing-like portion 176N and a positive side wing-like portion 176P each extending from the orthogonal portion 176R in the positive direction of the Y axis and which is formed so as to give a U letter shaped projection image on the XY plane. Then, the second weight body 272 is constituted with a structure body which is connected to lower surfaces of all the orthogonal portion 176R, the negative side wing-like portion 176N and the positive side wing-like portion 176P of the extreme end connector 176 and which is formed so as to give a U letter shaped projection image on the XY plane. In the case of the example illustrated in the drawing, the extreme end connector 176 is identical in planar shape with the second weight body 272, and the second weight body 272 is a structure body which occupies a domain indicated by dot hatching given in the drawing.

The power generating element 7000 is characterized in that each of the second negative side plate-like structure body 174 and the second positive side plate-like structure body 175 includes an X axis channel portion extending in a direction parallel to the X axis and a Y axis channel portion extending in a direction parallel to the Y axis and is formed so as to give an L letter shape projection image on the XY plane, which is important.

For example, the second negative side plate-like structure body 174 arranged at the negative-side space is provided with a negative side X axis channel portion 174X extending in a direction parallel to the X axis (a direction of longitudinal direction axis L3') and a negative side Y axis channel portion 174Y extending in a direction parallel to the Y axis (a direction of longitudinal direction axis L3). The base end of the negative side X axis channel portion 174X is connected to the connector between different attributes 173, the leading end of the negative side X axis channel portion 174X is connected to the base end of the negative side Y axis channel portion 174Y, and the leading end of the negative side Y axis channel portion 174Y is connected to the extreme end connector 176. Therefore, the second negative side plate-like structure body 174 is formed so as to give an L letter-shaped projection image on the XY plane.

Similarly, the second positive side plate-like structure body 175 arranged at the positive-side space is provided with a positive side X axis channel portion 175X extending in a direction parallel to the X axis (a direction of longitudinal direction axis L4') and a positive side Y axis channel portion 175Y extending in a direction parallel to the Y axis (a direction of longitudinal direction axis L4). The base end of the positive side X axis channel portion 175X is connected to the connector between different attributes 173, the leading end of the positive side X axis channel portion 175X is connected to the base end of the positive side Y axis channel portion 175Y, and the leading end of the positive side Y axis channel portion 175Y is connected to the extreme end connector 176. Therefore, the second positive side plate-like structure body 175 is formed so as to give an L letter shaped projection image on the XY plane.

As described above, the power generating element 7000 shown in FIG. 26 is identical in structural characteristics with the power generating element 3000 shown in FIG. 22. In terms of a phase geometric connection relationship from the pedestal, both of them are connected in the order of the pair of plate-like structure bodies having the first attribute, the connector between different attributes, the pair of plate-like structure bodies having the second attribute, and the extreme end connector. In the case of the power generating element 7000, the pair of plate-like structure bodies having the second attribute 174, 175 are each formed so as to give an L letter planar shape, by which individual portions can be arranged at an enhanced degree of freedom and spaces inside the device case 370 can be used effectively as much as possible to downsize the element as a whole.

In the case of the power generating element 7000, the pair of plate-like structure bodies 171, 172 having the first attribute are each a linear plate-like structure body extending in a direction parallel to the Y axis (a direction of longitudinal direction axis L1 or L2) so that a direction from the base end to the leading end is given in the positive direction of the Y axis. In contrast, the pair of plate-like structure bodies 174, 175 having the second attribute are each an L letter shaped structure body and, therefore, different to some extent in characteristics from the plate-like structure bodies having the second attribute in the embodiments described above. However, they respectively include at parts thereof Y axis channel portions 174Y, 175Y extending in a direction parallel to the Y axis (a direction of longitudinal direction axis L3 or L4) so that a direction from the base end to the leading end is given in the negative direction of the Y axis. Therefore, as with the embodiments described above, the power generating element 7000 also obtains such a working effect unique in the present invention that provides a power generating element which is able to attain efficient power generation in various use environments by adjusting resonance frequency of vibration in a specific direction and widening a frequency band capable of generating electric power.

Figure 27:
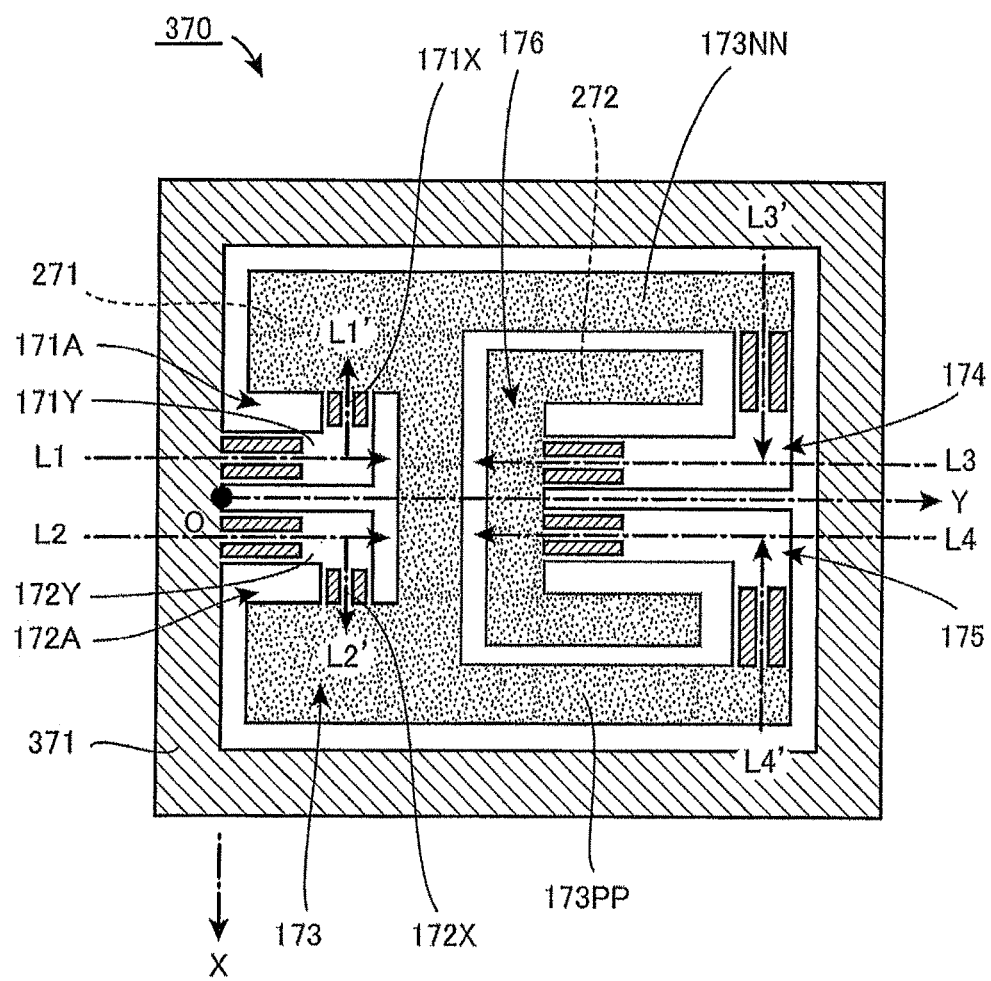
FIG. 27 is a plane sectional view which shows a device case-equipped power generating element 7000A according to a modification example of a Seventh Embodiment shown in FIG. 26 (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).

FIG. 27 is a plane sectional view of a power generating element 7000A according to a first modification example of the power generating element 7000 shown in FIG. 26. The power generating element 7000 shown in FIG. 26 is different from the power generating element 7000A shown in FIG. 27 only in that the pair of plate-like structure bodies 171, 172 having the first attribute in the former are replaced by a pair of plate-like structure bodies 171A, 172A having a first attribute in the latter. That is, in the case of the power generating element 7000A shown in FIG. 27, the pair of plate-like structure bodies 171A, 172A having the first attribute are each a plate-like structure body, the planar shape of which is formed so as to give an L letter shape.

As illustrated in the drawing, the first negative side plate-like structure body 171A is arranged at the negative-side space and provided with a first negative side Y axis channel portion 171Y extending in a direction parallel to the Y axis (a direction of longitudinal direction axis L1) and a first negative side X axis channel portion 171X extending in a direction parallel to the X axis (a direction of longitudinal direction axis L1'). The base end of the first negative side Y axis channel portion 171Y is connected to a pedestal 371, the leading end of the first negative side Y axis channel portion 171Y is connected to the base end of the first positive side X axis channel portion 171X, and the leading end of the first negative side X axis channel portion 171X is connected to a connector between different attributes 173. As a result, the first negative side plate-like structure body 171A is formed so as to give an L letter shaped projection image on the XY plane.

Similarly, the first positive side plate-like structure body 172A is arranged at the positive-side space and provided with a first positive side Y axis channel portion 172Y extending in a direction parallel to the Y axis (a direction of longitudinal direction axis L2) and a first positive side X axis channel portion 172X extending in a direction parallel to the X axis (a direction of longitudinal direction axis L2'). The base end of the first positive side Y axis channel portion 172Y is connected to the pedestal 371, the leading end of the first positive side Y axis channel portion 172Y is connected to the base end of the first positive side X axis channel portion 172X, and the leading end of the first positive side X axis channel portion 172X is connected to the connector between different attributes 173. As a result, the first positive side plate-like structure body 172A is formed so as to give an L letter shaped projection image on the XY plane.

Resultingly, in the case of this power generating element 7000A, each of the four plate-like structure bodies 171A, 172A, 174, 175 is formed so as to give an L letter shaped projection image on the XY plane. And, each of them includes at a part thereof a Y axis channel portion extending in a direction parallel to the Y axis (a direction of longitudinal direction axis L1 to L4) so that a direction from the base end to the leading end is given in the positive direction of the Y axis or in the negative direction of the Y axis. Therefore, the power generating element 7000A is also able to adjust resonance frequency of vibration in a specific direction.

Figure 28:
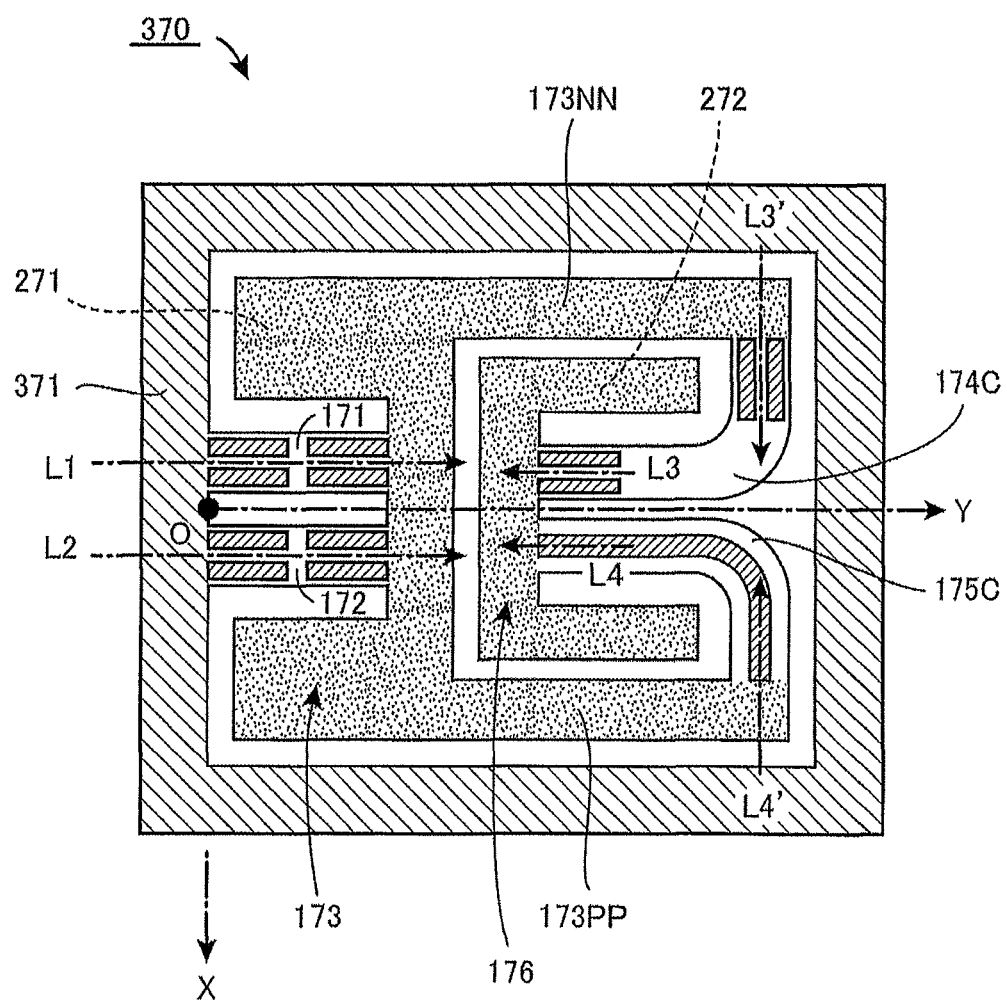
FIG. 28 is a plane sectional view which shows a device case-equipped power generating element 7000B according to another modification example of a Seventh Embodiment shown in FIG. 26 (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).

FIG. 28 is a plane sectional view of a power generating element 7000B according to a second modification example of the power generating element 7000 shown in FIG. 26. The power generating element 7000 shown in FIG. 26 is different from the power generating element 7000B shown in FIG. 28 only in that the pair of L letter shaped plate-like structure bodies 174, 175 having the second attribute in the former are replaced by a pair of J letter shaped plate-like structure bodies 174C, 175C having a second attribute in the latter.

As illustrated in the drawing, the second negative side plate-like structure body 174C is arranged at the negative-side space and includes a negative side X axis channel portion extending in a direction parallel to the X axis (a direction of longitudinal direction axis L3'), a negative side Y axis channel portion extending in a direction parallel to the Y axis (a direction of longitudinal direction axis L3), and a negative side curved connection portion which connects the negative side X axis channel portion with the negative side Y axis channel portion by a curved channel. The second negative side plate-like structure body 174C is a plate-like structure body which is formed so as to give a J letter shaped projection image on the XY plane. Here, the base end of the negative side X axis channel portion is connected to a connector between different attributes 173, the leading end of the negative side X axis channel portion is connected to the base end of the negative side Y axis channel portion by the negative side curved connection portion, and the leading end of the negative side Y axis channel portion is connected to an extreme end connector 176.

Similarly, the second positive side plate-like structure body 175C is arranged at the positive-side space and includes a positive side X axis channel portion extending in a direction parallel to the X axis (a direction of longitudinal direction axis L4'), a positive side Y axis channel portion extending in a direction parallel to the Y axis (a direction of longitudinal direction axis L4) and a positive side curved connection portion which connects the positive side X axis channel portion with the positive side Y axis channel portion by a curved channel. The second positive side plate-like structure body 175C is a plate-like structure body which is formed so as to give a J letter shaped projection image on the XY plane. Here, the base end of the positive side X axis channel portion is connected to the connector between different attributes 173, the leading end of the positive side X axis channel portion is connected to the base end of the positive side Y axis channel portion by the positive side curved connection portion, and the leading end of the positive side Y axis channel portion is connected to the extreme end connector 176.

As described above, the second negative side plate-like structure body 174C and the second positive side plate-like structure body 175C are each formed so as to give the J letter shaped projection image on the XY plane. Each of them includes at a part thereof a Y axis channel portion extending in a direction parallel to the Y axis (a direction of longitudinal direction axis L3, L4) so that a direction from the base end to the leading end is given in the negative direction of the Y axis. Therefore, the power generating element 7000B is also able to adjust resonance frequency of vibration in a specific direction.

In the case of the example shown in FIG. 28, four sets of discrete upper electrode layers are installed on the upper surface of each of the first negative side plate-like structure body 171, the first positive side plate-like structure body 172 and the second negative side plate-like structure body 174C, whereas only one set of the J letter shaped upper electrode layer is installed on the upper surface of the second positive side plate-like structure body 175C. This is because consideration is given for showing one variation example of the upper electrode layers arranged on the upper surface of each of the plate-like structure bodies. There are also shown several variations in which the upper electrode layers are arranged in the power generating element 1003 shown in FIG. 17. The above-described variations are applicable also to the power generating elements 7000, 7000A and 7000B according to the Seventh Embodiment shown in FIG. 26 to FIG. 28.

For example, as an upper electrode layer which is formed on the upper surface of the first negative side plate-like structure body 171, a description has been so far given of an example in which four sets of the discrete upper electrode layers E1 to 4 are arranged, as shown in FIG. 29A. It may be, however, possible to arrange the single upper electrode layer E10 as shown in FIG. 29B. This is also true for an upper electrode layer which is arranged on the upper surface of the L letter shaped plate-like structure body or the J letter shaped plate-like structure body. For example, as for the L letter shaped plate-like structure body 174 shown in FIG. 27, there is given such an example that four sets of the discrete upper electrode layers E1 to E4 shown in FIG. 30A are arranged. It may be, however, possible to arrange the single upper electrode layer E10 as shown in FIG. 30B or to arrange a total of eight sets of discrete upper electrode layers E1 to E8 as shown in FIG. 30C.

As described already, when charge of positive polarity and charge of negative polarity are supplied simultaneously to the same upper electrode layer at the same time point, they cancel each other and disappear, thus resulting in loss of power generation. Accordingly, in order to enhance power generation efficiency, it is important to supply charge of the same polarity to a certain single discrete upper electrode layer without fail at a certain time point. However, as a greater number of upper electrode layers are installed, accordingly longer hours of labor are required for providing patterning and wiring in a production process to raise production costs.

Therefore, it is in practice preferable that on the assumption of actual use environments of commercially available power generating elements, an appropriate arrangement of upper electrode layers is determined for each of the power generating elements. For example, where application of expansion stress or contraction stress to an entire upper surface of the L letter shaped plate-like structure body 174 is assumed in an actual use environment, it is preferable to adopt a constitution in which the single upper electrode layer E10 is arranged to reduce costs, as shown in the example of FIG. 30B.

7-8. Eighth Embodiment

Figure 31:
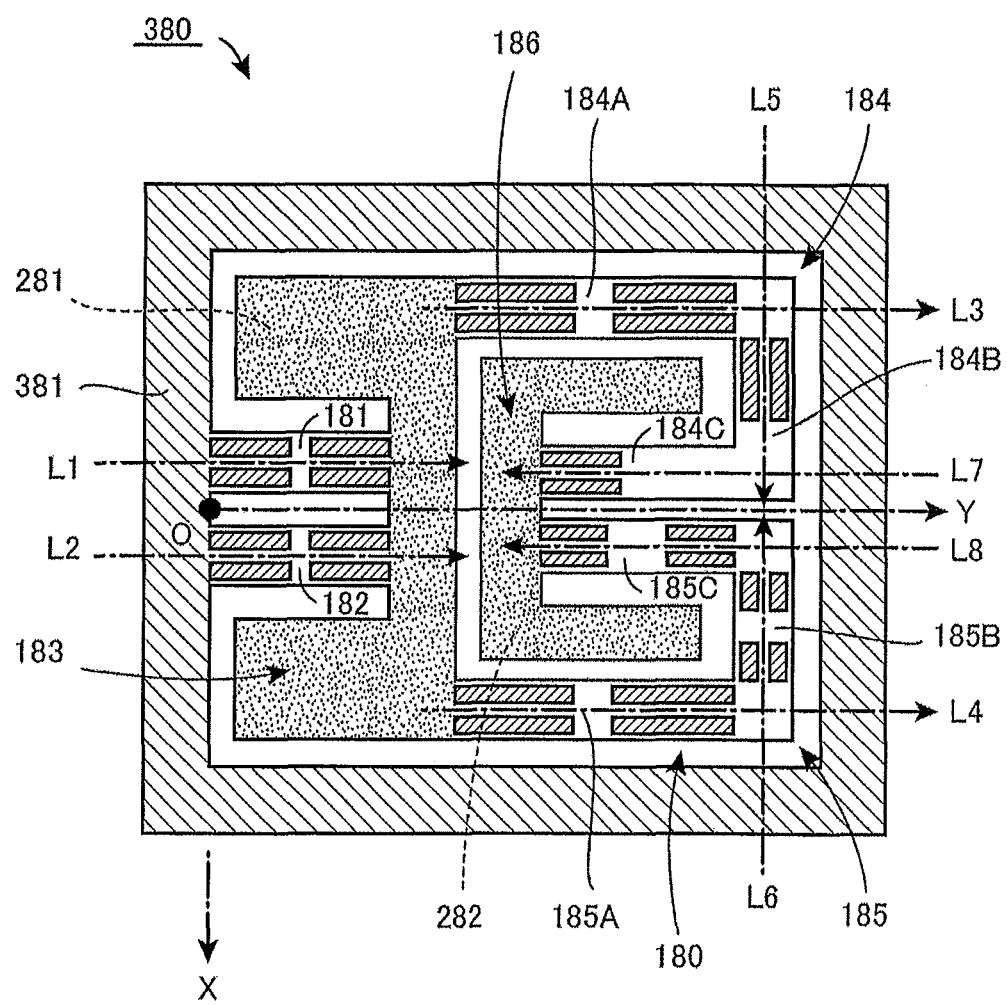
FIG. 31 is a plane sectional view which shows a device case-equipped power generating element 8000 according to an Eighth Embodiment of the present invention (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).

FIG. 31 is a plane sectional view of a device case-equipped power generating element 8000 according to an Eighth Embodiment of the present invention. At a glance, the Eighth Embodiment is similar in outer shape to the Seventh Embodiment which has been described above but characterized in that there is adopted not an L letter shaped plate-like structure body but adopted a U letter shaped plate-like structure body as a plate-like structure body having a second attribute. In terms of a phase geometric connection relationship from a pedestal, constituents are also connected in the order of a pair of plate-like structure bodies 181, 182 having a first attribute, a connector between different attributes 183, a pair of plate-like structure bodies 184, 185 having the second attribute and an extreme end connector 186.

Specifically, in the case of the Eighth Embodiment shown in FIG. 31, a main substrate 180 is constituted with the first negative side plate-like structure body 181 and the first positive side plate-like structure body 182 each having the first attribute, the second negative side plate-like structure body 184 and the second positive side plate-like structure body 185 each having the second attribute, the connector between different attributes 183 which connects the first negative side plate-like structure body 181 and the first positive side plate-like structure body 182 with the second negative side plate-like structure body 184 and the second positive side plate-like structure body 185, and the extreme end connector 186 which connects mutually the leading end of the second negative side plate-like structure body 184 with the leading end of the second positive side plate-like structure body 185.

A basic structure portion is constituted with the main substrate 180, a pedestal 381 which is incorporated as a part of a side plate into a device case 380, and two sets of weight bodies 281, 282. The pedestal 381 plays a role of supporting the first negative side plate-like structure body 181 and the first positive side plate-like structure body 182 in the vicinity of the origin O.

The first negative side plate-like structure body 181 is a plate-like structure body arranged at the negative-side space, the base end thereof is connected to the pedestal 381 and the leading end thereof is connected to the connector between different attributes 183. The first negative side plate-like structure body 181 is a plate-like structure body having the first attribute which extends in a direction parallel to the Y axis (a direction of longitudinal direction axis L1) so that a direction from the base end to the leading end is given in the positive direction of the Y axis. Similarly, the first positive side plate-like structure 182 is a plate-like structure body arranged at the positive-side space, the base end thereof is connected to the pedestal 381 and the leading end thereof is connected to the connector between different attributes 183. The first positive side plate-like structure 182 is a plate-like structure body having the first attribute extending in a direction parallel to the Y axis (a direction of longitudinal direction axis L2) so that a direction from the base end to the leading end is given in the positive direction of the Y axis.

As illustrated in the drawing, the connector between different attributes 183 is constituted with a plate-like member which is provided with an orthogonal portion extending in a direction orthogonal to the YZ plane (a direction parallel to the X axis) as well as a negative side wing-like portion and a positive side wing-like portion, each extending from the orthogonal portion in the negative direction of the Y axis, and which is formed so as to give a U letter shaped projection image on the XY plane. Then, the first weight body 281 is constituted with a structure body which is connected to an entire domain on the lower surface of the connector between different attributes 183 and formed so as to give a U letter shaped projection image on the XY plane. In the case of the example illustrated in the drawing, the connector between different attributes 183 is identical in planar shape with the first weight body 281, and the first weight body 281 is a structure body which occupies a domain indicated by dot hatching given in the drawing.

On the other hand, the second negative side plate-like structure body 184 is arranged at the negative-side space and includes a negative side base-end-side channel portion 184A which extends in a direction parallel to the Y axis (a direction of longitudinal direction axis L3), a negative side relaying channel portion 184B which extends in a direction parallel to the X axis (a direction of longitudinal direction axis L5) and a negative side leading-end-side channel portion 184C which extends in a direction parallel to the Y axis (a direction of longitudinal direction axis L7). The second negative side plate-like structure body 184 is formed so as to give a U letter shaped projection image on the XY plane. Here, the base end of the negative side base-end-side channel portion 184A is connected to the connector between different attributes 183, the leading end of the negative side base-end-side channel portion 184A is connected to the base end of the negative side relaying channel portion 184B, the leading end of the negative side relaying channel portion 184B is connected to the base end of the negative side leading-end-side channel portion 184C, and the leading end of the negative side leading-end-side channel portion 184C is connected to the extreme end connector 186.

Further, the second positive side plate-like structure body 185 is arranged at the positive-side space and includes a positive side base-end-side channel portion 185A which extends in a direction parallel to the Y axis (a direction of longitudinal direction axis L4), a positive side relaying channel portion 185B which extends in a direction parallel to the X axis (a direction of longitudinal direction axis L6) and a positive side leading-end-side channel portion 185C which extends in a direction parallel to the Y axis (a direction of longitudinal direction axis L8). The second positive side plate-like structure body 185 is formed so as to give a U letter shaped projection image on the XY plane. Here, the base end of the positive side base-end-side channel portion 185A is connected to the connector between different attributes 183, the leading end of the positive side base-end-side channel portion 185A is connected to the base end of the positive side relaying channel portion 185B, the leading end of the positive side relaying channel portion 185B is connected to the base end of the positive side leading-end-side channel portion 185C, and the leading end of the positive side leading-end-side channel portion 185C is connected to the extreme end connector 186.

The extreme end connector 186 plays a role of connecting mutually the leading end of the second negative side plate-like structure body 184 with the leading end of the second positive side plate-like structure body 185. As illustrated in the drawing, the extreme end connector 186 is constituted with a plate-like member which is provided with an orthogonal portion extending in a direction orthogonal to the YZ plane (a direction parallel to the X axis) as well as a negative side wing-like portion and a positive side wing-like portion, each extending from the orthogonal portion in the positive direction of the Y axis, and which is formed so as to give a U letter shaped projection image on the XY plane. Then, the second weight body 282 is constituted with a structure body which is connected to an entire domain on the lower surface of the extreme end connector 186 and which is formed so as to give a U letter shaped projection image on the XY plane. In the case of the example illustrated in the drawing, the extreme end connector 186 is identical in planar shape with the second weight body 282, and the second weight body 282 is a structure body which occupies a domain indicated by dot hatching given in the drawing.

In the case of the power generating element 8000, the pair of plate-like structure bodies 181, 182 having the first attribute are given as a linear plate-like structure body which extends in a direction parallel to the Y axis (a direction of longitudinal direction axis L1 or L2) so that a direction from the base end to the leading end is given in the positive direction of the Y axis, while the pair of plate-like structure bodies 184, 185 having the second attribute are a U letter shaped structure body. Therefore, the pair of plate-like structure bodies 184, 185 are constituents which are different to some extent in characteristics from the plate-like structure bodies having the second attribute in the embodiments described above. However, they respectively include at the parts thereof Y axis channel portions 184C, 185C extending in a direction parallel to the Y axis (a direction of longitudinal direction axis L7 or L8) so that a direction from the base end to the leading end is given in the negative direction of the Y axis. Therefore, as with the various embodiments described above, the power generating element 8000 also obtains such a working effect unique to the present invention that provides a power generating element which is able to attain efficient power generation in various use environments by adjusting resonance frequency of vibration in a specific direction and widening a frequency band capable of generating electric power.

Chapter 8. Basic Characteristics of the Present Invention

A description has been so far given to the power generating element of the present invention on the basis of several embodiments. Here, a description will be given of basic characteristics of the present invention as a summary of these embodiments.

The present invention is an invention of a power generating element which generates electric power by converting vibration energy into electric energy and obtains such a working effect that widens a frequency band capable of generating electric power. Basic constituents of the power generating element according to the present invention are composed of a basic structure portion which constitutes a physical vibration system and a charge generating element which generates charge on the basis of deformation of the basic structure portion. Generation of electric power in itself can be effected by installing a charge generating element. However, in order to take out electric power efficiently, it is practically preferable to add a power generating circuit for rectifying electric current produced on the basis of charge generated at the charge generating element and taking out electric power.

The basic structure portion is provided with a plurality of plate-like structure bodies which have flexibility, a connector between different attributes, a pedestal and a weight body, including at least two types of plate-like structure bodies, that is, a plate-like structure body having a first attribute and a plate-like structure body having a second attribute. The connector between different attributes plays a role of connecting mutually a plate-like structure body having the first attribute with a plate-like structure body having the second attribute. Further, the pedestal plays a role of supporting a plate-like structure body having the first attribute. Here, when an XYZ three-dimensional coordinate system is defined, a plate-like structure body having the first attribute and a plate-like structure body having the second attribute are arranged so that each of the plate surfaces thereof is given as a surface parallel to the XY plane.

The plate-like structure body having the first attribute is different from the plate-like structure body having the second attribute in a direction from the base end to the leading end. As described above, in the application concerned, when consideration is given to a connection channel to a pedestal in a structure to which a plurality of plate-like structure bodies are connected, an end which is close to the pedestal on the connection channel is referred to as a base end, while an end which is far away from the pedestal is referred to as a leading end. Then, the plate-like structure body having the first attribute is such that the base end thereof is connected to the pedestal and the leading end thereof is connected to a connector between different attributes. It is a plate-like member which extends in a direction parallel to the Y axis so that a direction from the base end to the leading end is given in the positive direction of the Y axis. Similarly, the plate-like structure body having the second attribute is such that the base end thereof is connected to the connector between different attributes and it is a plate-like member which extends in a direction parallel to the Y axis so that a direction from the base end to the leading end is given in the negative direction of the Y axis.

Further, the connector between different attributes plays a role of connecting mutually the plate-like structure bodies reverse in an extending direction and, therefore, performing a function as a return point of the plate-like structure bodies. As described above, in the present invention, such a constitution is adopted that the plate-like structure body having the first attribute and the plate-like structure body having the second attribute are returned by way of the connector between different attributes. Although each of the plate-like structure bodies is constituted with a plate-like member extending in a direction parallel to the Y axis, it is possible to suppress a dimension of the element in its entirety in the direction of the Y axis and downsize the element as a whole.

A weight body which is included in the basic structure portion undergoes vibration by deflection of a plate-like structure body. As shown in the model of FIG. 7C, the basic structure portion constitutes a combined vibration system which includes a first resonance system I on the basis of deflection of the plate-like structure body having the first attribute and a second resonance system II on the basis of deflection of the plate-like structure body having the second attribute. Therefore, such design can be made that a frequency band capable of generating electric power is widened by adjusting resonance frequencies of fr1, fr2 of the resonance systems.

In the power generating element according to each of the embodiments described above, the plate-like structure body having the first attribute and the plate-like structure body having the second attribute are installed as indispensable constituents. It is also possible to add a plate-like structure body having a third attribute. Specifically, the plate-like structure body having the third attribute is added to the power generating element 4000 according to the Fourth Embodiment described in Chapter 7-4 (refer to FIG. 23).

That is, in the case of the power generating element 4000, the basic structure portion is further provided with the flexible plate-like structure body having the third attribute (the central plate-like structure body 147) and the second connector between different attributes 146 which connects mutually the plate-like structure body having the third attribute with the plate-like structure body having the second attribute. Then, the leading ends of the plate-like structure bodies having the second attribute (the second negative side plate-like structure body 144 and the second positive side plate-like structure body 145) are connected to the second connector between different attributes 146. The plate-like structure body having the third attribute (the central plate-like structure body 147) is arranged so that the plate surface thereof is given as a surface parallel to the XY plane and the base end thereof is connected to the second connector between different attributes 146. The plate-like structure body having the third attribute extends in a direction parallel to the Y axis so that a direction from the base end to the leading end is given in the positive direction of the Y axis.

As described above, where the plate-like structure body having the third attribute is added, a direction at which the plate-like structure body having the third attribute extends is set reverse to a direction at which the plate-like structure body having the second attribute extends (in other words, in the same direction as that at which the plate-like structure body having the first attribute extends). Thereby, where consideration is given to a connecting channel from the pedestal to the extreme end (an end of a dendriform structure which constitutes a cantilever beam) with regard to each of the plate-like structure bodies, upon movement from the plate-like structure body having the first attribute to the plate-like structure body having the second attribute, the direction is reversed by returning. Also, upon movement from the plate-like structure body having the second attribute to the plate-like structure body having the third attribute, the direction is also reversed by returning.

The above-described returning structure is also applicable to a case where plate-like structure bodies having the fourth and subsequent attributes are added. That is, a description will be given of an embodiment in which plate-like structure bodies having a fourth and subsequent attributes are added, as a generalization. That is, the basic structure portion is further provided with flexible plate-like structure bodies having a third attribute to an $n^{th}$ attribute (however, n is any given natural number which meets n≥4) and a $(i-1)^{th}$ connector between different attributes which connects a plate-like structure body having an attribute with a plate-like structure body having an $(i-1)^{th}$ attribute (however, i is an individual natural number which meets 3≤i≤n). Here, the plate-like structure body having the $i^{th}$ attribute is arranged so that the plate surface thereof is given as a surface parallel to the XY plane, the base end thereof is connected to the $(i-1)^{th}$ connector between different attributes, and the leading end thereof is connected to an $i^{th}$ connector between different attributes or given as a free end. And, the plate-like structure body having the $i^{th}$ attribute extends in a direction parallel to the Y axis so that a direction from the base end to the leading end is given in the positive direction of the Y axis where i is an odd number and is given in the negative direction of the Y axis where i is an even number.

For example, where n is set to be equal to 4, the basic structure portion is further provided with a flexible plate-like structure body having a third attribute, a flexible plate-like structure body having a fourth attribute, a second connector between different attributes which connects the plate-like structure body having the third attribute with the plate-like structure body having a second attribute, and a third connector between different attributes which connects the plate-like structure body having the fourth attribute with the plate-like structure body having the third attribute.

Here, the plate-like structure body having the third attribute is arranged so that the plate surface thereof is given as a surface parallel to the XY plane, the base end thereof is connected to the second connector between different attributes and the leading end thereof is connected to the third connector between different attributes. The plate-like structure body having the third attribute extends in a direction parallel to the Y axis so that a direction from the base end to the leading end is given in the positive direction of the Y axis. Further, the plate-like structure body having the fourth attribute is arranged so that the plate surface thereof is given as a surface parallel to the XY plane, the base end thereof is connected to the third connector between different attributes and the leading end thereof is given as a free end. The plate-like structure body having the fourth attribute extends in a direction parallel to the Y axis so that a direction from the base end to the leading end is given in the negative direction of the Y axis.

It is possible to provide a plurality of plate-like structure bodies having the same attribute, whenever necessary. In this case, the plurality of plate-like structure bodies having the same attribute can be arranged in parallel so as to be parallel to each other or can be arranged in series by way of a connector between the same attributes. For example, in the power generating element 5000 according to the Fifth Embodiment described in Chapter 7-5 (refer to FIG. 24), three sets of the plate-like structure bodies 151, 153, 154 are installed as a plate-like structure body having the first attribute. The plate-like structure bodies 153, 154 are arranged in parallel so as to be parallel to each other, and these structure bodies and the plate-like structure body 151 are arranged in series by way of the connector between the same attributes 152.

In general, a plurality of plate-like structure bodies are installed and a charge generating element is installed on each of the plate-like structure bodies, thus making it possible to enhance power generation efficiency accordingly. However, the element in its entirety is thereby made larger in dimension due to an increased occupation area for arranging the plate-like structure bodies. In this case, a parallel arrangement of the plurality of plate-like structure bodies results in a dimensional increase of the element in the direction of the X axis, whereas a serial arrangement of the plurality of plate-like structure bodies results in a dimensional increase of the element in the direction of the Y axis. Therefore, in practice, how to arrange the plurality of plate-like structure bodies may be determined, with consideration given to the dimensions and shape of the element as a whole.

A plate-like member having an orthogonal portion extending in a direction orthogonal to the YZ plane (a direction parallel to the X axis) is preferably used as the connector between different attributes and the connector between the same attributes. Thereby, it is possible to connect the base end or the leading end of the plate-like structure body extending in a direction parallel to the Y axis with a predetermined site on a side surface of the orthogonal portion. It is also possible to flexibly deal with installation of the plurality of plate-like structure bodies having the same attribute.

An increase in mass of a weight body is also effective in enhancing power generation efficiency of a power generating element. As one of approaches thereof, such a method can be adopted that an extreme end connector is connected to the leading end of an extreme end plate-like structure body and a weight body is connected to the lower surface thereof. For example, the extreme end connector 136 shown in FIG. 22, the extreme end connector 148 shown in FIG. 23, the extreme end connector 157 shown in FIG. 24 and the extreme end connector 167 shown in FIG. 25 play a role of increasing the mass of the weight body connected to the lower surface of each of them. In particular, the extreme end connector 136 shown in FIG. 22 is a member which connects the leading ends of the plurality of plate-like structure bodies 134, 135 having the same attribute and arranged in parallel so as to be parallel to each other, thereby providing an effect of greatly increasing the mass of the weight body 232 connected to the lower surface thereof.

Further, in the power generating element 6000 shown in FIG. 25, the connector between the same attributes 162 and the extreme end connector 167 are each formed so as to give a U letter shaped planar shape, thereby increasing the mass of each of the weight bodies 261, 263 connected to the lower surface thereof. In carrying out the present invention, at least one of the connector between different attributes, the connector between the same attributes and the extreme end connector is constituted with a U letter shaped plate-like member which is provided with an orthogonal portion extending in a direction orthogonal to the YZ plane as well as a positive side wing-like portion and a negative side wing-like portion extending from the orthogonal portion in a direction parallel to the Y axis and which is formed so as to give a U letter shaped projection image on the XY plane, thus making it possible to obtain an effect of increasing the mass of the weight body connected to the lower surface thereof. That is, the orthogonal portion of the U letter shaped plate-like member is arranged at a position which covers astride the positive-side space and the negative-side space, the positive side wing-like portion is arranged at the positive-side space, and the negative side wing-like portion is arranged at the negative-side space. Thereby, it is possible to arrange a weight body great in mass so as to cover astride entirely below the orthogonal portion, below the positive side wing-like portion and below the negative side wing-like portion.

As shown in the example of the Seventh Embodiment described in Chapter 7-7 and that of the Eighth Embodiment described in Chapter 7-8, the plate-like structure bodies which are the constituents of the power generating element according to the present invention are not necessarily a linear beam which extends in a direction parallel to the Y axis but may be a beam which is formed so as to give an L letter shape, a J letter shape or a U letter shape.

In short, the plate-like structure body having the first attribute used in the present invention may be such that the base end thereof is connected to the pedestal, the leading end thereof is connected to the connector between different attributes. And, the plate-like structure body having the first attribute may include at least at a part thereof a Y axis channel portion having the first attribute which extends in a direction parallel to the Y axis so that a direction from the base end to the leading end is given in the positive direction of the Y axis. Similarly, the plate-like structure body having the second attribute used in the present invention may be such that the base end thereof is connected to the connector between different attributes. And, the plate-like structure body having the second attribute may include at least at a part thereof a Y-axis channel portion having the second attribute which extends in a direction parallel to the Y axis so that a direction from the base end to the leading end is given in the negative direction of the Y axis.

The power generating element 7000 shown in FIG. 26 is an example in which the plate-like structure bodies 174, 175 having the second attribute are each constituted with an L letter shaped beam which includes the X axis channel portion 174X or 175X extending in a direction parallel to the X axis and the Y axis channel portion 174Y or 175Y extending in a direction parallel to the Y axis. Of course, the plate-like structure bodies 171, 172 having the first attribute can also be each constituted with an L letter shaped beam. The power generating element 7000A shown in FIG. 27 is an example in which four sets of the plate-like structure bodies are all constituted with L letter shaped beams.

In short, in carrying out the present invention, one of the plate-like structure body having the first attribute and the plate-like structure body having the second attribute or both of them can be constituted with a beam which includes an X axis channel portion extending in a direction parallel to the X axis and a Y axis channel portion extending in a direction parallel to the Y axis and which has an L letter shaped portion formed so as to give an L letter shaped projection image on the XY plane.

As in the power generating element 7000B shown in FIG. 28, one of the plate-like structure body having the first attribute and the plate-like structure body having the second attribute or both of them can also be constituted with a beam which includes an X axis channel portion extending in a direction parallel to the X axis, a Y axis channel portion extending in a direction parallel to the Y axis and a curved connection portion for connecting the X axis channel portion with the Y axis channel portion by a curved channel and which has a J letter shaped portion formed so as to give a J letter shaped projection image on the XY plane.

Further, as in the power generating element 8000 shown in FIG. 31, the plate-like structure bodies 184, 185 having the second attribute can be each constituted with a beam which includes a base-end-side channel portion extending in a direction parallel to the Y axis, a relaying channel portion extending in a direction parallel to the X axis and a leading-end-side channel portion extending in a direction parallel to the Y axis and which has a U letter shaped portion formed so as to give a U letter shaped projection image on the XY plane by coupling, from the base end to the leading end sequentially, the base-end-side channel portion, the relaying channel portion and the leading-end-side channel portion.

The basic structure portion used in the power generating element according to the present invention is preferably constituted with a single main substrate which has a plate surface parallel to the YX plane. The basic structure portion of the power generating element 1000 shown in FIG. 3 is constituted by joining the weight body group 210 and the pedestal 310 with the main substrate 110, and each of the plate-like structure bodies 111, 113, 114 and the connector between different attributes 112 are constituted with certain parts of the main substrate 110. Of course, upon installation of the connector between the same attributes, the connector between the same attributes is constituted with certain parts of the main substrate, and upon installation of the extreme end connector, the extreme end connector is constituted with certain parts of the main substrate.

Further, the basic structure portion used in the power generating element according to the present invention is preferably constituted with a structure body which gives plane symmetry in relation to the YZ plane. Any of the basic structure portions of the First Embodiment to Eighth Embodiment described above is structured so as to give plane symmetry in relation to the YZ plane. If the basic structure portion gives plane symmetry in relation to the YZ plane, charge generating elements such as piezoelectric elements to be added thereto can also be arranged so as to give plane symmetry to the YZ plane. Thereby, a total amount of positive charge and that of negative charge generated in individual charge generating elements can be made equal as much as possible at individual moments to attain loss-free efficient power generation.

Chapter 9. Other Modification Examples of the Present Invention

Here, a description will be given of some other modification examples in the various embodiments described above.

First, a connection relationship between the plurality of plate-like structure bodies shall not be limited to that of the First Embodiment to Eighth Embodiment described above. In addition, various types of connection relationships can be adopted. Of course, there is no restriction on the number of plate-like structure bodies having the same attribute, and any given number of plate-like structure bodies may be arranged in parallel or any given number of plate-like structure bodies may be arranged in series.

Further, an example shown in the First Embodiment to Eighth Embodiment described above may be constituted in such a manner that another different member is inserted between two sets of directly-connected members, thereby connecting two sets of the members indirectly. For example, in the First Embodiment shown in FIG. 3, the base end of the central plate-like structure body 111 is directly connected to the pedestal 310. However, such a constitution may be provided that a certain different member (or a plurality of members will do) is inserted between them to connect indirectly the base end of the central plate-like structure body 111 with the pedestal 310.

In the First Embodiment to Eighth Embodiment, the piezoelectric elements are arranged at a major part of the plate-like structure body at which deflection occurs. However, a part at which the piezoelectric elements are arranged is a matter to be determined whenever necessary in designing individual power generating elements, and an arrangement as per illustrated in each of the embodiments may not be necessarily adopted. Of course, in order to enhance power generation efficiency, the piezoelectric elements are preferably arranged at all the parts at which the plate-like structure body undergoes deflection. The piezoelectric elements are arranged, for example, in the plate-like structure body 147 shown in FIG. 23, the plate-like structure body 156 shown in FIG. 24 and the plate-like structure body 166 shown in FIG. 25, thus making it possible to further enhance power generation efficiency. The piezoelectric elements are also arranged on the lower surface of the plate-like structure body, thus making it possible to still further enhance power generation efficiency. However, wiring is required to be added accordingly with an increase in the number of piezoelectric elements, inevitably resulting in increased production costs.

Of course, the number of weight bodies and dimensions thereof are also important parameters which will influence power generation efficiency. In general, such a constitution may be adopted that a weight body is connected to any one of a predetermined site of the plate-like structure body, a predetermined site of the connector between different attributes, a predetermined site of the connector between the same attributes and a predetermined site of the extreme end connector. In the embodiments described above, the weight body is installed at two or three sites. However, the weight body may be installed at four or more sites or may be installed only at one site. Further, in the embodiments described above, such a constitution is adopted that the weight body is joined with the lower surface of the main substrate. However, the weight body may be joined with the upper surface or a side surface of the main substrate. The weight body may be provided in any given shape and dimensions.

In general, a plate-like structure body is allowed to undergo greater deflection as a weight body is increased in the number and dimensions, thus making it possible to enhance power generation efficiency. However, the weight body is joined with the plate-like structure body, by which a part joined with the plate-like structure body loses flexibility. Therefore, such a structure is preferably adopted that the weight body is joined with individual connectors as much as possible.

In carrying out the present invention, it is not always necessary to install a weight body. Three sets of the weight bodies 211, 212, 213 are installed, for example, in the power generating element 1000 shown in FIG. 3. Electric power could be generated after removal of the weight body group 210. This is because each of the plate-like structure bodies, 111, 113, 114 or the connector between different attributes 112 has its own mass and performs a function as a weight. As a result, even after removal of the weight body group 210 from the power generating element 1000 shown in FIG. 3, the main substrate 110 which is formed in the E letter shape alone is able to perform a function as a combined vibration system, thereby obtaining working effects of the present invention. It is also possible to remove all the weight bodies in the Second Embodiment to Eighth Embodiment.

In general, in the case of a system in which a single plate-like structure body is allowed to vibrate, a structure to which a weight body is added is able to attain greater amplitude than a structure exclusively composed of a plate-like structure body. Therefore, in the case of a power generating element provided with only a single plate-like structure body, power generation efficiency can be enhanced by adding a weight body having a mass as great as possible. However, when the weight body is increased in mass without change in material, it is necessary to increase dimensions of the weight body and then necessary to secure a space for vibration of the weight body. Thus, the element is increased in dimensions as a whole.

In contrast, where a weight body-free structure is adopted, a plate-like structure body undergoes vibration resulting from a mass equivalent to its own weight. Therefore, amplitude is inevitably lowered, as compared with a structure that has a weight body. However, in the weight body-free structure, it will be sufficient to secure only a space for vibration of the plate-like structure body, making it possible to save space of the elements as a whole. Where it is necessary to generate greater electric power, such a structure can be adopted that many plate-like structure bodies are densely arranged. In this structure, since no weight body is needed, it is possible to arrange many plate-like structure bodies vertically and horizontally at a very high density.

For example, where there is installed only the E letter shaped main substrate 110 shown in FIG. 3, many plate-like structure bodies can be laminated, with a slight clearance kept between them and packed at a small space. Of course, the plate-like structure bodies can be changed in shape to adjust resonance frequency of each resonance system, thereby obtaining such a working effect of the present invention that widens a frequency band capable of generating electric power. Therefore, a power generating element which has no weight body at all is also sufficiently valuable in using as an industrial product.

Chapter 10. Production Process of Power Generating Element

Here, a description will be given of an example of a preferred production process for mass-producing the power generating element of the present invention. Of course, the power generating element of the present invention may be produced in any process, as long as individual portions thereof are able to play unique roles which have been described above. Here, a description will be given of a production process suitable for mass-producing a basic structure portion. The production process to be described here is characterized in that the basic structure portion is formed by using an SOI (Silicon On Insulator) substrate.

Figure 32A:
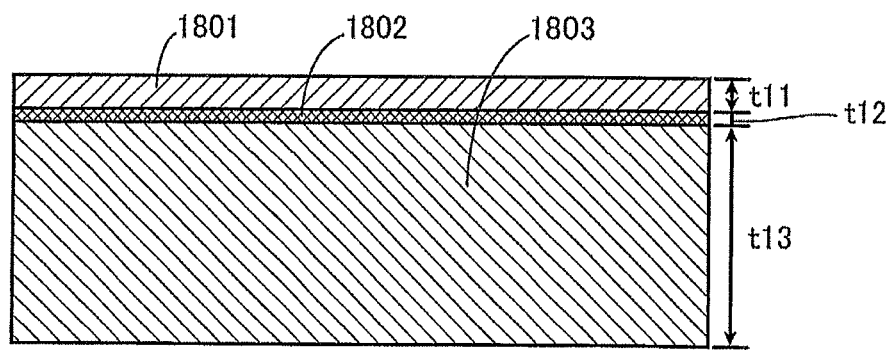
FIG. 32A to 32C each are a side sectional view which shows one example of a preferred production process for the power generating element according to the present invention.

First, there is provided an SOI substrate 1800 shown in FIG. 32(a). The SOI substrate 1800 is a substrate having a three-layered structure in which layers are laminated in the order of a silicon active layer 1801, a silicon oxide layer 1802 and a silicon base layer 1803. And, the substrate is commercially available as a material for producing various types of semiconductor devices. In the case of the example illustrated in the drawing, the thickness of the silicon active layer 1801 is $t11=15$ μm, that of the silicon oxide layer 1802 is $t12=1$ μm, and that of the silicon base layer 1803 is $t13=625$ μm.

Of course, the thickness of each layer may be given any dimension. However, since the silicon active layer 1801 is a layer which constitutes a plate-like structure body, the thickness $t11$ is set to such thickness that flexibility can be imparted when being used as the plate-like structure body. In contrast, the silicon base layer 1803 is a layer which constitutes a weight body and a pedestal and, therefore, the thickness $t13$ is set to such thickness that a sufficient mass can be secured as the weight body and also sufficient rigidity can be secured as the pedestal.

Figure 32B:
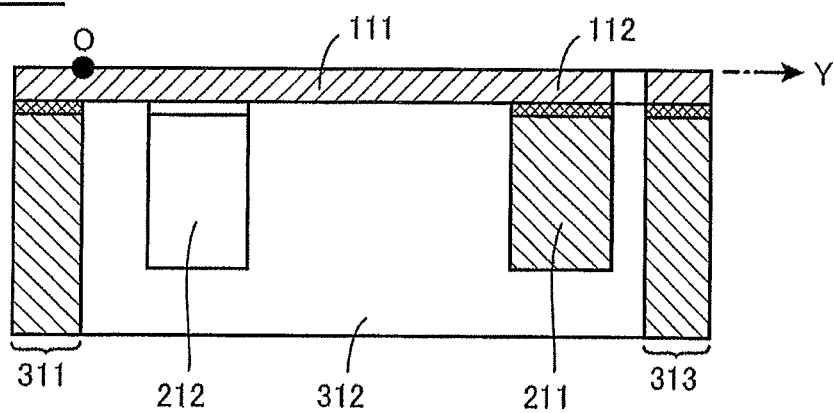

FIG. 32(b) is a side sectional view which shows an example in which the power generating element 1500A having a structure according to the device case-equipped power generating element 1500 shown in FIG. 20 is produced by using the SOI substrate 1800 shown in FIG. 32(a). This drawing shows a cross section in which the power generating element 1500A is cut along the YZ plane (the charge generating element 400 or the power generating circuit 500 is not illustrated in the drawing). Therefore, the basic constitution shown in FIG. 32(b) is similar to the basic constitution shown in FIG. 20(b).

Specifically, FIG. 32(b) shows a state in which the connector between different attributes 112 continues to the central plate-like structure body 111 and the weight body 211 is joined with the lower surface of the connector between different attributes 112. A state that the weight body 212 is positioned is also shown behind the weight body 211. Side walls 311, 313 of a device case are positioned at the both ends thereof and a side wall 312 of the device case is positioned behind thereof. Since a side wall 314 of the device case is positioned in front and does not appear in the drawing. The side wall 311 of the device case plays a role of the pedestal and supports the base end of the central plate-like structure body 111 at the origin O. Of course, the negative side plate-like structure body 113 is positioned behind the central plate-like structure body 111, and the positive side plate-like structure body 114 is positioned in front of the central plate-like structure body 111.

Resultingly, in the case of the power generating element 1500A, each of the plate-like structure bodies 111, 113, 114 and the connector between different attributes 112 are constituted with a single-layered structure body of the silicon active layer 1801 shown in FIG. 32(a), each of the weight bodies 211, 212, 213 is constituted with a two-layered structure body composed of the silicon oxide layer 1802 and the silicon base layer 1803 shown in FIG. 32(a), and the pedestal 311 (the side plates 311 to 314 of the device case) is constituted with a three-layered structure body composed of the silicon active layer 1801, the silicon oxide layer 1802 and the silicon base layer 1803 shown in FIG. 32(a). Each of the weight bodies 211, 212, 213 is processed so that for the purpose of securing a space for downward displacement, the bottom thereof is positioned above from the bottom of the pedestal 311 (the side plates 311 to 314 of the device case).

The basic structure portion of the power generating element 1500A having the structure shown in FIG. 32(b) can be produced by etching the SOI substrate 1800 shown in FIG. 32(a). For example, etching is conducted from the upper surface of the SOI substrate 1800 to prepare the silicon active layer 1801 in an E letter shape, thus making it possible to form an E letter shaped member corresponding to the main substrate 110 shown in FIG. 3. At this time, the silicon oxide layer 1802 can be used as an etching stopper. Further, etching is conducted from the lower surface side of the SOI substrate 1800, thus making it possible to give finishing so that the pedestal 311 (the side plates 311 to 314 of the device case) and each of the weight bodies 211, 212, 213 are left. At this time as well, the silicon oxide layer 1802 can be used as an etching stopper. Finally, another etching method is employed to remove a part of the silicon oxide layer 1802 which is not needed, thus making it possible to obtain the structure shown in FIG. 32(b).

Where the silicon oxide layer 1802 is thin in thickness, the silicon oxide layer 1802 is not removed but may be left as it is. That is, if the thickness thereof shown in FIG. 32(a), that is, $t11+t12$ is so thick as to exhibit flexibility which is needed when being used as a plate-like structure body, the silicon oxide layer 1802 may be left as a part of the plate-like bridge portion. And, this will not pose any problem. In this case, each of the plate-like structure bodies, 111, 113, 114 and the connector between different attributes 112 are constituted with a two-layered structure body composed of the silicon active layer 1801 and the silicon oxide layer 1802 shown in FIG. 32(a). Each of the weight bodies 211, 212, 213 is constituted with a single-layered structure body which is composed of the silicon base layer 1803 shown in FIG. 32(a).

A description has been so far given of an example in which the power generating element 1500A having a structure according to the device case-equipped power generating element 1500 shown in FIG. 20 is produced by using the SOI substrate 1800 shown in FIG. 32(a). It is also possible to produce the power generating elements according to other embodiments by a similar process. For example, as shown in FIG. 24, in the case of the embodiment having the connector between the same attributes 152 and the extreme end connector 157, a single-layered structure body of the silicon active layer 1801 or a two-layered structure body composed of the silicon active layer 1801 and the silicon oxide layer 1802 may be used to constitute the plate-like structure body, the connector between different attributes, the connector between the same attributes and the extreme end connector.

The power generating element 1500A shown in FIG. 32(b) is not provided with the top plate 315 or the bottom plate 316 installed on the device case of the power generating element 1500 shown in FIG. 20. However, there may be added, whenever necessary, members which are to be used as a top plate and a bottom plate of the device case. The power generating element 1500B having the structure shown in FIG. 32(*c*) is such that members used as the top plate and the bottom plate of the device case are assumed to be added. And, the bottom of each of weight bodies 211A, 212A, 213A (they do not appear in the drawing) is positioned at the same level as the bottom of the pedestal 311 (the side plates 311 to 314 of the device case). This is because it is assumed that a groove is formed on the bottom plate of the device case to secure a space for downward displacement of each of the weight bodies.

Figure 32C:
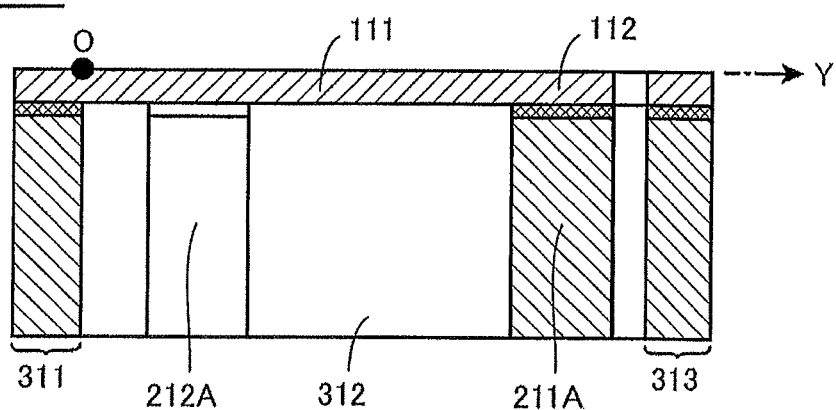
Figure 33:
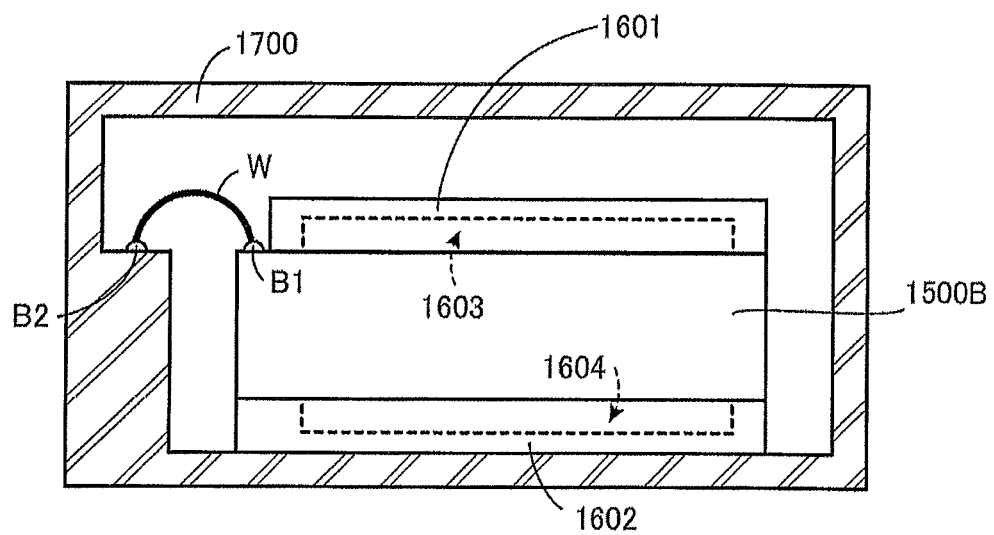
FIG. 33 is a side sectional view which shows an example in which the power generating element 1500B shown in FIG. 32(c) is housed in an outer package 1700.

FIG. 33 is a side sectional view which shows an example in which the power generating element 1500B shown in FIG. 32(*c*) is housed in an outer package 1700. A top plate 1601 of the device case is joined with the upper surface of the power generating element 1500B, whereas a bottom plate 1602 of the device case is joined with the lower surface of the power generating element 1500B. Here, as indicated by the dashed line in the drawing, an upper groove 1603 is formed on the lower surface of the top plate 1601 of the device case, and an upper space is secured for upward displacement of the plate-like structure bodies 111, 113, 114 and the connector between different attributes 112. Further, as indicated by the dashed line in the drawing, a lower groove 1604 is formed on the upper surface of the bottom plate 1602 of the device case, and a lower space is secured for downward displacement of each of the weight bodies 211A, 212A, 213A. The top plate 1601 and the bottom plate 1602 of the device case may be constituted with a glass substrate or a silicon substrate.

In the case of the above-described example, the element in its entirety which is composed of the power generating element 1500B, the top plate 1601 and the bottom plate 1602 is housed inside the outer package 1700. Although not illustrated in the drawing, the power generating circuit 500 is installed on the side of the outer package 1700. Therefore, bonding wire W is connected between a bonding pad B1 installed on the side of the power generating element 1500B and a bonding pad B2 installed on the side of the outer package 1700, thereby giving wiring to both of them (in reality, the bonding wire W is connected only by the number thereof necessary for wiring). An internal space of the outer package 1700 may be kept void or may be filled with resin or the like.

Figure 34:
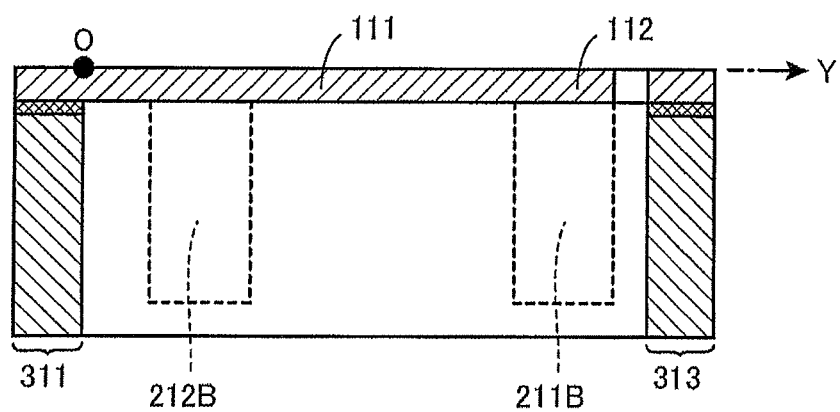
FIG. 34 is a side sectional view which shows a modification example of the process shown in FIG. 32.

FIG. 34 is a side sectional view which shows a modification example of the process shown in FIG. 32, giving a structure in which each of the weight bodies 211, 212, 213 is removed from the structure body shown in FIG. 32(*b*). In other words, when the SOI substrate 1800 is etched from the lower surface thereof, etching is conducted so that only the pedestal 311 (the side plates 311 to 314 of the device case) is left. In this modification example, each of the weight bodies is not a part of the SOI substrate 1800 but constituted with an entirely different material. That is, after the etching from the lower surface side (in the drawing, the silicon oxide layer 1802 has been removed but the silicon oxide layer 1802 may be left), each of the weight bodies 211B, 212B, 213B (they do not appear in the drawing) may be joined at a position indicated by the dashed line in the drawing. Each of the weight body 211B, 212B, 213B may be made of any material. However, in order to make a mass as great as possible, it is in practice preferable that metal such as iron or tungsten is used.

Figure 35:
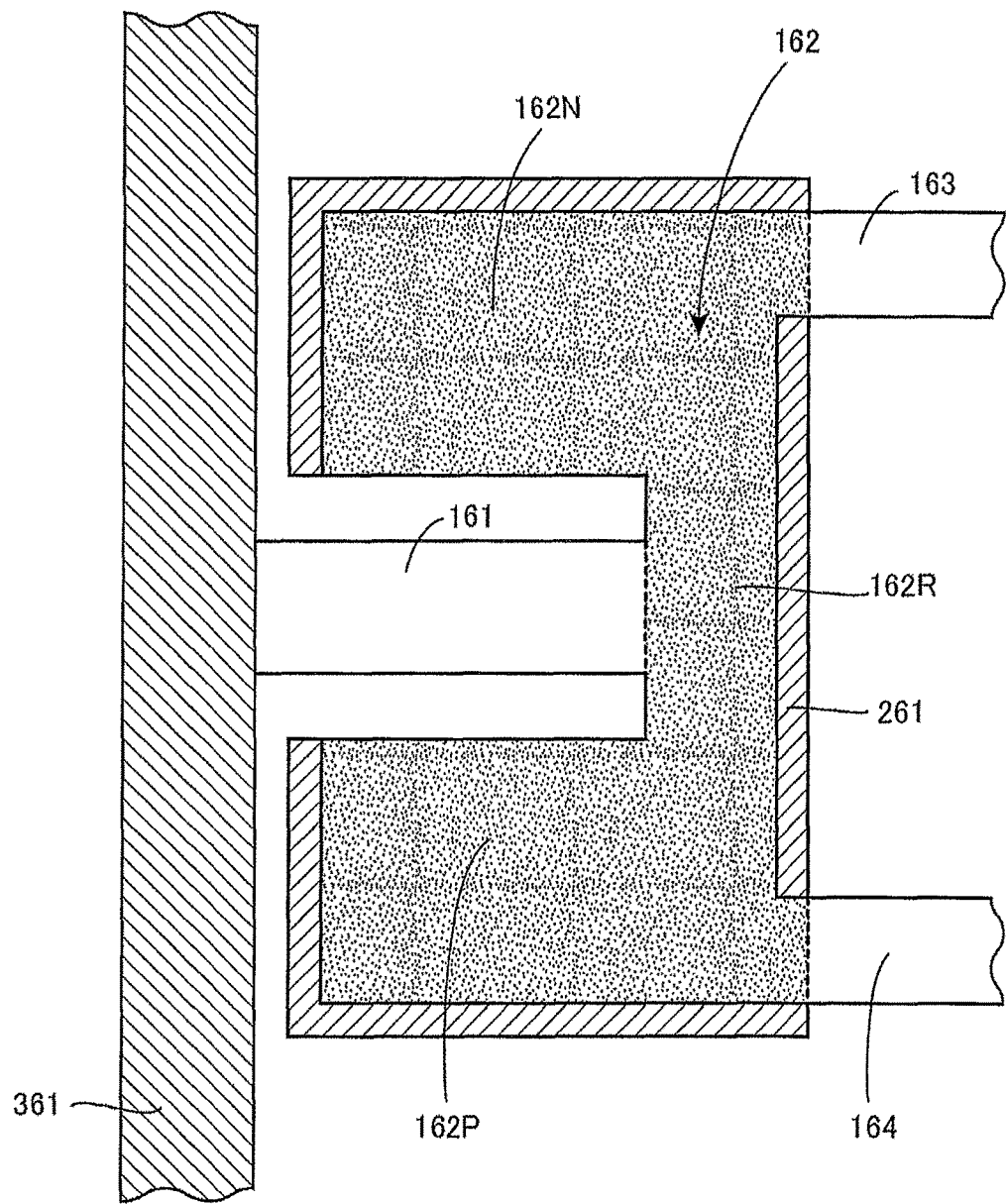
FIG. 35 is a top view which shows a step of producing the power generating element 6000 shown in FIG. 25 according to a process of the modification example shown in FIG. 34 (hatching is given for indicating a domain of each portion and not for indicating a cross section).

FIG. 35 is a top view which shows a step of producing the power generating element 6000 shown in FIG. 25 by a process according to the modification example shown in FIG. 34 (hatching is given for indicating a domain of each portion and not for indicating a cross section). That is, FIG. 35 is an enlarged top view which shows the vicinity of the connector between the same attributes 162 of the power generating element 6000 shown in FIG. 25, and a domain to which dot hatching is given indicates the U letter shaped connector between the same attributes 162. In the case of this example, the U letter shaped weight body 261 is joined with the lower surface of the connector between the same attributes 162.

However, the U letter shaped weight body 261 is designed so as to be slightly larger in size than the U letter shaped connector between the same attributes 162, and an external portion thereof partially runs off from a contour of the connector between the same attributes 162 in a state that the weight body 261 is joined with the lower surface of the connector between the same attributes 162. Of the U letter shaped weight body 261, a part to which diagonal line hatching is given in the drawing is equivalent to the run-off part. As stated above, the U letter shaped weight body 261 is a different member which is formed by using metal such as iron or tungsten and may be joined with the lower surface of the connector between the same attributes 162 by using an adhesive agent or the like.

The above-described run-off part is provided to obtain the following two advantages. A first advantage is that upon application of excessive vibration energy from the outside, the run-off part comes into contact with the inner surface of the device case, thus making it possible to suppress further displacement, thereby preventing breakage of the plate-like structure body 161, the connector between the same attributes 162 and others which are made of a fragile silicon active layer. If the weight body 261 is constituted with metal, it will be rarely broken in itself. A second advantage is that when such work is conducted that the weight body 261 is joined with the lower surface of the connector between the same attributes 162, a contour of the weight body 261 can be visually confirmed from above. As shown in FIG. 35, since the weight body 261 has a part which runs off from the connector between the same attributes 162, a positional relationship between them can be visually confirmed to conduct accurate joining work. This is also true for the other weight bodies 262, 263.

Chapter 11. Different Characteristics of the Present Invention

As described in Chapter 8, the First Embodiment to Eighth Embodiment are commonly characterized in that a return structure is adopted in which the plate-like structure body having the first attribute is connected with the plate-like structure body having the second attribute by the connector between different attributes. Due to the characteristics, there is obtained such a working effect that widens a frequency band capable of generating electric power, with entire dimensions of the element being suppressed.

Here, consideration will be given to different characteristics common to the First Embodiment to Eighth Embodiment, thereby understanding the present invention as a power generating element which has different characteristics. A fundamental concept of the different characteristics is found in a structure having a channel composed of plate-like structure bodies which branches off or converges at midpoints. Hereinafter, a specific description will be given of the fundamental concept.

As with the inventions described above, the invention to be described here relates to a power generating element 5 which is provided with a basic structure portion which constitutes a combined vibration system and a charge generating element for generating charge on the basis of deformation of the basic structure portion, thereby generating electric power by converting vibration energy into electric energy. It is in practice preferable that the invention is also provided with a power generating circuit which rectifies electric current produced on the basis of charge generated at the charge generating element and takes out electric power.

Here, the basic structure portion is provided with a plurality of flexible plate-like structure bodies, one or a plurality of intermediate connectors which connects the plate-like structure bodies with each other, and a pedestal which supports the plate-like structure bodies. A weight body connected to a predetermined site can be added, whenever necessary.

Next, important characteristics are as follows; each of the plate-like structure bodies is directly connected or indirectly corrected by way of the intermediate connector to the pedestal and other plate-like structure bodies, thereby forming a dendriform structure having the pedestal as a root by an aggregate of the plate-like structure bodies and the intermediate connector (including not only a structure which branches off but also a structure at which branches converge together in a direction toward a periphery thereof), and when a channel is followed from the pedestal to an end of the dendriform structure, the channel includes a branching portion which branches into a plurality of channels at midpoints and a converging portion at which a plurality of channels converge at midpoints.

For example, in the case of the power generating element 1000 according to the First Embodiment shown in FIG. 3, when a channel is followed from the origin O on the side of the pedestal to the terminal point T3 and the terminal point. T5 which are ends of the dendriform structure, there is included a branching portion which branches off at the connector between different attributes 112. Further, in the case of the power generating element 2000 according to the Second Embodiment shown in FIG. 21, when a channel is followed from the base end points Q1, Q2 on the side of the pedestal to the leading end of the central plate-like structure body 124 which is an end of the dendriform structure, there is included a converging portion which converges at the connector between different attributes 123. Then, in the case of the power generating element 3000 according to the Third Embodiment shown in FIG. 22, when a channel is followed from the base end points Q1, Q2 on the side of the pedestal to the extreme end connector 136 which is an end of the dendriform structure, there is included a converging/branching portion which converges and branches off at the connector between different attributes 133.

Similarly, in the case of the power generating element 4000 according to the Fourth Embodiment shown in FIG. 23, when a channel is followed from the base end points Q1, Q2 on the side of the pedestal to the extreme end connector 148 which is an end of the dendriform structure, there are included a converging/branching portion which converges and branches off at the connector between different attributes 143 and a converging portion which converges at the connector between different attributes 146. Further, in the case of the power generating element 5000 according to the Fifth Embodiment shown in FIG. 24, when a channel is followed from the origin O on the side of the pedestal to the extreme end connector 157 which is an end of the dendriform structure, there are included a branching portion which branches off at the connector between the same attributes 152 and a converging portion which converges at the connector between different attributes 155. Then, in the case of the power generating element 6000 according to the Sixth Embodiment shown in FIG. 25, when a channel is followed from the origin O on the side of the pedestal to the extreme end connector 167 which is an end of the dendriform structure, there are included a branching portion which branches off at the connector between the same attributes 162 and a converging portion which converges at the connector between different attributes 165. This is also true for the case of the Seventh Embodiment shown in FIG. 26 to FIG. 28 and the case of the Eighth Embodiment shown in FIG. 31.

As described above, where the dendriform structure is formed by an aggregate of the plate-like structure bodies and the intermediate connector, a cantilever beam structure is formed by the channel extending from the pedestal to an end of the dendriform structure, resulting in constitution of a vibration system as a whole. Further, a branching portion and a converging portion are provided on the channel extending from the pedestal to the end of the dendriform structure, thereby constituting a combined vibration system in which resonance systems formed on the basis of individual plate-like structure bodies are involved in a complicated manner. Resonance frequency of each of the resonance systems can be adjusted to obtain such a working effect of the present invention that widens a frequency band capable of generating electric power. Then, lastly, there is shown another embodiment in which the present invention is understood on the basis of a wider fundamental concept, that is, "a structure in which a channel composed of plate-like structure bodies branches off or converges at midpoints."

Figure 36:
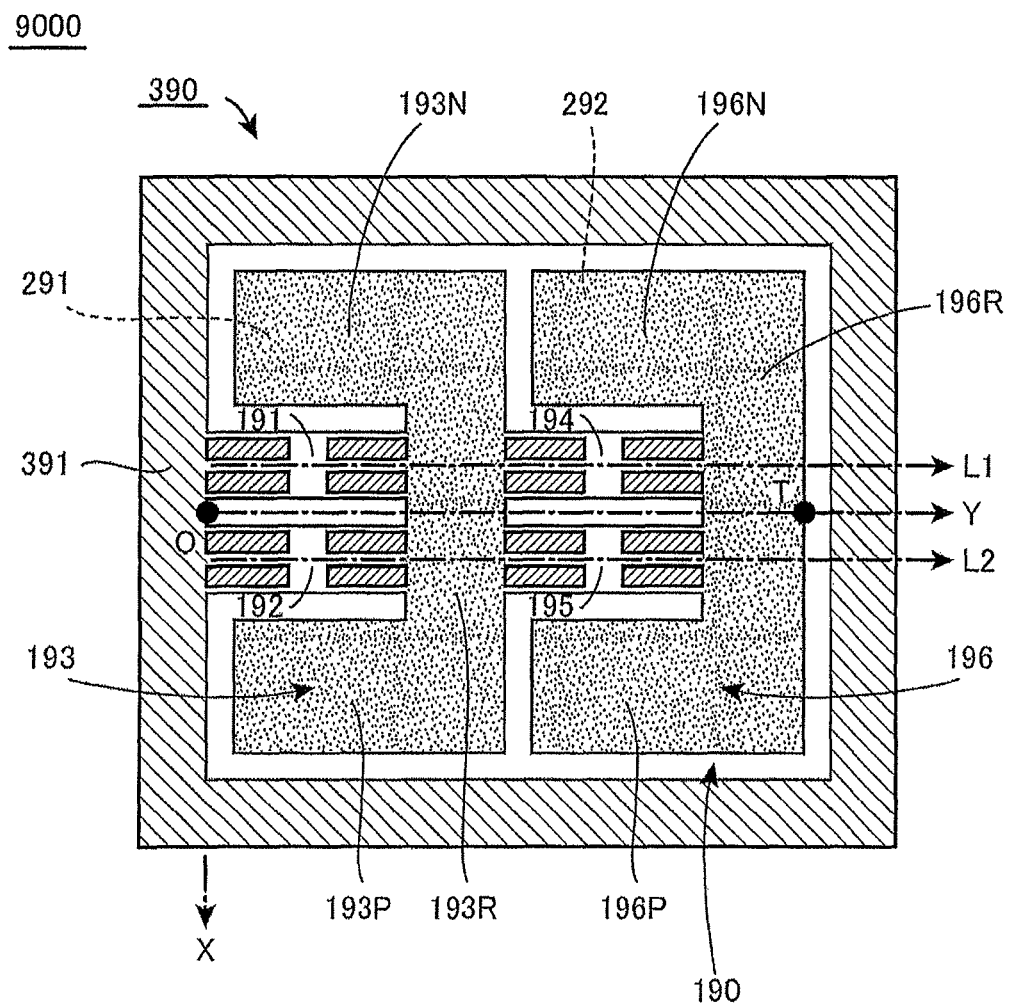
FIG. 36 is a plane sectional view which shows a device case-equipped power generating element 9000 according to a Ninth Embodiment of the present invention (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).
Figure 37:
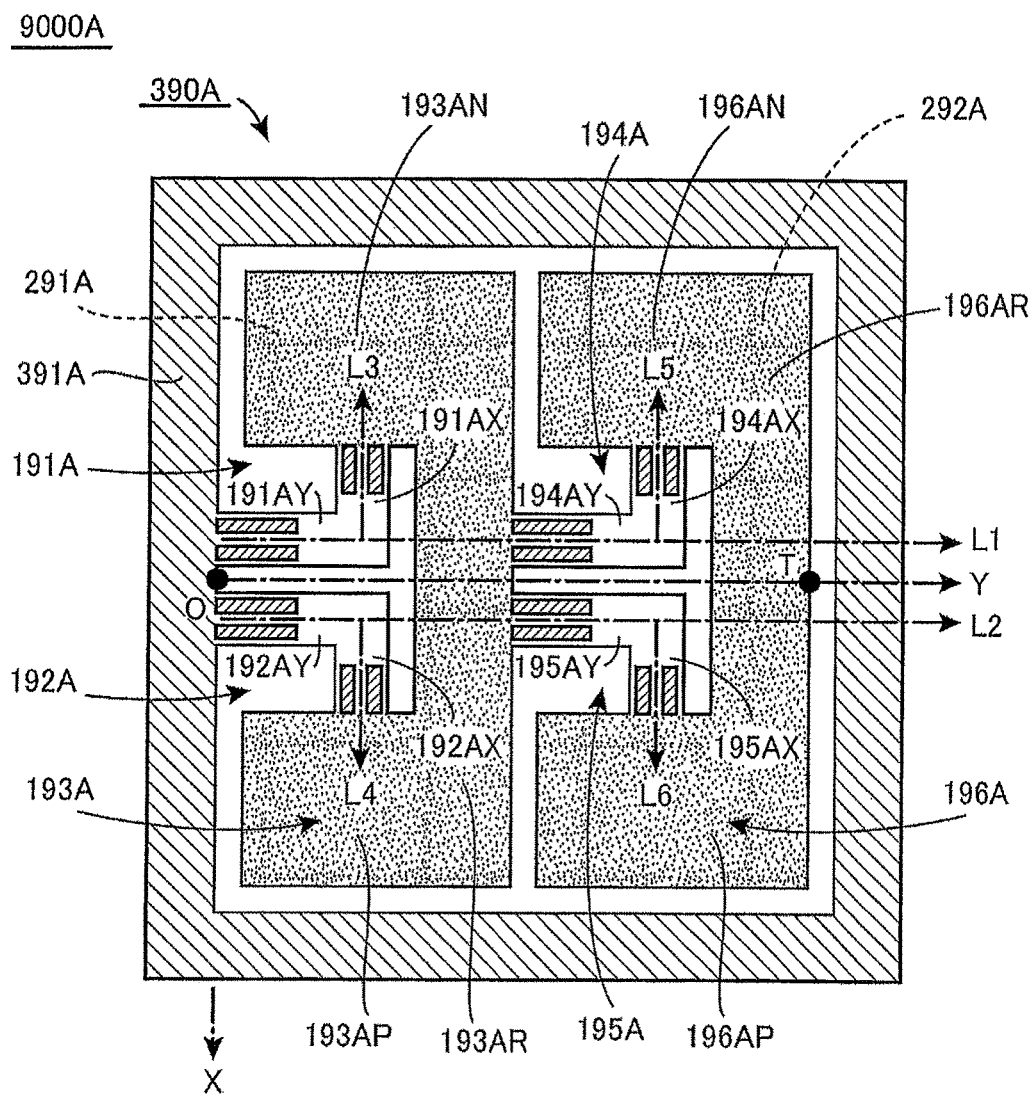
FIG. 37 is a plane sectional view which shows a device case-equipped power generating element 9000A according to a modification example of a Ninth Embodiment shown in FIG. 36 (a sectional view in which the power generating element is cut along a plane which is parallel to the XY plane and positioned slightly above the XY plane) (A power generating circuit 500 is not illustrated in the drawing. It is noted that some hatching is given for indicating a configuration pattern of each of upper electrode layers which constitute a charge generating element or a joining domain of a weight body and not for indicating a cross section).

FIG. 36 and FIG. 37 referred to in the following description are each a plane sectional view in which the power generating element according to the Ninth Embodiment is cut along a plane which is parallel to the XY plane and positioned slightly above the XY plane, and the power generating circuit 500 is not illustrated in the drawing. Further, there is shown an example of individual plate-like structure bodies in which piezoelectric elements that adopt an arrangement of four sets of electrodes shown in FIG. 18 or FIG. 30A are used as the charge generating element 400. In the above-described drawings, rough diagonal line hatching given to a part of the device case (including a part performing a function as the pedestal) indicates that the part concerned is a cross section. On the other hand, fine diagonal line hatching given to parts of the main substrate (the plate-like structure bodies and each connector) indicates a domain at which each of the discrete upper electrode layers is formed, and dot hatching indicates a domain at which the weight body is joined with the lower surface of the main substrate. Neither of them indicates a cross section.

FIG. 36 is a plane sectional view of a device case-equipped power generating element 9000 according to the Ninth Embodiment of the present invention. In the case of this example, a main substrate 190 is constituted with a first negative side plate-like structure body 191 arranged at a negative-side space, a first positive side plate-like structure body 192 arranged at a positive-side space, an intermediate connector 193, a second negative side plate-like structure body 194 arranged at the negative-side space, a second positive side plate-like structure body 195 arranged at the positive-side space and an extreme end connector 196. Then, a basic structure portion is constituted with the main substrate 190, a pedestal 391 which is incorporated as a part of a side plate in a device case 390 and two sets of weight bodies 291, 292.

The pedestal 391 plays a role of supporting the first negative side plate-like structure body 191 and the first positive side plate-like structure body 192 in the vicinity of the origin O. Further, the intermediate connector 193 plays a role of connecting the first negative side plate-like structure body 191 and the first positive side plate-like structure body 192 with the second negative side plate-like structure body 194 and the second positive side plate-like structure body 195. The extreme end connector 196 plays a role of connecting mutually the leading end of the second negative side plate-like structure body 194 with the leading end of the second positive side plate-like structure body 195.

More specifically, the first negative side plate-like structure body 191 and the first positive side plate-like structure body 192 are such that each of the base ends thereof is connected to the pedestal 391 and each of the leading ends is connected to the intermediate connector 193. They extend in a direction parallel to the Y axis so that a direction from the base end to the leading end (a direction of longitudinal direction axis L1 or L2) is given in the positive direction of the Y axis. Further, the second negative side plate-like structure body 194 and the second positive side plate-like structure body 195 are such that each of the base ends thereof is connected to the intermediate connector 193 and each of the leading ends is connected to the extreme end connector 196. They extend in a direction parallel to the Y axis so that a direction from the base end to the leading end (a direction of longitudinal direction axis L1 or L2) is given in the positive direction of the Y axis.

The intermediate connector 193 is formed in a planar shape so as to occupy a continuous domain to which dot hatching is given and constituted with a plate-like member which is provided with an orthogonal portion 193R extending in a direction orthogonal to the YZ plane (a direction parallel to the X axis) as well as a negative side wing-like portion 193N and a positive side wing-like portion 193P, each extending from the orthogonal portion 193R in the negative direction of the Y axis, and which is formed so as to give a U letter shaped projection image on the XY plane. Then, the first weight body 291 is constituted with a structure body which is connected to the lower surfaces of all the orthogonal portion 193R, the negative side wing-like portion 193N and the positive side wing-like portion 193P of the intermediate connector 193 and which is formed so as to give a U letter shaped projection image on the XY plane. In the case of the example illustrated in the drawing, the intermediate connector 193 is identical in planar shape with the first weight body 291, and the first weight body 291 is a structure body which occupies a domain to which dot hatching is given.

Similarly, the extreme end connector 196 is formed in a planar shape so as to occupy a continuous domain to which dot hatching is given and constituted with a plate-like member which is provided with an orthogonal portion 196R extending in direction orthogonal to the YZ plane (a direction parallel to the X axis) as well as a negative side wing-like portion 196N and a positive side wing-like portion 196P, each extending from the orthogonal portion 196R in the negative direction of the Y axis, and which is formed so as to give a U letter shaped projection image on the XY plane. Then, the second weight body 292 is constituted with a structure body which is connected to the lower surfaces of all the orthogonal portion 196R, the negative side wing-like portion 196N and the positive side wing-like portion 196P of the extreme end connector 196 and which is formed so as to give a U letter shaped projection image on the XY plane. In the case of the example illustrated in the drawing, the extreme end connector 196 is identical in planar shape with the second weight body 292, and the second weight body 292 is a structure body which occupies a domain indicated by dot hatching given in the drawing.

In the case of the power generating element 9000 shown in FIG. 36, any of four sets of plate-like structure bodies 191, 192, 194, 195 is a plate-like structure body which is arranged so that a direction from the base end to the leading end is given in the positive direction of the Y axis and corresponds to the plate-like structure body having the first attribute described above. In other words, in the case of the power generating element 9000, any of four sets of the plate-like structure bodies 191, 192, 194, 195 is the plate-like structure body having the same attribute.

In the case of the power generating elements described above in the First Embodiment to Eighth Embodiment, there is adopted "a return structure in which a plate-like structure body having the first attribute is connected with a plate-like structure body having the second attribute by the connector between different attributes." The above-described "return structure" is not adopted in the power generating element 9000 according to the Ninth Embodiment shown in FIG. 36. However, the power generating element 9000 also adopts a wide fundamental concept that is "a structure in which a channel composed of the plate-like structure bodies branches off or converges at midpoints."

That is, with attention focused on a channel extending from the origin O on the pedestal 391 to the tip point T which is an end of the dendriform structure, a branching portion and a converging portion are provided on the channel concerned, thereby constituting a combined vibration system in which resonance systems formed on the basis of individual plate-like structure bodies are involved in a complicated manner. That is, when the channel extending from the origin O to the tip point T is followed, there is formed a dendriform structure in which, first, it branches into two sets of channels along the plate-like structure bodies 191, 192, and these channels converge temporarily at the intermediate connector 193, again branch into two sets of channels along the plate-like structure bodies 194, 195, and they again converge at the extreme end connector 196. Further, any of four sets of the plate-like structure bodies 191, 192, 194, 195, extends in a direction parallel to the Y axis. Therefore, each of the resonance systems is adjusted for resonance frequency, thus making it possible to obtain such a working effect of the present invention that widens a frequency band capable of generating electric power.

FIG. 37 is a plane sectional view of a power generating element 9000A according to a modification example of the power generating element 9000 shown in FIG. 36. The power generating element 9000 shown in FIG. 36 is different from the power generating element 9000A shown in FIG. 37 in that the latter uses four sets of L letter shaped plate-like structure bodies 191A, 192A, 194A, 195A in places of four sets of the plate-like structure bodies 191, 192, 194, 195 used in the former. In Chapter 7-7, as the Seventh Embodiment, there is shown an example which uses the plate-like structure body composed of an L letter shaped beam. In the case of the power generating element 9000A shown in FIG. 37, any of four sets of the plate-like structure bodies 191A, 192A, 194A, 195A is constituted with an L letter shaped beam.

Therefore, a device case 390A shown in FIG. 37 is made slightly greater in width in the direction of the X axis than the device case 390 shown in FIG. 36. Further, an intermediate connector 193A and an extreme end connector 196A shown in FIG. 37 are made slightly greater in width in the direction of the X axis than the intermediate connector 193 and the extreme end connector 196 shown in FIG. 36.

As with the example shown in FIG. 36, the intermediate connector 193A is formed in a planar shape which occupies a continuous domain to which dot hatching is given and constituted with a plate-like member which is provided with an orthogonal portion 193AR extending in a direction orthogonal to the YZ plane (a direction parallel to the X axis) as well as a negative side wing-like portion 193AN and a positive side wing-like portion 193AP, each extending from the orthogonal portion 193AR in the negative direction of the Y axis, and which is formed in a U letter shaped projection image on the XY plane. Then, a first weight body 291A is constituted with a structure body which is connected to the lower surfaces of all the orthogonal portion 193AR, the negative side wing-like portion 193AN and the positive side wing-like portion 193AP of the intermediate connector 193A and which is formed so as to give a U letter shaped projection image on the XY plane. In the case of the example illustrated in the drawing, the intermediate connector 193A is identical in planar shape with the first weight body 291A, and the first weight body 291A is a structure body which occupies a domain to which dot hatching is given in the drawing.

Similarly, the extreme end connector 196A is formed in a planar shape which occupies a continuous domain to which dot hatching is given and constituted with a plate-like member which is provided with an orthogonal portion 196AR extending in a direction orthogonal to the YZ plane (a direction parallel to the X axis) as well as a negative side wing-like portion 196AN and a positive side wing-like portion 196AP, each extending from the orthogonal portion 196AR in the negative direction of the Y axis, and which is formed so as to give a U letter shaped projection image on the XY plane. Then, a second weight body 292A is constituted with a structure body which is connected to the lower surfaces of all the orthogonal portion 196AR, the negative side wing-like portion 196AN and the positive side wing-like portion 196AP of the extreme end connector 196A and which is formed so as to give a U letter shaped projection image on the XY plane. In the case of the example illustrated in the drawing, the extreme end connector 196A is identical in planar shape with the second weight body 292A, and the second weight body 292A is a structure body which occupies a domain indicated by dot hatching given in the drawing.

On the other hand, the first negative side plate-like structure body 191A is provided with a first negative side Y axis channel portion 191AY extending in a direction parallel to the Y axis (a direction of longitudinal direction axis L1) and a first negative side X axis channel portion 191AX extending in a direction parallel to the X axis (a direction of longitudinal direction axis L3) and formed in an L letter shaped projection image on the XY plane. Here, the base end of the first negative side Y axis channel portion 191AY is connected to a pedestal 391A, and the leading end of the first negative side Y axis channel portion 191AY is connected to the base end of the first negative side X axis channel portion 191AX, the leading end of the first negative side X axis channel portion 191AX is connected to the negative side wing-like portion 193AN of the intermediate connector 193A.

Further, the first positive side plate-like structure body 192A is provided with a first positive side Y axis channel portion 192AY extending in a direction parallel to the Y axis (a direction of longitudinal direction axis L2) and a first positive side X axis channel portion 192AX extending in a direction parallel to the X axis (a direction of longitudinal direction axis L4) and formed in an L letter shaped projection image on the XY plane. Here, the base end of the first positive side Y axis channel portion 192AY is connected to the pedestal 391A, the leading end of the first positive side Y axis channel portion 192AY is connected to the base end of the first positive side X axis channel portion 192AX, and the leading end of the first positive side X axis channel portion 192AX is connected to the positive side wing-like portion 193AP of the intermediate connector 193A.

Then, the second negative side plate-like structure body 194A is provided with a second negative side Y axis channel portion 194AY extending in a direction parallel to the Y axis (a direction of longitudinal direction axis L1) and a second negative side X axis channel portion 194AX extending in a direction parallel to the X axis (a direction of longitudinal direction axis L5) and formed in an L letter shaped projection image on the XY plane. Here, the base end of the second negative side Y axis channel portion 194AY is connected to the orthogonal portion 193AR of the intermediate connector 193A, the leading end of the second negative side Y axis channel portion 194AY is connected to the base end of the second negative side X axis channel portion 194AX, and the leading end of the second negative side X axis channel portion 194AX is connected to the negative side wing-like portion 196AN of the extreme end connector 196A.

Lastly, the second positive side plate-like structure body 195A is provided with a second positive side Y axis channel portion 195AY extending in a direction parallel to the Y axis (a direction of longitudinal direction axis L2) and a second positive side X axis channel portion 195AX extending in a direction parallel to the X axis (a direction of longitudinal direction axis L6) and formed in an L letter shaped projection image on the XY plane. Here, the base end of the second positive side Y axis channel portion 195AY is connected to the orthogonal portion 193AR of the intermediate connector 193A, the leading end of the second positive side Y axis channel portion 195AY is connected to the base end of the second positive side X axis channel portion 195AX, and the leading end of the second positive side X axis channel portion 195AX is connected to the positive side wing-like portion 196AP of the extreme end connector 196A.

In the case of the power generating element 9000A, any of four sets of the plate-like structure bodies 191A, 192A, 194A, 195A is formed so as to give an L letter shaped projection image on the XY plane and includes at a part thereof the Y axis channel portion extending in a direction parallel to the Y axis (a direction of longitudinal direction axis L1 or L2) so that a direction from the base end to the leading end is given in the positive direction of the Y axis. Therefore, the power generating element 9000A is also able to adjust resonance frequency of vibration in a specific direction.

Various modification examples described in Chapter 9 are also applicable to the Ninth Embodiment described in this Chapter 11.

INDUSTRIAL APPLICABILITY

The power generating element of the present invention is widely applicable to technologies in which electric power is generated by converting vibration energy into electric energy. A basic principle thereof is that a plate-like structure body is allowed to undergo deflection by vibration of a weight body, thereby taking out to the outside charge generated at a charge generating element in response to the deflection concerned. Therefore, the power generating element is mounted on vehicles such as automobiles, trains and ships or vibration sources such as refrigerators and air conditioners, thus making it possible to effectively use vibration energy which would be ordinarily consumed uselessly as electric energy. Further, plate-like structure bodies different in attribute are provided, by which a plurality of resonance systems different in resonance frequency are allowed to exist concurrently to widen a frequency band capable of generating electric power. It is, therefore, possible to design a power generating element which can attain efficient power generation suitable for vibration frequencies in actual use environments.

The invention claimed is:

1. A power generating element which generates electric power by converting vibration energy into electric energy, the power generating element, comprising:
    a basic structure portion which is provided with a flexible plate-like structure body (111) having a first attribute, a flexible plate-like structure body (113, 114) having a second attribute, a connector between different attributes (112) which connects mutually the plate-like structure body (111) having the first attribute with the plate-like structure body (113, 114) having the second attribute, and a pedestal (310) which supports the plate-like structure body (111) having the first attribute; and
    a charge generating element (400) which generates charge on the basis of deformation of the basic structure portion; wherein
    when an XYZ three-dimensional coordinate system is defined, the plate-like structure body (111) having the first attribute and the plate-like structure body (113, 114) having the second attribute are arranged so that a plate surface thereof is given as a surface parallel to an XY plane,
    the plate-like structure body (111) having the first attribute is such that the base end thereof is directly or indirectly connected to the pedestal (310) and the leading end thereof is directly or indirectly connected to the connector between different attributes (112), and the plate-like structure body (111) extends in a direction parallel to an Y axis so that a direction from the base end to the leading end is given in a positive direction of the Y axis, and
    the plate-like structure body (113,114) having the second attribute are such that the base end thereof is directly or indirectly connected to the connector between different attributes (112), and the plate-like structure body (113, 114) extends in a direction parallel to the Y axis so that a direction from the base end to the leading end is given in the negative direction of the Y axis wherein,
    the basic structure portion is provided with a central plate-like structure body (111) having the first attribute, a positive side plate-like structure body (114) and a negative side plate-like structure body (113) each having the second attribute, the connector between different attributes (112) which connects the central plate-like structure body (111) with the positive side plate-like structure body (114) and the negative side plate-like structure body (113), and a pedestal (310) which supports the central plate-like structure body (111),
    when the XY plane is taken on a horizontal plane, at a space partitioned by the YZ plane, a space having a positive X coordinate value is defined as a positive-side space and a space having a negative X coordinate value is defined as a negative-side space,
    the central plate-like structure body (111) is arranged on the YZ plane, the base end thereof is directly or indirectly connected to the pedestal (310), the leading end thereof is directly or indirectly connected to the connector between different attributes (112), and the central plate-like structure body (111) extends in a direction parallel to the Y axis so that a direction from the base end to the leading end is given in the positive direction of the Y axis,
    the positive side plate-like structure body (114) is arranged at the positive-side space, the base end thereof is directly or indirectly connected to the connector between different attributes (112), and the positive side plate-like structure body (114) extends in a direction parallel to the Y axis so that a direction from the base end to the leading end is given in the negative direction of the Y axis, and
    the negative side plate-like structure body (113) is arranged at the negative-side space, the base end thereof is directly or indirectly connected to the connector between different attributes (112), and the negative side plate-like structure body (113) extends in a direction parallel to the Y axis so that a direction from the base end to the leading end is given in the negative direction of the Y axis,
wherein
    the basic structure portion is further provided with a first weight body (211) connected to the connector between different attributes (112), a second weight body (212) connected to the leading end of the positive side plate-like structure body (114) and a third weight body (213) connected to the leading end of the negative side plate-like structure body (113),
    the first weight body (211) and the second weight body (212) are apart from each other, and the first weight body (211) and the third weight body (213) are apart from each other.

2. The power generating element according to claim 1, wherein
    the charge generating element (400) is provided with a piezoelectric element which is formed at a part where the plate-like structure body undergoes deformation,
    a common lower electrode layer (410) is formed on the upper surface of the plate-like structure body (111, 113, 114), and a common piezoelectric material layer (420) is formed on the upper surface of the common lower electrode layer (410),
    a plurality of discrete upper electrode layers, each of which is electrically independent, are formed at different sites on the upper surface of the common piezoelectric material layer (420) in the plate-like structure body (111) having a first attribute,
    a plurality of discrete upper electrode layers, each of which is electrically independent, are formed at different sites on the upper surface of the common piezoelectric material layer (420) in the flexible plate-like structure body (113, 114) having a second attribute,
    charge of a predetermined polarity is supplied to each of the lower electrode layer (410) and each discrete upper electrode layers,
    at a time point when the plate-like structure body (111) undergoes specific deformation, charge of the same polarity is supplied from the piezoelectric material layer (420) to each of the discrete upper electrode layers.

3. The power generating element according to claim 2, wherein
a plurality of discrete upper electrode layers in the plate-like structure body (111) having the first attribute is arranged in the direction of the Y-axis.

4. The power generating element according to claim 2, wherein
a plurality of discrete upper electrode layers in the plate-like structure body (111) having the first attribute is arranged in the direction of the X-axis.

5. The power generating element according to claim 2, wherein
a plurality of discrete upper electrode layers in the plate-like structure body (113, 114) having a second attribute is arranged in the direction of the Y-axis.

6. The power generating element according to claim 2, wherein
a plurality of discrete upper electrode layers in the plate-like structure body (113, 114) having a second attribute is arranged in the direction of the X-axis.

7. The power generating element according to claim 2, wherein
a plurality of discrete upper electrode layers in the plate-like structure body (111) having the first attribute is arranged in the direction of the X-axis and in the direction of the Y-axis,
a plurality of discrete upper electrode layers in the plate-like structure body (113, 114) having a second attribute is arranged in the direction of the X-axis and in the direction of the Y-axis.

8. The power generating element according to claim 2, wherein
four discrete upper electrode layers (E11-E14) in the plate-like structure body (111) having the first attribute is arranged in a rectangular arrangement,
four discrete upper electrode layers (E21-24, E31-34) in the plate-like structure body (113, 114) having a second attribute is arranged in a rectangular arrangement.

9. A power generating element which generates electric power by converting vibration energy into electric energy, the power generating element, comprising:
a basic structure portion which is provided with a flexible plate-like structure body (111) having a first attribute, a flexible plate-like structure body (113, 114) having a second attribute, a connector between different attributes (112) which connects mutually the plate-like structure body (111) having the first attribute with the plate-like structure body (113, 114) having the second attribute, and a pedestal (310) which supports the plate-like structure body (111) having the first attribute; and
a charge generating element (400) which generates charge on the basis of deformation of the basic structure portion; wherein
when an XYZ three-dimensional coordinate system is defined, the plate-like structure body (111) having the first attribute and the plate-like structure body (113, 114) having the second attribute are arranged so that a plate surface thereof is given as a surface parallel to an XY plane,
the plate-like structure body (111) having the first attribute is such that the base end thereof is directly or indirectly connected to the pedestal (310) and the leading end thereof is directly or indirectly connected to the connector between different attributes (112), and the plate-like structure body (111) extends in a direction parallel to an Y axis so that a direction from the base end to the leading end is given in a positive direction of the Y axis, and
the plate-like structure body (113,114) having the second attribute are such that the base end thereof is directly or indirectly connected to the connector between different attributes (112), and the plate-like structure body (113, 114) extends in a direction parallel to the Y axis so that a direction from the base end to the leading end is given in the negative direction of the Y axis, wherein
the basic structure portion is provided with a central plate-like structure body (111) having the first attribute, a positive side plate-like structure body (114) and a negative side plate-like structure body (113) each having the second attribute, the connector between different attributes (112) which connects the central plate-like structure body (111) with the positive side plate-like structure body (114) and the negative side plate-like structure body (113), and a pedestal (310) which supports the central plate-like structure body (111),
when the XY plane is taken on a horizontal plane, at a space partitioned by the YZ plane, a space having a positive X coordinate value is defined as a positive-side space and a space having a negative X coordinate value is defined as a negative-side space,
the central plate-like structure body (111) is arranged on the YZ plane, the base end thereof is directly or indirectly connected to the pedestal (310), the leading end thereof is directly or indirectly connected to the connector between different attributes (112), and the central plate-like structure body (111) extends in a direction parallel to the Y axis so that a direction from the base end to the leading end is given in the positive direction of the Y axis,
the positive side plate-like structure body (114) is arranged at the positive-side space, the base end thereof is directly or indirectly connected to the connector between different attributes (112), and the positive side plate-like structure body (114) extends in a direction parallel to the Y axis so that a direction from the base end to the leading end is given in the negative direction of the Y axis, and
the negative side plate-like structure body (113) is arranged at the negative-side space, the base end thereof is directly or indirectly connected to the connector between different attributes (112), and the negative side plate-like structure body (113) extends in a direction parallel to the Y axis so that a direction from the base end to the leading end is given in the negative direction of the Y axis,
wherein
the basic structure portion is further provided with a first weight body (211) which is connected to the connector between different attributes (112) and a second weight body (215) which couples the leading-end lower surface of the positive side plate-like structure body (114) with the leading-end lower surface of the negative side plate-like structure body (113), and
the second weight body (215) is provided with a U letter shaped structure so as to cover astride below the central plate-like structure body (111) or below a supporting member (111*a*) for supporting the base end of the central plate-like structure body to the pedestal (310), with a predetermined distance kept in relation to the central plate-like structure body or the supporting member.

10. The power generating element according to claim 9, wherein
the charge generating element (400) is provided with a piezoelectric element which is formed at a part where the plate-like structure body undergoes deformation,
a common lower electrode layer (410) is formed on the upper surface of the plate-like structure body (111, 113, 114), and a common piezoelectric material layer (420) is formed on the upper surface of the common lower electrode layer (410),
a plurality of discrete upper electrode layers, each of which is electrically independent, are formed at different sites on the upper surface of the common piezoelectric material layer (420) in the plate-like structure body (111) having a first attribute,
a plurality of discrete upper electrode layers, each of which is electrically independent, are formed at different sites on the upper surface of the common piezoelectric material layer (420) in the flexible plate-like structure body (113, 114) having a second attribute,
charge of a predetermined polarity is supplied to each of the lower electrode layer (410) and each discrete upper electrode layers,
at a time point when the plate-like structure body (111) undergoes specific deformation, charge of the same polarity is supplied from the piezoelectric material layer (420) to each of the discrete upper electrode layers.

11. The power generating element according to claim 10, wherein
a plurality of discrete upper electrode layers in the plate-like structure body (111) having the first attribute is arranged in the direction of the Y-axis.

12. The power generating element according to claim 10, wherein
a plurality of discrete upper electrode layers in the plate-like structure body (111) having the first attribute is arranged in the direction of the X-axis.

13. The power generating element according to claim 10, wherein
a plurality of discrete upper electrode layers in the plate-like structure body (113, 114) having a second attribute is arranged in the direction of the Y-axis.

14. The power generating element according to claim 10, wherein
a plurality of discrete upper electrode layers in the plate-like structure body (113, 114) having a second attribute is arranged in the direction of the X-axis.

15. The power generating element according to claim 10, wherein
a plurality of discrete upper electrode layers in the plate-like structure body (111) having the first attribute is arranged in the direction of the X-axis and in the direction of the Y-axis,
a plurality of discrete upper electrode layers in the plate-like structure body (113, 114) having a second attribute is arranged in the direction of the X-axis and in the direction of the Y-axis.

16. The power generating element according to claim 10, wherein
four discrete upper electrode layers (E11-E14) in the plate-like structure body (111) having the first attribute is arranged in a rectangular arrangement,
four discrete upper electrode layers (E21-24, E31-34) in the plate-like structure body (113, 114) having a second attribute is arranged in a rectangular arrangement.

* * * * *